United States Patent
Yamazaki et al.

(10) Patent No.: US 10,916,430 B2
(45) Date of Patent: Feb. 9, 2021

(54) SEMICONDUCTOR DEVICE AND METHOD FOR MANUFACTURING THE SAME

(71) Applicant: Semiconductor Energy Laboratory Co., Ltd., Atsugi (JP)

(72) Inventors: Shunpei Yamazaki, Setagaya (JP); Takashi Hamochi, Tochigi (JP); Yasutaka Nakazawa, Tochigi (JP); Masami Jintyou, Shimotsuga (JP); Yukinori Shima, Tatebayashi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 27 days.

(21) Appl. No.: 15/654,110

(22) Filed: Jul. 19, 2017

(65) Prior Publication Data
US 2018/0025913 A1    Jan. 25, 2018

(30) Foreign Application Priority Data
Jul. 25, 2016  (JP) .................................. 2016-145082

(51) Int. Cl.
*H01L 21/285* (2006.01)
*H01L 23/485* (2006.01)
(Continued)

(52) U.S. Cl.
CPC .. *H01L 21/28052* (2013.01); *H01L 21/28229* (2013.01); *H01L 21/28506* (2013.01); *H01L 23/485* (2013.01); *H01L 27/10814* (2013.01); *H01L 27/10882* (2013.01); *H01L 29/41733* (2013.01); *H01L 29/45* (2013.01); *H01L 29/66969* (2013.01); *H01L 29/7869* (2013.01); *H01L 29/78633* (2013.01); *H01L 29/78696* (2013.01); *C23F 1/38* (2013.01)

(58) Field of Classification Search
CPC .......... H01L 21/28052; H01L 21/28229; H01L 23/485
See application file for complete search history.

(56) References Cited

U.S. PATENT DOCUMENTS 7,858,519 B2 * 12/2010 Liu .................... H01L 23/53238
                                                              438/653
9,515,093 B2   12/2016 Xun et al.
(Continued)

FOREIGN PATENT DOCUMENTS

JP       2006-165528 A    6/2006
WO    WO-2017/130073       8/2017

*Primary Examiner* — Mark W Tornow
*Assistant Examiner* — Abbigale A Boyle
(74) *Attorney, Agent, or Firm* — Robinson Intellectual Property Law Office; Eric J. Robinson

(57) ABSTRACT

A semiconductor device with favorable electrical characteristics is provided. A source electrode and a drain electrode of a channel-etched transistor are each made to have a stacked-layer structure including a first conductive layer and a second conductive layer. A silicide that contains a metal element contained in the second conductive layer and nitrogen is formed to be in contact with a top surface and a side surface of the second conductive layer. Before etching of the first conductive layer, the silicide is formed by exposing the second conductive layer to an atmosphere containing silane, and plasma treatment is performed in a nitrogen atmosphere without exposure to the air.

11 Claims, 25 Drawing Sheets

(51) Int. Cl.
*H01L 21/28* (2006.01)
*H01L 27/108* (2006.01)
*H01L 29/417* (2006.01)
*H01L 29/786* (2006.01)
*H01L 29/45* (2006.01)
*H01L 29/66* (2006.01)
*C23F 1/38* (2006.01)

(56) References Cited

U.S. PATENT DOCUMENTS

| | | |
|---|---|---|
| 9,768,315 B2 | 9/2017 | Koezuka et al. |
| 2006/0113536 A1 | 6/2006 | Kumomi et al. |
| 2011/0084267 A1 | 4/2011 | Yamazaki et al. |
| 2011/0084268 A1 | 4/2011 | Yamazaki et al. |
| 2011/0127524 A1 | 6/2011 | Yamazaki et al. |
| 2012/0182790 A1 | 7/2012 | Yamazaki et al. |
| 2013/0134415 A1 | 5/2013 | Godo |
| 2013/0140553 A1 | 6/2013 | Yamazaki et al. |
| 2013/0207111 A1 | 8/2013 | Yamazaki |
| 2013/0240873 A1 | 9/2013 | Yamazaki et al. |
| 2013/0302938 A1 | 11/2013 | Sato et al. |
| 2014/0021466 A1* | 1/2014 | Yamazaki ............. H01L 29/201 257/43 |
| 2014/0291672 A1 | 10/2014 | Yamazaki et al. |
| 2014/0306221 A1 | 10/2014 | Yamazaki et al. |
| 2014/0374908 A1* | 12/2014 | Koezuka ........... H01L 23/53238 257/751 |
| 2015/0034475 A1 | 2/2015 | Yamazaki |
| 2015/0084043 A1 | 3/2015 | Ishihara et al. |
| 2015/0097181 A1 | 4/2015 | Yamazaki |
| 2015/0108473 A1 | 4/2015 | Nakazawa et al. |
| 2015/0155313 A1 | 6/2015 | Yamazaki et al. |
| 2015/0155362 A1 | 6/2015 | Nakazawa et al. |
| 2015/0155363 A1 | 6/2015 | Nakazawa et al. |
| 2015/0187898 A1 | 7/2015 | Miyairi |
| 2015/0200212 A1 | 7/2015 | Xun et al. |
| 2015/0214376 A1 | 7/2015 | Koezuka et al. |
| 2015/0303309 A1 | 10/2015 | Koezuka et al. |
| 2017/0053940 A1 | 2/2017 | Xun et al. |
| 2017/0186875 A1 | 6/2017 | Yamazaki |
| 2017/0256647 A1 | 9/2017 | Nakazawa et al. |
| 2017/0338352 A1 | 11/2017 | Yamazaki |

\* cited by examiner 114  116 113a 122    113a 122 114 116

120a    120b    120a

118

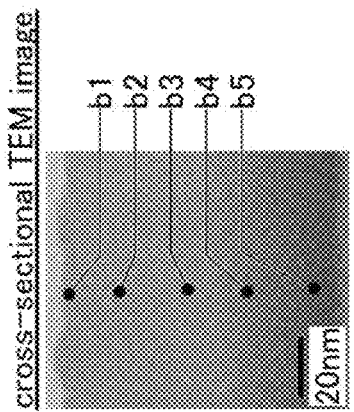
FIG. 15A plan-view TEM image
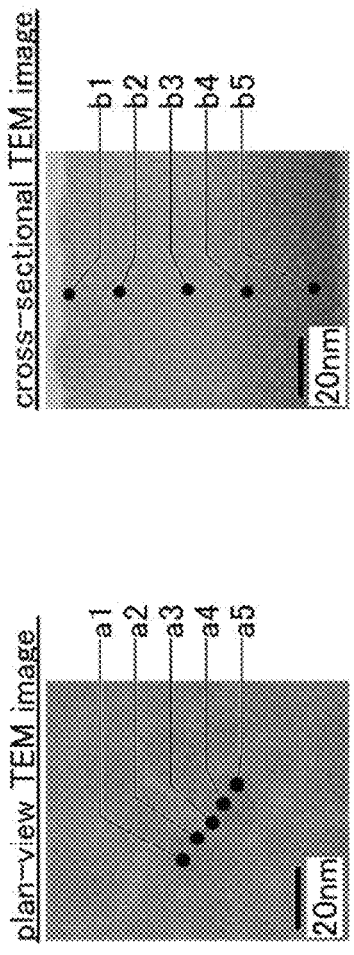
FIG. 15B cross-sectional TEM image
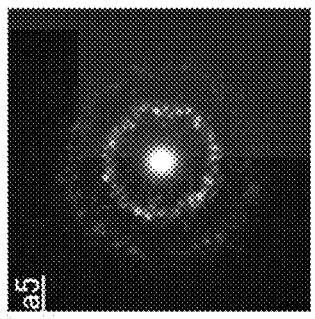
FIG. 15C a1
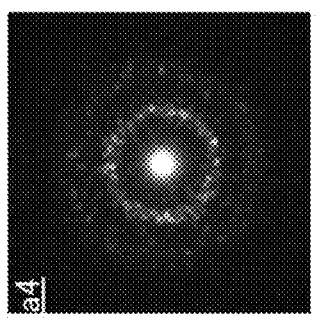
FIG. 15D a2
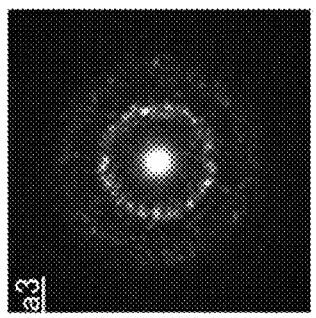
FIG. 15E a3
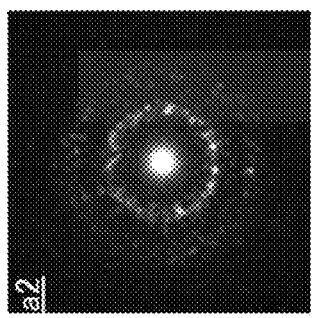
FIG. 15F a4
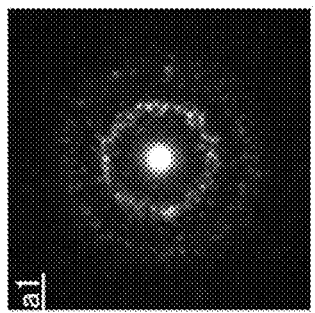
FIG. 15G a5
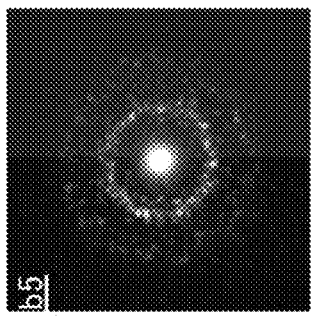
FIG. 15H b1
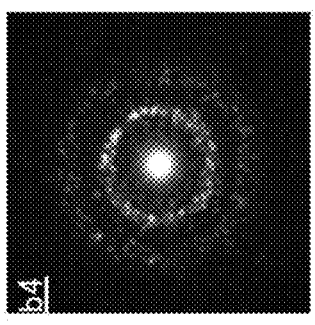
FIG. 15I b2
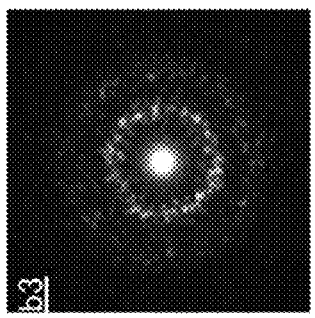
FIG. 15J b3
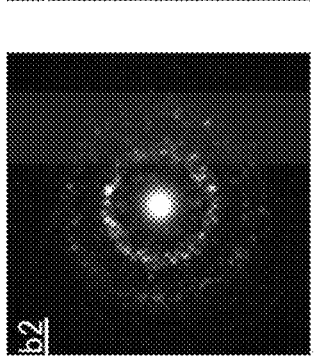
FIG. 15K b4
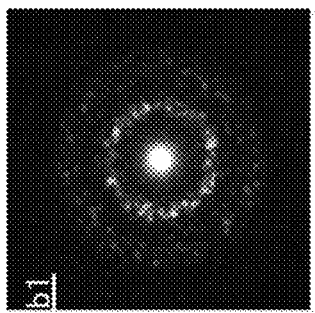
FIG. 15L b5

SEMICONDUCTOR DEVICE AND METHOD FOR MANUFACTURING THE SAME

BACKGROUND OF THE INVENTION

1. Field of the Invention

One embodiment of the present invention relates to a semiconductor device and a manufacturing method thereof. One embodiment of the present invention relates to a transistor and a manufacturing method thereof.

In this specification and the like, a semiconductor device generally means a device that can function by utilizing semiconductor characteristics. A display device, a light-emitting device, a lighting device, an electro-optical device, a semiconductor circuit, and an electronic device include a semiconductor device in some cases.

Note that one embodiment of the present invention is not limited to the above technical field. Examples of the technical field of one embodiment of the present invention disclosed in this specification and the like include a semiconductor device, a display device, a light-emitting device, a lighting device, a power storage device, a memory device, a driving method thereof, and a manufacturing method thereof.

2. Description of the Related Art

A metal oxide has attracted attention recently as a material used for a semiconductor layer of a transistor. For example, a transistor using an amorphous oxide containing indium, gallium, and zinc is known (see Patent Document 1).

A metal oxide can be formed by a sputtering method or the like, and thus can be used for a semiconductor layer of a transistor in a large display device. In addition, there is an advantage that capital investment can be reduced because part of production equipment for a transistor including amorphous silicon can be retrofitted and utilized. A transistor including an oxide has high field-effect mobility; therefore, a high-performance display device where a driver circuit and a display portion are formed over one substrate can be obtained.

REFERENCE

Patent Document

[Patent Document 1] Japanese Published Patent Application No. 2006-165528

SUMMARY OF THE INVENTION

One object of one embodiment of the present invention is to provide a semiconductor device which has favorable electrical characteristics. Another object of one embodiment of the present invention is to provide a semiconductor device with stable electrical characteristics. Another object of one embodiment of the present invention is to provide a semiconductor device with low power consumption. Another object of one embodiment of the present invention is to provide a highly reliable semiconductor device. Another object of one embodiment of the present invention is to provide a method for manufacturing a semiconductor device with high productivity. Another object of one embodiment of the present invention is to provide a method for manufacturing a semiconductor device with a high yield.

Note that the descriptions of these objects do not disturb the existence of other objects. In one embodiment of the present invention, there is no need to achieve all the objects. Objects other than the above objects can be derived from the description of the specification and like.

One embodiment of the present invention is a semiconductor device that includes a semiconductor layer, a first electrode, and a second electrode. The first electrode and the second electrode are each in contact with the semiconductor layer and are spaced from each other. The first electrode and the second electrode each include a first conductive layer, a second conductive layer, a first layer, and a second layer. The first conductive layer is in contact with a top surface of the semiconductor layer. The second conductive layer is over the first conductive layer. The first layer covers a top surface of the second conductive layer. The second layer covers a side surface of the second conductive layer. The first layer and the second layer each contain a metal element contained in the second conductive layer, silicon, and nitrogen.

In the above structure, the second conductive layer preferably has higher conductivity than the first conductive layer. The second conductive layer preferably has a lower melting point than the first conductive layer. It is preferable that the second conductive layer contain a metal element that forms a silicide by reacting with silicon and that the first layer and the second layer each contain a silicide. It is preferable that the first conductive layer contain titanium or tungsten and that the second conductive layer contain copper.

In the above structure, the semiconductor layer preferably contains a metal oxide. It is particularly preferable that the semiconductor layer contain at least one of indium, zinc, and gallium.

Another embodiment of the present invention is a method for manufacturing a semiconductor device that includes a first step of forming a first conductive film over a semiconductor layer; a second step of forming a second conductive film over the first conductive film; a third step of performing first treatment to form a first layer on a top surface of the second conductive film; a fourth step of etching the first layer and the second conductive film to expose a side surface of the second conductive film; a fifth step of performing second treatment to form a second layer on the side surface of the second conductive film; and a sixth step of etching the first conductive film to expose a side surface of the first conductive film and part of a top surface of the semiconductor layer. It is preferable that the first treatment and the second treatment each include a step of exposing a surface of the second conductive film to an atmosphere containing silane and then performing plasma treatment in an atmosphere containing nitrogen.

It is preferable that the above manufacturing method include a seventh step of performing third treatment between the second step and the third step and an eighth step of performing fourth treatment between the fourth step and the fifth step. It is preferable that the third treatment and the fourth treatment each include a step of removing an oxide film on the surface of the second conductive film. Furthermore, it is preferable that the third treatment and the fourth treatment each include a step of performing plasma treatment in an atmosphere containing ammonia.

The above manufacturing method preferably includes, after the sixth step, a ninth step of etching part of the top surface of the semiconductor layer with a solution containing an acid.

The first conductive film is preferably etched by a wet etching method in the sixth step.

Another embodiment of the present invention is a method for manufacturing a semiconductor device that includes a first step of forming a first conductive film over a semiconductor layer; a second step of forming a second conductive film over the first conductive film; a third step of etching the second conductive film to expose a side surface of the second conductive film; a fourth step of performing first treatment to form a first layer on a top surface of the second conductive film and a second layer on the side surface of the second conductive film; and a fifth step of etching the first conductive film. The first treatment preferably includes a step of exposing a surface of the second conductive film to an atmosphere containing silane and then performing plasma treatment in an atmosphere containing nitrogen.

The above manufacturing method preferably includes a sixth step of performing third treatment between the third step and the fourth step. The third treatment preferably includes a step of removing an oxide film on the surface of the second conductive film. The third treatment preferably includes a step of performing plasma treatment in an atmosphere containing ammonia.

The above manufacturing method preferably includes, after the fifth step, a seventh step of etching part of a top surface of the semiconductor layer with a solution containing an acid.

The first conductive film is preferably etched by a wet etching method in the fifth step.

It is preferable that the first conductive film formed in the first step contain titanium or tungsten and that the second conductive film formed in the second step contain copper.

With one embodiment of the present invention, a semiconductor device which has favorable electrical characteristics can be provided. A semiconductor device with stable electrical characteristics can be provided. A semiconductor device with low power consumption can be provided. A highly reliable semiconductor device can be provided. A method for manufacturing a semiconductor device with high productivity can be provided. A method for manufacturing a semiconductor device with a high yield can be provided.

Note that one embodiment of the present invention does not necessarily achieve all the effects listed above. Other effects can be derived from the description of the specification and the like.

BRIEF DESCRIPTION OF THE DRAWINGS

FIGS. 15A and 15B are TEM images of samples and FIGS. 15C to 15L are electron diffraction patterns thereof.

DETAILED DESCRIPTION OF THE INVENTION

Figure 1A:
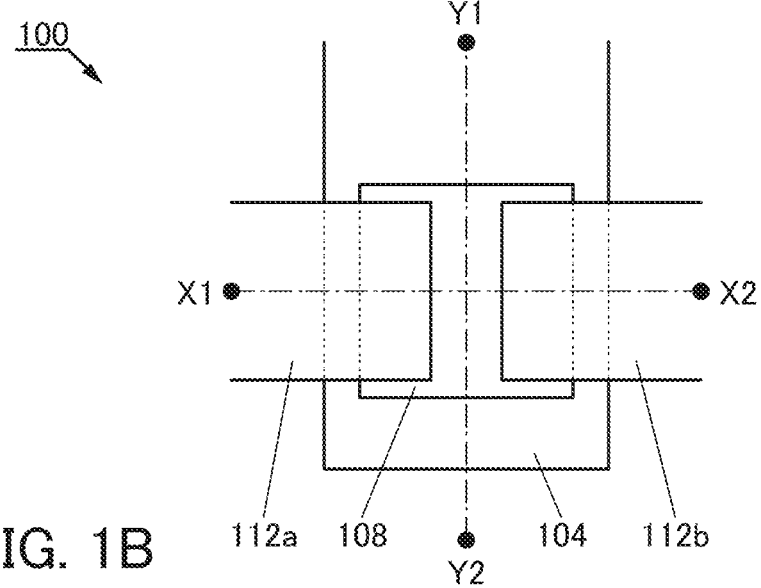
FIGS. 1A to 1C illustrate a structure example of a semiconductor device.

Embodiments will be described in detail with reference to drawings. Note that the present invention is not limited to the following description, and it is easily understood by those skilled in the art that various changes and modifications can be made without departing from the spirit and scope of the present invention. Accordingly, the present invention should not be interpreted as being limited to the description of the embodiments below.

Note that in the structures of the invention described below, the same portions or portions having similar functions are denoted by the same reference numerals in different drawings, and description of such portions is not repeated. Further, the same hatching pattern is applied to portions having similar functions, and the portions are not denoted by reference numerals in some cases.

Note that in each drawing described in this specification, the size, the layer thickness, or the region of each component is exaggerated for clarity in some cases. Therefore, embodiments of the present invention are not limited to such a scale.

Note that in this specification and the like, the ordinal numbers such as "first" and "second" are used in order to avoid confusion among components, and the terms do not limit the components numerically.

A transistor is a kind of semiconductor element and can achieve amplification of current or voltage, the switching operation for controlling conduction or non-conduction, or the like. A transistor in this specification includes an insulated-gate field-effect transistor (IGFET) and a thin film transistor (TFT).

Functions of a "source" and a "drain" are sometimes replaced with each other when a transistor of opposite polarity is used or when the direction of flow of current is changed in circuit operation, for example. Therefore, the terms "source" and "drain" can be used to denote the drain and the source, respectively, in this specification.

In this specification and the like, one of a source and a drain of a transistor is referred to as a "first electrode" and the other of the source and the drain is referred to as a "second electrode" in some cases. Note that a gate is also referred to as a "gate" or a "gate electrode".

Note that in this specification and the like, the expression "electrically connected" includes the case where components are connected through an "object having any electric function". There is no particular limitation on an "object having any electric function" as long as electrical signals can be transmitted and received between components that are connected through the object. Examples of an "object having any electric function" include a switching element such as a transistor, a resistor, a coil, a capacitor, and an element with a variety of functions in addition to an electrode and a wiring.

In this specification and the like, the term "parallel" indicates that the angle formed between two straight lines is greater than or equal to −10° and less than or equal to 10°, and accordingly also includes the case where the angle is greater than or equal to −5° and less than or equal to 5°. In addition, the term "perpendicular" indicates that the angle formed between two straight lines is greater than or equal to 80° and less than or equal to 100°, and accordingly also includes the case where the angle is greater than or equal to 85° and less than or equal to 95°.

In this specification and the like, the terms "film" and "layer" can be interchanged with each other. For example, the term "conductive layer" can be changed into the term "conductive film" in some cases. Also, the term "insulating film" can be changed into the term "insulating layer" in some cases.

Unless otherwise specified, the off-state current in this specification and the like refers to a drain current of a transistor in the off state (also referred to as non-conduction state and cutoff state). Unless otherwise specified, the off state of an n-channel transistor means that the voltage between its gate and source ($V_{gs}$: gate-source voltage) is lower than the threshold voltage $V_{th}$, and the off state of a p-channel transistor means that the gate-source voltage $V_{gs}$ is higher than the threshold voltage $V_{th}$. For example, the off-state current of an n-channel transistor sometimes refers to a drain current that flows when the gate-source voltage $V_{gs}$ is lower than the threshold voltage $V_{th}$.

The off-state current of a transistor depends on $V_{gs}$ in some cases. Therefore, "the off-state current of a transistor is I or lower" may mean that the off-state current of the transistor is I or lower at certain $V_{gs}$. The off-state current of a transistor may refer to off-state current at given $V_{gs}$, at $V_{gs}$ in a given range, or at $V_{gs}$ at which a sufficiently low off-state current is obtained, for example.

As an example, the assumption is made of an n-channel transistor where the threshold voltage $V_{th}$ is 0.5 V and the drain current is $1 \times 10^{-9}$ A at $V_{gs}$ of 0.5 V, $1 \times 10^{-13}$ A at $V_{gs}$ of 0.1 V, $1 \times 10^{-19}$ A at $V_{gs}$ of −0.5 V, and $1 \times 10^{-22}$ A at $V_{gs}$ of −0.8 V. The drain current of the transistor is $1 \times 10^{-19}$ A or lower at $V_{gs}$ of −0.5 V or at $V_{gs}$ in the range of −0.5 V to −0.8 V; therefore, it can be said that the off-state current of the transistor is $1 \times 10^{-19}$ A or lower. Since the drain current of the transistor is $1 \times 10^{-22}$ A or lower at certain $V_{gs}$, it may be said that the off-state current of the transistor is $1 \times 10^{-22}$ A or lower.

In this specification and the like, the off-state current of a transistor with a channel width W is sometimes represented by a current value per channel width W or by a current value per given channel width (e.g., 1 µm). In the latter case, the off-state current may be represented by current per length (e.g., A/µm).

The off-state current of a transistor depends on temperature in some cases. Unless otherwise specified, the off-state current in this specification may be off-state current at room temperature, 60° C., 85° C., 95° C., or 125° C. Alternatively, the off-state current may be off-state current at a temperature at which the reliability of a semiconductor device or the like including the transistor is ensured or a temperature at which the semiconductor device or the like including the transistor is used (e.g., a temperature in the range of 5° C. to 35° C.). The state in which the off-state current of a transistor is I or lower may indicate that the off-state current of the transistor at room temperature, 60° C., 85° C., 95° C., 125° C., a temperature at which the reliability of a semiconductor device or the like including the transistor is ensured, or a temperature at which the semiconductor device or the like including the transistor is used (e.g., a temperature in the range of 5° C. to 35° C.) is I or lower at certain $V_{gs}$.

The off-state current of a transistor depends on the voltage $V_{ds}$ between its drain and source in some cases. Unless otherwise specified, the off-state current in this specification may be off-state current at $V_{ds}$ of 0.1 V, 0.8 V, 1 V, 1.2 V, 1.8 V, 2.5 V, 3 V, 3.3 V, 10 V, 12 V, 16 V, or 20 V. Alternatively, the off-state current may be off-state current at $V_{ds}$ at which the reliability of a semiconductor device or the like including the transistor is ensured or at $V_{ds}$ used in the semiconductor device or the like including the transistor. The state in which the off-state current of a transistor is I or lower may indicate that the off-state current of the transistor at $V_{ds}$ of 0.1 V, 0.8 V, 1 V, 1.2 V, 1.8 V, 2.5 V, 3 V, 3.3 V, 10 V, 12 V, 16 V, or 20 V, at $V_{ds}$ at which the reliability of a semiconductor device or the like including the transistor is ensured, or at $V_{ds}$ used in the semiconductor device or the like including the transistor is I or lower at certain $V_{gs}$.

In the above description of the off-state current, a drain may be replaced with a source. That is, the off-state current sometimes refers to current that flows through a source of a transistor in the off state.

In this specification and the like, the term "leakage current" sometimes expresses the same meaning as "off-state current". In this specification and the like, the off-state current sometimes refers to current that flows between a source and a drain of a transistor in the off state, for example.

In this specification and the like, the threshold voltage of a transistor refers to a gate voltage ($V_g$) at which a channel is formed in the transistor. Specifically, in a graph where the horizontal axis represents the gate voltage ($V_g$) and the vertical axis represents the square root of drain current ($I_d$), the threshold voltage of a transistor may refer to a gate voltage ($V_g$) at the intersection of the square root of drain current ($I_d$) of 0 ($I_d$=0 A) and an extrapolated straight line that is tangent with the highest inclination to a plotted curve ($V_g$–$\sqrt{I_d}$ characteristics). Alternatively, the threshold voltage of a transistor may refer to a gate voltage ($V_g$) at which the value of $I_d$ [A]×L [µm]/W [µm] is $1 \times 10^{-9}$ [A] where L is channel length and W is channel width.

In this specification and the like, a "semiconductor" includes characteristics of an "insulator" in some cases when the conductivity is sufficiently low, for example. Furthermore, a "semiconductor" and an "insulator" cannot be strictly distinguished from each other in some cases because a border between the "semiconductor" and the "insulator" is not clear. Accordingly, a "semiconductor" in this specification and the like can be called an "insulator" in some cases, and vice versa.

In this specification and the like, a "semiconductor" includes characteristics of a "conductor" in some cases when the conductivity is sufficiently high, for example. Further, a "semiconductor" and a "conductor" cannot be strictly distinguished from each other in some cases because a border between the "semiconductor" and the "conductor" is not clear. Accordingly, a "semiconductor" in this specification and the like can be called a "conductor" in some cases, and vice versa.

Note that in this specification and the like, "In:Ga:Zn=4:2:3 or a neighborhood of In:Ga:Zn=4:2:3" refers to an atomic ratio where, when In is 4 with respect to the total number of atoms, Ga is greater than or equal to 1 and less than or equal to 3 ($1 \leq Ga \leq 3$) and Zn is greater than or equal to 2 and less than or equal to 4 ($2 \leq Zn \leq 4$). "In:Ga:Zn=5:1:6 or a neighborhood of In:Ga:Zn=5:1:6" refers to an atomic ratio where, when In is 5 with respect to the total number of atoms, Ga is greater than 0.1 and less than or equal to 2 ($0.1 < Ga \leq 2$) and Zn is greater than or equal to 5 and less than or equal to 7 ($5 \leq Zn \leq 7$). "In:Ga:Zn=1:1:1 or a neighborhood of In:Ga:Zn=1:1:1" refers to an atomic ratio where, when In is 1 with respect to the total number of atoms, Ga is greater than 0.1 and less than or equal to 2 ($0.1 < Ga \leq 2$) and Zn is greater than 0.1 and less than or equal to 2 ($0.1 < Zn \leq 2$).

In this specification and the like, a metal oxide means an oxide of metal in a broad sense. Metal oxides are classified into an oxide insulator, an oxide conductor (including a transparent oxide conductor), an oxide semiconductor (also simply referred to as an OS), and the like. For example, a metal oxide used in an active layer of a transistor is called an oxide semiconductor in some cases. That is to say, a metal oxide that has at least one of an amplifying function, a rectifying function, and a switching function can be called a metal oxide semiconductor, or OS for short. In addition, an OS FET is a transistor including a metal oxide or an oxide semiconductor.

In this specification and the like, a metal oxide including nitrogen is also called a metal oxide in some cases. Moreover, a metal oxide including nitrogen may be called a metal oxynitride.

In this specification and the like, "c-axis aligned crystal (CAAC)" or "cloud-aligned composite (CAC)" might be stated. CAAC refers to an example of a crystal structure, and CAC refers to an example of a function or a material composition.

In this specification and the like, a CAC-OS or a CAC metal oxide has a conducting function in a part of the material and has an insulating function in another part of the material; as a whole, the CAC-OS or the CAC metal oxide has a function of a semiconductor. In the case where the CAC-OS or the CAC metal oxide is used in an active layer of a transistor, the conducting function is to allow electrons (or holes) serving as carriers to flow, and the insulating function is not to allow electrons serving as carriers to flow. By the complementary action of the conducting function and the insulating function, the CAC-OS or the CAC metal oxide can have a switching function (on/off function). In the CAC-OS or CAC-metal oxide, separation of the functions can maximize each function.

In this specification and the like, the CAC-OS or the CAC metal oxide includes conductive regions and insulating regions. The conductive regions have the above-described conducting function, and the insulating regions have the above-described insulating function. In some cases, the conductive regions and the insulating regions in the material are separated at the nanoparticle level. In some cases, the conductive regions and the insulating regions are unevenly distributed in the material. The conductive regions are observed to be coupled in a cloud-like manner with their boundaries blurred, in some cases.

Furthermore, in the CAC-OS or the CAC metal oxide, the conductive regions and the insulating regions each have a size of greater than or equal to 0.5 nm and less than or equal to 10 nm, preferably greater than or equal to 0.5 nm and less than or equal to 3 nm and are dispersed in the material, in some cases.

The CAC-OS or the CAC metal oxide includes components having different bandgaps. For example, the CAC-OS or the CAC metal oxide includes a component having a wide gap due to the insulating region and a component having a narrow gap due to the conductive region. In the case of such a composition, carriers mainly flow in the component having a narrow gap. The component having a narrow gap complements the component having a wide gap, and carriers also flow in the component having a wide gap in conjunction with the component having a narrow gap. Therefore, in the case where the above-described CAC-OS or the CAC metal oxide is used in a channel region of a transistor, high current drive capability in the on state of the transistor, that is, a high on-state current and high field-effect mobility, can be obtained.

In other words, CAC-OS or CAC-metal oxide can be called a matrix composite or a metal matrix composite.

An example of a crystal structure of a metal oxide is described. Note that a metal oxide deposited by a sputtering method using an In—Ga—Zn oxide target (In:Ga:Zn=4:2:4.1 in an atomic ratio) is described below as an example. A metal oxide formed by a sputtering method using the above-mentioned target at a substrate temperature of higher than or equal to 100° C. and lower than or equal to 130° C. is referred to as sIGZO, and a metal oxide formed by a sputtering method using the above-mentioned target with the substrate temperature set at room temperature (R.T.) is referred to as tIGZO. For example, sIGZO has one or both of the nano crystal (nc) structure and the CAAC structure. Furthermore, tIGZO has a crystal structure of nc. Note that room temperature (R.T.) herein also refers to a temperature of the time when a substrate is not heated intentionally.

Embodiment 1

In this embodiment, a structure example of a semiconductor device of one embodiment of the present invention and an example of a manufacturing method thereof will be described.

A semiconductor device of one embodiment of the present invention includes a semiconductor layer as well as a first electrode and a second electrode that are provided over the semiconductor layer to be spaced from each other. The first electrode serves as one of a source electrode and a drain electrode, and the second electrode serves as the other of the source electrode and the drain electrode. In addition, the semiconductor device includes an insulating layer serving as a gate insulating layer and a conductive layer overlapping with the semiconductor layer with the insulating layer positioned therebetween. The conductive layer serves as a gate electrode.

The semiconductor layer is preferably formed using a metal oxide, for example. In that case, it is preferable to use an oxide containing one or more of indium, gallium, and zinc.

The first electrode and the second electrode each include a first conductive layer in contact with the semiconductor layer and a second conductive layer over the first conductive layer. The second conductive layer is preferably formed using a material having lower resistance than the first conductive layer. The second conductive layer is preferably formed using a material having a lower melting point than the first conductive layer. The second conductive layer is preferably formed using a material having lower etching resistance (particularly, resistance to a chemical solution) than the first conductive layer. The second conductive layer preferably contains a metal element that is more easily diffused to the semiconductor layer than a metal element contained in the first conductive layer. In other words, the first conductive layer preferably contains a metal element that is less likely to be diffused to the semiconductor layer than a metal element contained in the second conductive layer.

A first layer is formed on a top surface of the second conductive layer, and a second layer is formed on a side surface of the second conductive layer. The first layer and the second layer each serve as a nonconductor film having higher etching resistance than the second conductive layer.

The first layer and the second layer preferably contain silicon and nitrogen. Alternatively, the first layer and the second layer preferably contain a metal element that is contained in the second conductive layer and silicon. Alternatively, the first layer and the second layer preferably contain a metal element that is contained in the second conductive layer, silicon, and nitrogen. Specifically, the first layer and the second layer preferably contain silicon nitride, a silicide containing the metal element, or a silicide containing nitrogen. It is particularly preferable that the first layer and the second layer contain nitrogen because the first layer and the second layer become more stable.

The first electrode and the second electrode each have a structure in which the second conductive layer is surrounded by the first conductive layer, the first layer, and the second layer. In this manner, the first electrode and the second electrode can have high surface stability and low resistance. For example, this structure can minimize a problem such as an increase in electrical resistance due to deterioration of surfaces of the first electrode and the second electrode at the time of forming an insulating layer or the like over the first electrode and the second electrode.

A method for forming the first layer or the second layer is described. First, exposure to an atmosphere containing silicon (e.g., an atmosphere containing a silane gas (a $SiH_4$ gas)) is performed in a state where part of a surface of the second conductive layer is exposed, so that the surface of the second conductive layer and a silicon compound are made to react with each other. Then, exposure to an atmosphere containing a nitrogen gas is performed, followed by plasma treatment or heat treatment; thus, the first layer or the second layer containing nitrogen and silicon can be formed. At this time, it is preferable that silicon not be contained in the atmosphere in which the plasma treatment or the heat treatment is performed.

Since the first layer or the second layer is formed in a state where silicon exists on the surface of the second conductive layer, the coverage of the surface of the second conductive layer with the first or second layer is high. For example, a layer that is one atomic layer thick or several atomic layers thick (e.g., a layer with a thickness of greater than or equal to 0.3 nm and less than or equal to 10 nm) can be formed. Accordingly, this method does not easily form a pin hole or the like in the first layer and the second layer and the surface of the second conductive layer can be well prevented from being exposed.

A method in which a surface to be provided with a film is exposed to an atmosphere containing a silane gas can be specifically called a silane flush method. In addition, a method in which a surface to be provided with a film is exposed to an atmosphere containing a deposition gas of silicon or the like and then plasma treatment is performed in an atmosphere containing a gas of a different kind to form a film that is one atomic layer thick or several atomic layers thick can be called a plasma-assisted atomic layer deposition (PA-ALD) method.

The first layer and the second layer may each be formed by silicification of part of the surface of the second conductive layer. For example, in a state where the surface of the second conductive layer is exposed, exposure to an atmosphere containing a silane gas (a $SiH_4$ gas) is performed while a substrate is heated, whereby the second conductive layer can be provided with the first layer and the second layer each containing a silicide.

Alternatively, the first layer and the second layer each containing nitrogen can be formed by performing silicification in an atmosphere containing nitrogen in a state where the surface of the second conductive layer is exposed. Here, the first layer and the second layer can be formed by exposing the second conductive layer to an atmosphere containing a mixed gas of a silane gas and a nitrogen gas. Alternatively, the first layer and the second layer each containing nitrogen can be formed in such a manner that the second conductive layer is exposed to an atmosphere containing a silane gas and then plasma treatment is performed in an atmosphere containing nitrogen.

An example of a method for manufacturing the transistor of one embodiment of the present invention is as follows. First, a first conductive film to be the first conductive layer is stacked to be in contact with the semiconductor layer, and a second conductive film to be the second conductive layer is stacked over the first conductive film. Then, the first layer containing nitrogen and silicon is formed by the above-described method on a top surface of the second conductive film. After that, the first layer and the second conductive film are etched to expose a side surface of the second conductive film. Subsequently, the second layer containing nitrogen and silicon is formed by the above-described method on the side surface of the second conductive film. Accordingly, the second conductive layer that is in contact with the first layer and the second layer is formed. Then, the first conductive layer is etched, so that the first electrode and the second electrode are formed.

Alternatively, the following method may be employed. First, the first conductive film to be the first conductive layer is stacked to be in contact with the semiconductor layer, and the second conductive film to be the second conductive layer is stacked over the first conductive film. Then, the top surface of the second conductive film is silicified, whereby the first layer is formed. After that, the first layer and the second conductive film are etched to expose the side surface of the second conductive film. Subsequently, the side surface of the second conductive film is silicified, whereby the second layer is formed. Accordingly, the second conductive layer that is in contact with the first layer and the second layer is formed. Then, the first conductive layer is etched, so that the first electrode and the second electrode are formed.

The above-described manufacturing method allows the second conductive film to be etched in a state where the semiconductor layer is covered with the first conductive layer. Moreover, the second conductive layer is not exposed at the time of the etching of the first conductive layer. It is thus possible to prevent, for example, contamination of a surface of the semiconductor layer (e.g., a surface on the back channel side) due to attachment of a metal element or the like included in the second conductive layer to the surface. In addition, a metal element contained in the second conductive layer can be inhibited from being diffused into the semiconductor layer. Accordingly, a highly reliable semiconductor device can be manufactured.

One embodiment of the present invention can be suitably applied to a bottom-gate transistor, or specifically, a transistor with what is called a channel-etched structure in which an etching protective layer used in formation of source and drain electrodes is not provided on the back channel side of a semiconductor layer.

A more specific example of one embodiment of the present invention is described below with reference to drawings. A transistor is described below as an example of the semiconductor device.

Structure Example 1

Figure 1B:
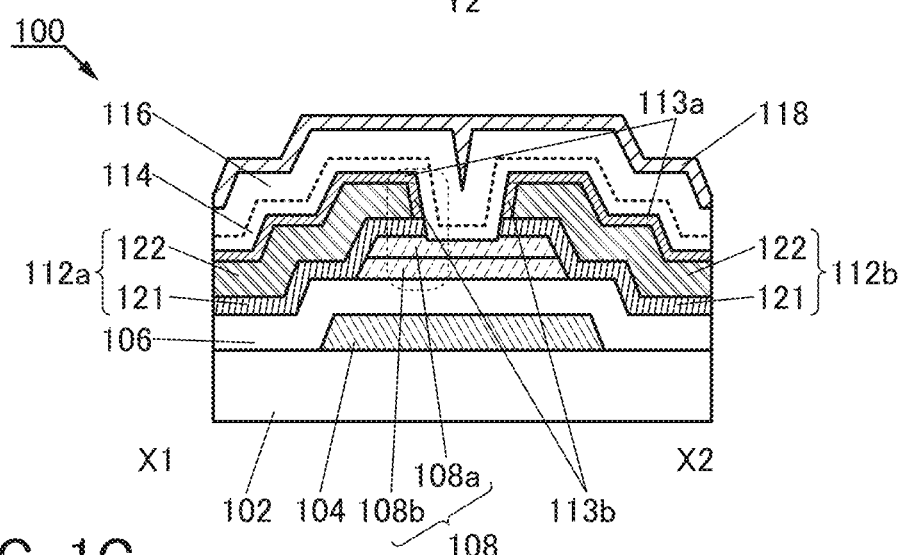
Figure 1C:
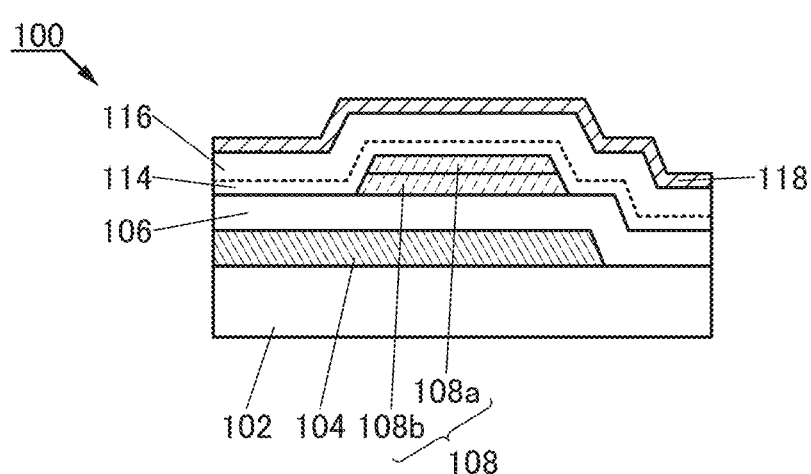

FIG. 1A is a top view of a transistor 100. FIG. 1B is a schematic cross-sectional view taken along line X1-X2 in FIG. 1A. FIG. 1C is a schematic cross-sectional view taken along line Y1-Y2 in FIG. 1A. Note that FIG. 1A does not illustrate some components of the transistor 100 (e.g., an insulating layer) to avoid complexity. The X1-X2 direction and the Y1-Y2 direction are sometimes referred to as a channel length direction and a channel width direction, respectively.

The transistor 100 includes a conductive layer 104 over a substrate 102, an insulating layer 106 over the substrate 102 and the conductive layer 104, a semiconductor layer 108 over the insulating layer 106, and an electrode 112a and an electrode 112b that are spaced from each other and are in contact with a top surface of the semiconductor layer 108. An insulating layer 114, an insulating layer 116, and an insulating layer 118 are provided to cover the electrode 112a, the electrode 112b, and the semiconductor layer 108. Note that in each of FIGS. 1B and 1C and other drawings, a dashed line indicates the boundary between the insulating layer 114 and the insulating layer 116.

Part of the conductive layer 104 serves as a gate electrode. Part of the insulating layer 106 serves as a gate insulating layer. The electrode 112a serves as one of a source electrode and a drain electrode and the electrode 112b serves as the other of the source electrode and the drain electrode. The insulating layer 114, the insulating layer 116, and the insulating layer 118 each serve as a protective layer.

In the example illustrated in FIGS. 1B and 1C, the semiconductor layer 108 has a stacked-layer structure in which a semiconductor layer 108a and a semiconductor layer 108b, in the order from top to bottom, are stacked. The semiconductor layer 108b is provided over the insulating layer 106. The semiconductor layer 108a is provided over the semiconductor layer 108b and is in contact with the electrode 112a and the electrode 112b.

Note that the transistor 100 is what is called a channel-etched transistor.

The electrode 112a and the electrode 112b each include a conductive layer 121, a conductive layer 122, a first layer 113a, and a second layer 113b.

The conductive layer 121 is provided in contact with a top surface and a side surface of the semiconductor layer 108a. The conductive layer 122 is provided over and in contact with the conductive layer 121. When seen from above, the conductive layer 122 is provided inward from the conductive layer 121. The first layer 113a is provided in contact with a top surface of the conductive layer 122. The second layer 113b is provided on a side surface of the conductive layer 122.

Figure 2A:
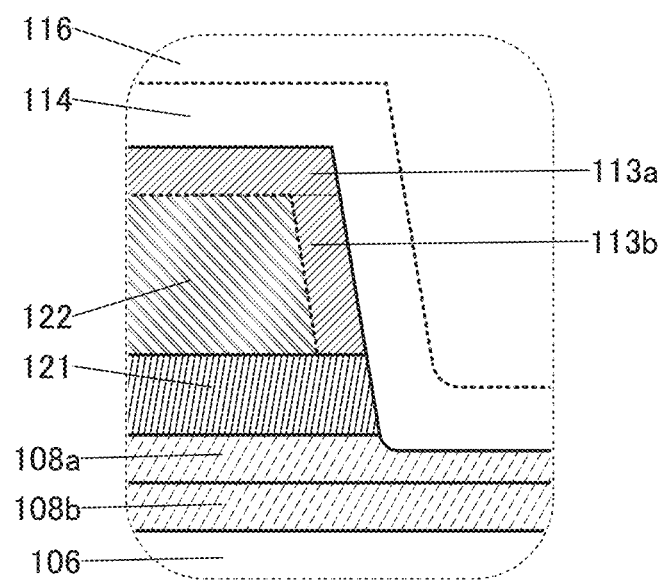
FIGS. 2A to 2C illustrate structure examples of a semiconductor device.

FIG. 2A is an enlarged view of a region that is surrounded by a dashed line in FIG. 1B. An end portion of the electrode 112a that is positioned over the semiconductor layer 108 and the vicinity of the end portion are enlarged in FIG. 2A.

The first layer 113a and the second layer 113b contain silicon and a metal element that is contained in the conductive layer 122. It is preferable that the first layer 113a and the second layer 113b contain a silicide of a metal element contained in the conductive layer 122.

It is preferable that the first layer 113a and the second layer 113b contain silicon, nitrogen, and a metal element that is contained in the conductive layer 122. By containing nitrogen, the first layer 113a and the second layer 113b can be highly stable.

The conductive layer 121 and the conductive layer 122 preferably contain different conductive materials. The conductive layer 122 is preferably formed using a material having lower resistance than the conductive layer 121. The conductive layer 122 can be formed using a material having a lower melting point than the conductive layer 121. The conductive layer 122 can be formed using a material having lower etching resistance (particularly, resistance to a chemical solution) than the conductive layer 121. The conductive layer 122 preferably contains a metal element that is more easily diffused to the semiconductor layer 108 (the semiconductor layer 108a or the semiconductor layer 108b) and the like than a metal element contained in the conductive layer 121. In other words, the conductive layer 121 preferably contains a metal element that is less likely to be diffused to the semiconductor layer 108 than a metal element contained in the conductive layer 122. The conductive layer 121 is preferably formed using a material that prevents (blocks) diffusion of a metal element contained in the conductive layer 122.

It is particularly preferable that the conductive layer 122 be formed using a material containing copper. The conductive layer 121 is preferably formed using a material to which copper is not easily diffused and for example, preferably contains tungsten, titanium, tantalum, molybdenum, or a nitride of any of these metals.

In the case where the conductive layer 122 contains copper, for example, the first layer 113a and the second layer 113b contain copper silicide. Copper silicide is more stable than copper owing to a bond between copper and silicon and has a function of inhibiting copper from being diffused to the outside. In the case where the insulating layer 114 contains silicon, adhesion between the insulating layer 114 and the first and second layers 113a and 113b containing copper and silicon can be high.

It is particularly preferable that the first layer 113a and the second layer 113b contain copper, silicon, and nitrogen. In that case, copper silicide nitride may be formed. The first layer 113a and the second layer 113b can more effectively inhibit diffusion of copper to the outside when containing nitrogen. This effect is brought to the fore particularly when copper silicide nitride is formed.

Here, the boundary between the first layer 113a and the second layer 113b is not clear in some cases because these layers contain similar materials. Thus, the boundary between the first layer 113a and the second layer 113b is indicated by a dashed line in each of FIG. 1B, FIG. 2A, and other drawings.

As described later, in the case where the first layer 113a and the second layer 113b are separately formed, components in the air and remaining components in an apparatus, such as nitrogen, oxygen, fluorine, and chlorine, sometimes segregate at the boundary between these layers. In the case where the first layer 113a and the second layer 113b are formed at the same time, the boundary therebetween sometimes does not exist, so that the layers are one body. In that case, the portion covering the top surface of the conductive layer 122 is the first layer 113a, and the portion covering the side surface of the conductive layer 122 is the second layer 113b.

In some cases, what might be called a mixed layer of the first layer 113a and the conductive layer 122 is formed therebetween and what might be called a mixed layer of the second layer 113b and the conductive layer 122 is formed therebetween, so that the boundary between the first layer 113a and the conductive layer 122 and the boundary between the second layer 113b and the conductive layer 122 cannot be clearly observed. For example, a region whose silicon concentration is lower than that of the first layer 113a or the second layer 113b and continuously decreases with the proximity to the conductive layer 122 sometimes exists between the conductive layer 122 and the first layer 113a or the second layer 113b. Thus, the boundary between the first layer 113a and the conductive layer 122 and the boundary between the second layer 113b and the conductive layer 122 are indicated by dashed lines in FIG. 2A.

Figure 2B:
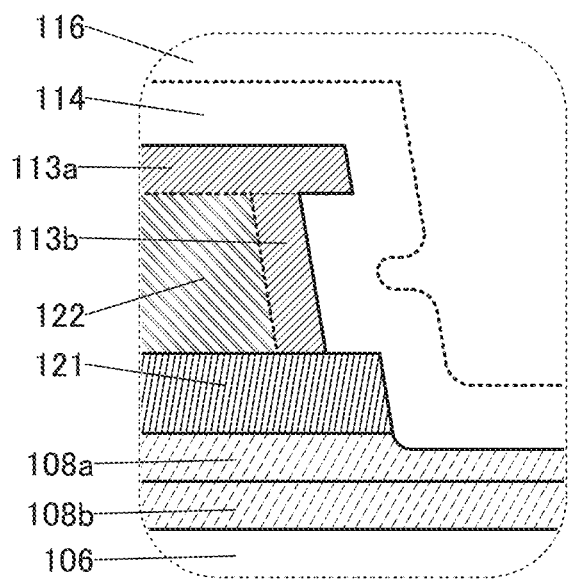

As illustrated in FIG. 2B, a surface of the second layer 113b is located inward from the conductive layer 121 in some cases. Such a shape is sometimes formed when, for example, the side surface of the conductive layer 122 recedes as a result of etching of the conductive layer 122.

Figure 2C:
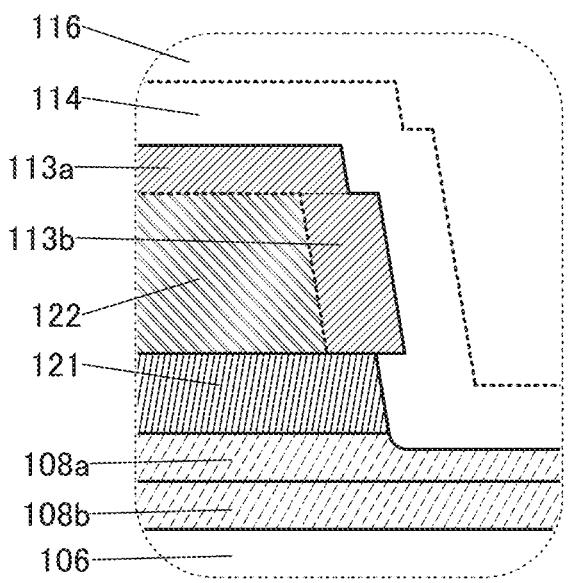

As illustrated in FIG. 2C, the surface of the second layer 113b more protrudes than the conductive layer 121 or the first layer 113a in other cases.

The above is the description of the structure example 1.

A structure example of a transistor partly different from the structure example 1 described above will be described below. Note that description of the same portions as those in the structure example 1 described above is skipped or simplified in some cases. In the drawings that are referred to later, the same hatching pattern is applied to portions having functions similar to those in the structure example 1 described above, and the portions are not denoted by reference numerals in some cases.

Structure Example 2

Figure 3A:
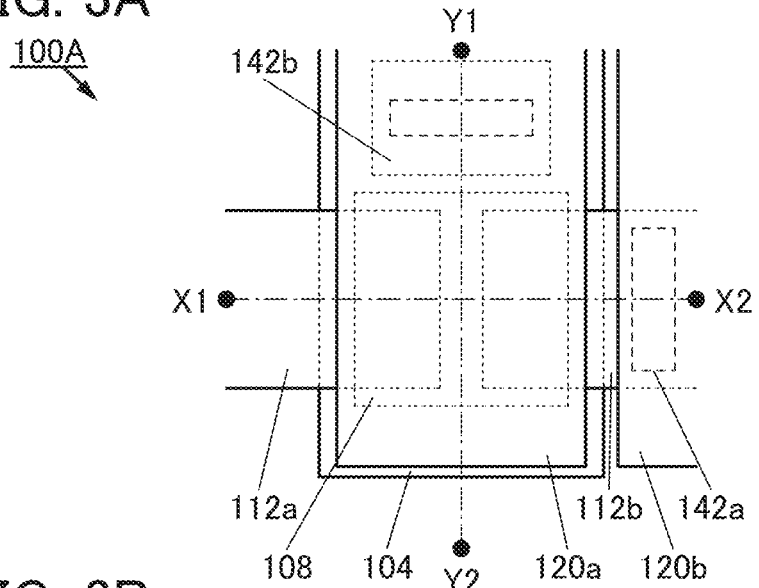
FIGS. 3A to 3C illustrate a structure example of a semiconductor device.
Figure 3B:
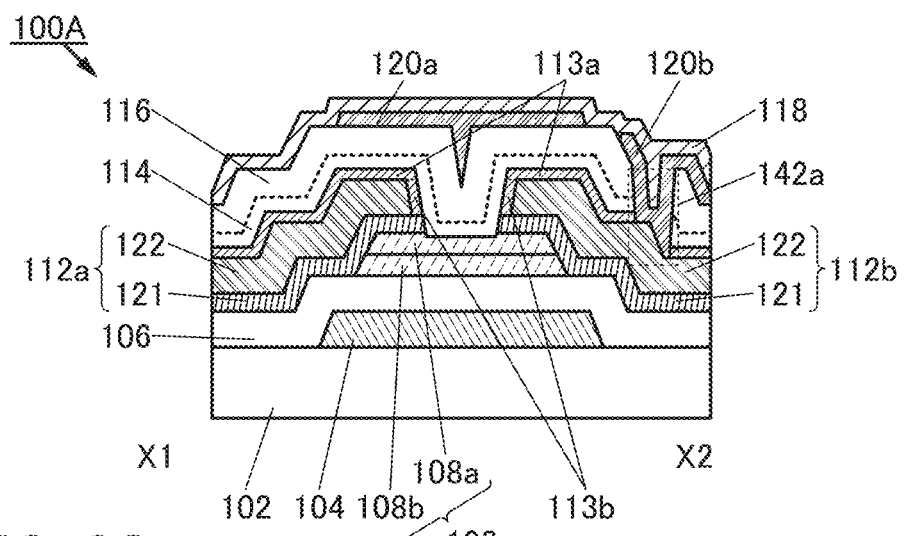
Figure 3C:
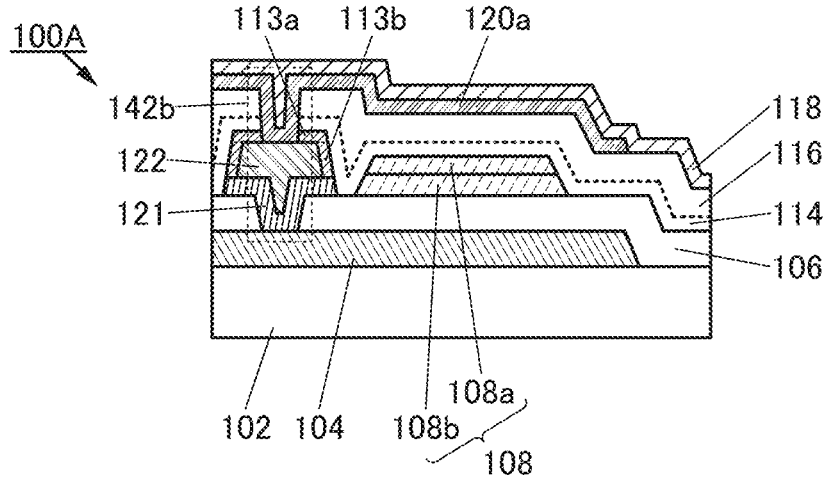

FIG. 3A is a top view of a transistor 100A described below, and FIG. 3B is a schematic cross-sectional view taken along line X1-X2 in FIG. 3A. FIG. 3C is a schematic cross-sectional view taken along line Y1-Y2 in FIG. 3A.

The transistor 100A includes the conductive layer 104 over the substrate 102; the insulating layer 106 over the substrate 102 and the conductive layer 104; the semiconductor layer 108 over the insulating layer 106; the electrode 112a and the electrode 112b that are spaced from each other and are in contact with the top surface of the semiconductor layer 108; the insulating layer 114 and the insulating layer 116 covering the electrode 112a, the electrode 112b, and the semiconductor layer 108; and a conductive layer 120a provided over the insulating layer 116 and overlapping with the semiconductor layer 108. In addition, a conductive layer 120b is provided over the insulating layer 116 to be electrically connected to the electrode 112b. The insulating layer 118 is provided to cover the insulating layer 116, the conductive layer 120a, and the conductive layer 120b.

The conductive layer 104 serves as a first gate and the conductive layer 120a serves as a second gate. Part of the insulating layer 106 serves as a first gate insulating layer, and part of the insulating layer 114 and part of the insulating layer 116 serve as a second gate insulating layer. The transistor 100A is a transistor including a pair of gate electrodes.

In the example illustrated in FIGS. 3B and 3C, the semiconductor layer 108 has a stacked-layer structure in which the semiconductor layer 108a and the semiconductor layer 108b, in the order from top to bottom, are stacked. The semiconductor layer 108b is provided over the insulating layer 106. The semiconductor layer 108a is provided over the semiconductor layer 108b and is in contact with the electrode 112a and the electrode 112b.

The conductive layer 120b is electrically connected to the conductive layer 122 of the electrode 112b through a connection portion 142a. In the connection portion 142a, the conductive layer 120b is electrically connected to the conductive layer 122 of the electrode 112b through an opening provided in the insulating layer 116, the insulating layer 114, and the first layer 113a.

It is preferable that as illustrated in FIG. 3C, the conductive layer 120a and the conductive layer 104 be electrically connected through a connection portion 142b. The conductive layer 121 and the conductive layer 122 are provided in the connection portion 142b. In the connection portion 142b, the conductive layer 120a is electrically connected to the conductive layer 122 through an opening provided in the insulating layer 116, the insulating layer 114, and the first layer 113a, and the conductive layer 121 in contact with the conductive layer 122 is electrically connected to the conductive layer 104 through an opening provided in the insulating layer 106.

The semiconductor layer 108 of the transistor 100A illustrated in FIGS. 3A to 3C is sandwiched between the conductive layer 104 and the conductive layer 120a. Each of the conductive layer 104 and the conductive layer 120a has a larger length in the channel length direction and a larger length in the channel width direction than the semiconductor layer 108. Accordingly, the semiconductor layer 108 is surrounded by the conductive layer 104 and the conductive layer 120a with the insulating layer 106, the insulating layer 114, and the insulating layer 116 provided between the semiconductor layer 108 and the conductive layers 104 and 120a.

In other words, the conductive layer 104 and the conductive layer 120a surround the semiconductor layer 108 in the channel width direction of the transistor 100A.

With such a structure, the semiconductor layer 108 included in the transistor 100A can be electrically surrounded by electric fields of the conductive layer 104 and the conductive layer 120a. A device structure of a transistor like that of the transistor 100A, in which electric fields of the conductive layers 104 and 120a electrically surround a semiconductor layer where a channel region is formed can be referred to as a surrounded channel (s-channel) structure.

Since the transistor 100A has an s-channel structure, an electric field for inducing a channel can be effectively applied to the semiconductor layer 108 from the conductive layers 104 and 120a. Accordingly, the driving capability of the transistor 100A is increased, so that high on-state current characteristics can be obtained. Owing to a high on-state current, it is possible to reduce the size of the transistor 100A. Furthermore, since the transistor 100A has a structure in which the semiconductor layer 108 is surrounded by the conductive layers 104 and 120a, the mechanical strength of the transistor 100A can be increased.

In the above-described structure, regions where carriers flow are formed on both the conductive layer 104 side of the semiconductor layer 108 and the conductive layer 120a side of the semiconductor layer 108, so that carriers flow in a wide region and the amount of moving carriers in the transistor 100A increases. The on-state current of the transistor 100A can be higher than that when a predetermined potential is applied to any one of the conductive layer 104 and the conductive layer 120a.

Figure 4A:
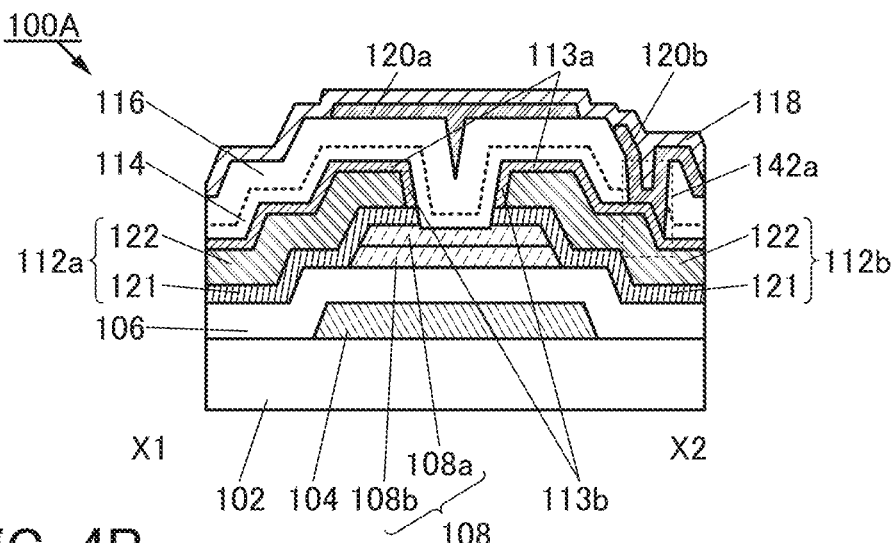
FIGS. 4A and 4B illustrate a structure example of a semiconductor device.
Figure 4B:
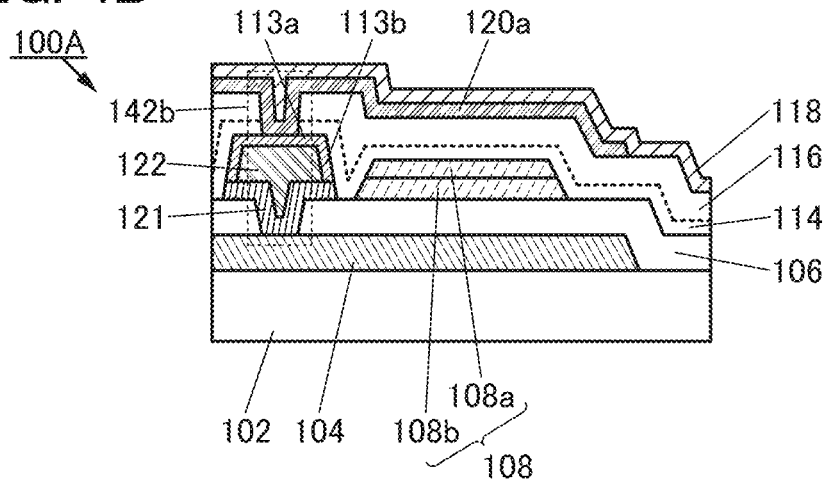

The conductive layer 120a and the conductive layer 120b are in contact with the conductive layer 122 in the structure illustrated in FIGS. 3B and 3C; however, the conductive layer 120a and the conductive layer 120b may be electrically connected to the conductive layer 122 through the first layer 113a as illustrated in FIGS. 4A and 4B when the first layer 113a is conductive.

The above is the description of the structure example 2.

Modification Example

Examples are described below in which the above semiconductor layer has different structures.

Figure 5A:
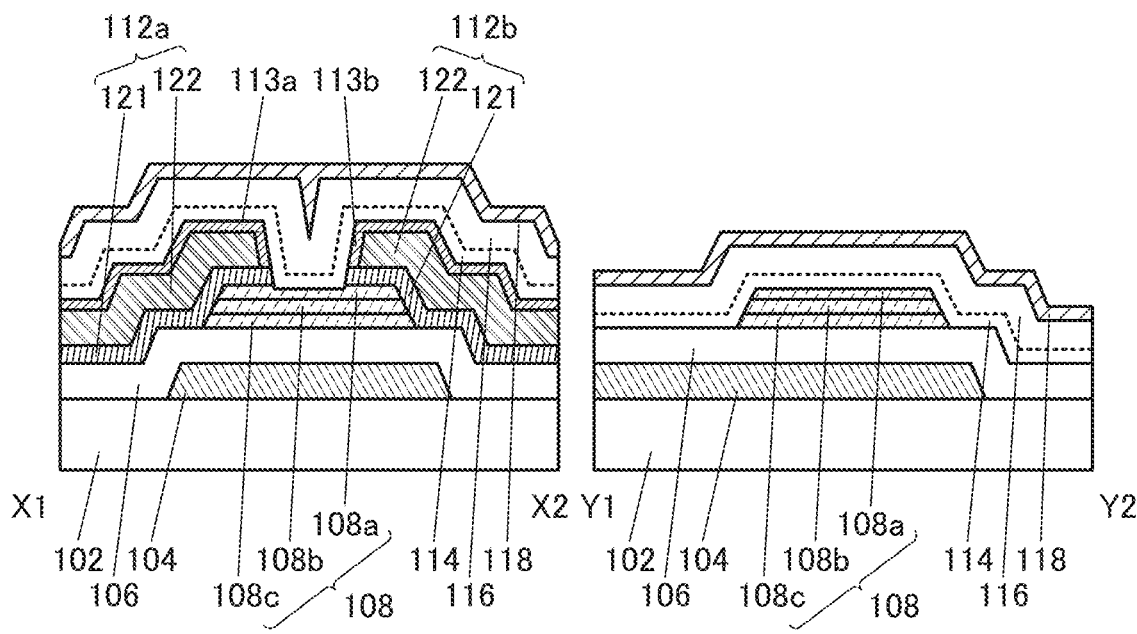
FIGS. 5A and 5B illustrate structure examples of semiconductor devices.
Figure 5B:
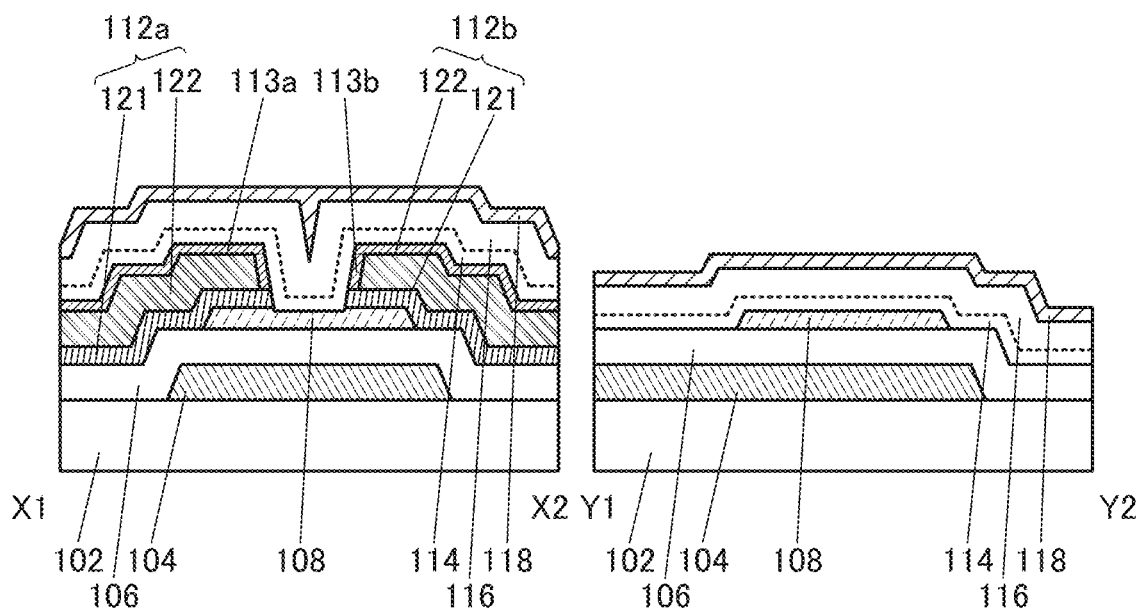

Transistors illustrated in FIGS. 5A and 5B are different from the transistor 100 described in the structure example 1 in the structure of the semiconductor layer 108. Transistors illustrated in FIGS. 6A and 6B are different from the transistor 100A described in the structure example 2 in the structure of the semiconductor layer 108.

Figure 6A:
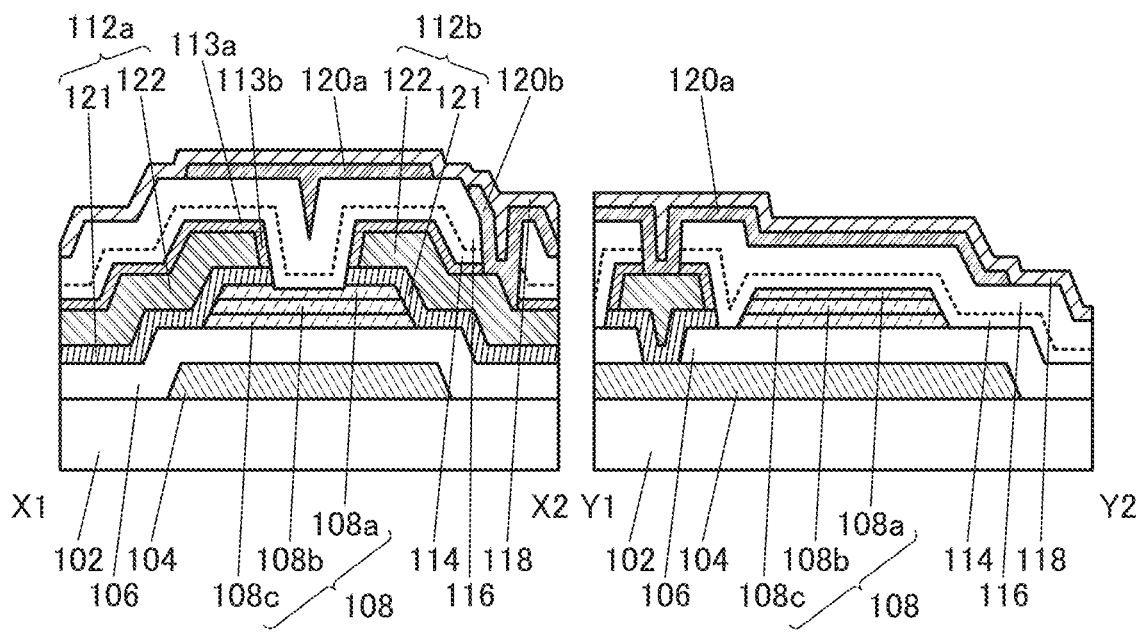
FIGS. 6A and 6B illustrate structure examples of semiconductor devices.

The semiconductor layer 108 of each of the transistors illustrated in FIG. 5A and FIG. 6A has a stacked-layer structure in which the semiconductor layer 108a, the semiconductor layer 108b, and a semiconductor layer 108c, in the order from top to bottom, are stacked. That is, the semiconductor layer 108 of each of the transistors illustrated in FIG. 5A and FIG. 6A has a three-layer structure.

Figure 6B:
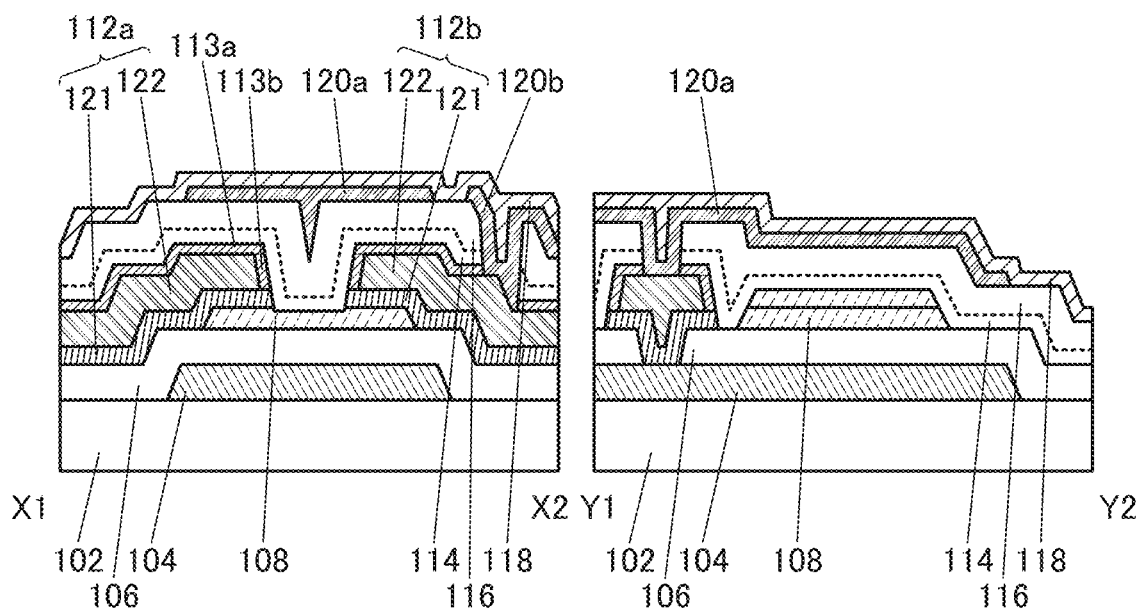

In each of the examples illustrated in FIG. 5B and FIG. 6B, the semiconductor layer 108 of the transistor has a single-layer structure.

The semiconductor layer 108 having a single-layer structure and the semiconductor layers 108a, 108b, and 108c of the semiconductor layer 108 having a stacked-layer structure are described below.

Each of the semiconductor layer 108, the semiconductor layer 108a, the semiconductor layer 108b, and the semiconductor layer 108c preferably contains a metal oxide. It is particularly preferable that each layer include an oxide containing one or more of indium, gallium, and zinc. Alternatively, each layer preferably contains In, Zn, and M (M is one or more of gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium).

It is particularly preferable that the semiconductor layer 108, the semiconductor layer 108a, the semiconductor layer 108b, and the semiconductor layer 108c each independently contain In, M, and Zn. Furthermore, it is preferable that the semiconductor layer 108, the semiconductor layer 108a, the semiconductor layer 108b, and the semiconductor layer 108c each independently include a region where the atomic proportion of In is higher than that of M. For example, the atomic ratio of In to M and Zn is preferably In:M:Zn=4:2:3 or a neighborhood of In:M:Zn=4:2:3, or In:M:Zn=5:1:7 or a neighborhood of In:M:Zn=5:1:7.

In the case where the semiconductor layer 108 has a stacked-layer structure including two layers, for example, the lower semiconductor layer 108b is formed using a CAC-OS, which is described later. Accordingly, the amount of on-state current of the transistor can be increased. The upper semiconductor layer 108a is formed using a CAAC-OS, which is described later. The use of a high-crystallinity film for the upper semiconductor layer 108a increases etching resistance, which prevents part of the semiconductor layer 108a from disappearing at the time of formation of the electrode 112a and the electrode 112b.

When the semiconductor layer 108 has a stacked-layer structure including three layers, the lowermost semiconductor layer 108c can have a structure similar to that of the semiconductor layer 108a or the semiconductor layer 108b. For example, when the semiconductor layer 108c has a structure similar to that of the semiconductor layer 108a, the reliability of the semiconductor layer 108 having the stacked-layer structure can be increased. When the semiconductor layer 108c has a structure similar to that of the semiconductor layer 108b, the on-state current of the transistor can be further increased.

As described above, in the semiconductor layer 108 having a stacked-layer structure in one embodiment of the present invention, the lower semiconductor layer 108b is formed using a metal oxide with low crystallinity and the upper semiconductor layer 108a is formed using a metal oxide with high crystallinity and covers an upper portion of the semiconductor layer 108b. The low-crystallinity region of the semiconductor layer 108b sometimes increases the carrier density. In that case, the semiconductor layer 108b can serve as a main current path. As a result, the transistor can have a high on-state current and increased reliability.

The semiconductor layer 108 having a single-layer structure can increase the on-state current of the transistor when having a structure similar to that of the semiconductor layer 108b. Furthermore, the semiconductor layer 108 having a single-layer structure can increase the reliability of the transistor when having a structure similar to that of the semiconductor layer 108a.

The above is the description of the modification example.

[Component of Semiconductor Device]

Components of the semiconductor devices of this embodiment will be described below in detail.

[Substrate]

There is no particular limitation on a material and the like of the substrate 102 as long as the material has heat resistance high enough to withstand at least heat treatment to be performed later. For example, a glass substrate, a ceramic substrate, a quartz substrate, a sapphire substrate, or the like may be used as the substrate 102. Alternatively, a single crystal semiconductor substrate or a polycrystalline semiconductor substrate of silicon or silicon carbide, a compound semiconductor substrate of silicon germanium or the like, an SOI substrate, or the like can be used, or any of these substrates provided with a semiconductor element may be used as the substrate 102. In the case where a glass substrate is used as the substrate 102, a large substrate having any of the following sizes can be used: the 6th generation (1500 mm×1850 mm), the 7th generation (1870 mm×2200 mm), the 8th generation (2200 mm×2400 mm), the 9th generation (2400 mm×2800 mm), and the 10th generation (2950 mm×3400 mm). Thus, a large-sized display device can be fabricated.

Alternatively, a flexible substrate may be used as the substrate 102, and the transistor 100 may be provided directly on the flexible substrate. Alternatively, a separation layer may be provided between the substrate 102 and the transistor 100. The separation layer can be used when part or the whole of a semiconductor device formed over the separation layer is separated from the substrate 102 and transferred onto another substrate. In such a case, the transistor 100 can be transferred to a substrate having low heat resistance or a flexible substrate as well.

[Conductive Layer]

The conductive layer 104 functioning as a gate electrode and the electrodes 112a and 112b functioning as a source electrode and a drain electrode can each be formed using a metal element selected from chromium, copper, aluminum, gold, silver, zinc, molybdenum, tantalum, titanium, tungsten, manganese, nickel, iron, and cobalt; an alloy including any of these metal elements as its component; an alloy including a combination of any of these metal elements; or the like.

Furthermore, the conductive layer 104, the electrode 112a, and the electrode 112b can be formed using an oxide conductor or an oxide semiconductor, such as an oxide including indium and tin (In—Sn oxide), an oxide including indium and tungsten (In—W oxide), an oxide including indium, tungsten, and zinc (In—W—Zn oxide), an oxide including indium and titanium (In—Ti oxide), an oxide including indium, titanium, and tin (In—Ti—Sn oxide), an oxide including indium and zinc (In—Zn oxide), an oxide including indium, tin, and silicon (In—Sn—Si oxide), or an oxide including indium, gallium, and zinc (In—Ga—Zn oxide).

Here, an oxide conductor is described. In this specification and the like, an oxide conductor may be referred to as OC. For example, the oxide conductor is obtained in the following manner. Oxygen vacancies are formed in a metal oxide having semiconductor characteristics, and then hydrogen is added to the oxygen vacancies, so that a donor level is formed in the vicinity of the conduction band. This increases the conductivity of the metal oxide; accordingly, the metal oxide becomes a conductor. The metal oxide having become a conductor can be referred to as an oxide conductor. Metal oxides having semiconductor characteristics generally transmit visible light because of their large energy gap. Since an oxide conductor is a metal oxide having a donor level in the vicinity of the conduction band, the influence of absorption due to the donor level is small in an oxide conductor, and an oxide conductor has a visible light transmitting property comparable to that of a metal oxide having semiconductor characteristics.

A Cu—X alloy film (X is Mn, Ni, Cr, Fe, Co, Mo, Ta, or Ti) may be used for the conductive layer 104, the electrode 112a, and the electrode 112b. The use of a Cu—X alloy film results in lower manufacturing costs because the film can be processed by wet etching.

Among the above-mentioned metal elements, any one or more elements selected from copper, titanium, tungsten, tantalum, and molybdenum are preferably included in the electrodes 112a and 112b. In particular, a tantalum nitride film is preferably used for the electrodes 112a and 112b. A tantalum nitride film has conductivity and a high barrier property against copper or hydrogen. Because a tantalum nitride film releases little hydrogen from itself, it can be most favorably used as a conductive layer in contact with the semiconductor layer 108 or a conductive layer in the vicinity of the semiconductor layer 108. It is favorable to use a copper film for the electrodes 112a and 112b because the resistance of the electrodes 112a and 112b can be reduced.

The electrodes 112a and 112b can also be formed by electroless plating. As a material that can be deposited by electroless plating, for example, one or more elements selected from Cu, Ni, Al, Au, Sn, Co, Ag, and Pd can be used. It is further favorable to use Cu or Ag because the resistance of the conductive layer can be reduced.

[Insulating Layer Functioning as Gate Insulating Layer]

As the insulating layer 106 functioning as a gate insulating layer, an insulating layer including at least one of the following films formed by a plasma enhanced chemical vapor deposition (PECVD) method, a sputtering method, or the like can be used: a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, and a neodymium oxide film. Note that the insulating layer 106 may have a stacked-layer structure or a stacked-layer structure of three or more layers.

The insulating layer 106 that is in contact with the semiconductor layer 108 functioning as a channel region of the transistor is preferably an oxide insulating film and preferably includes a region including oxygen in excess of the stoichiometric composition (oxygen-excess region). In other words, the insulating layer 106 is an insulating film capable of releasing oxygen. In order to provide the oxygen-excess region in the insulating layer 106, the insulating layer 106 is formed in an oxygen atmosphere, or the deposited insulating layer 106 is subjected to heat treatment in an oxygen atmosphere, for example.

In the case where hafnium oxide is used for the insulating layer 106, the following effect is attained. Hafnium oxide has higher dielectric constant than silicon oxide and silicon oxynitride. Therefore, the insulating layer 106 using hafnium oxide can have a larger thickness than the insulating layer 106 using silicon oxide, so that leakage current due to tunnel current can be low. That is, it is possible to provide a transistor with a low off-state current. Moreover, hafnium oxide having a crystal structure has a higher dielectric constant than hafnium oxide having an amorphous structure. Therefore, it is preferable to use hafnium oxide having a crystal structure, in order to provide a transistor with a low off-state current. Examples of the crystal structure include a monoclinic crystal structure and a cubic crystal structure. Note that one embodiment of the present invention is not limited to the above examples.

In this embodiment, a layered film of a silicon nitride film and a silicon oxide film is formed as the insulating layer 106. The silicon nitride film has a higher dielectric constant than a silicon oxide film and needs a larger thickness for capacitance equivalent to that of the silicon oxide film. Thus, when the silicon nitride film is included in the gate insulating layer of the transistor, the thickness of the insulating film can be increased. This makes it possible to reduce a decrease in withstand voltage of the transistor and furthermore to increase the withstand voltage, thereby reducing electrostatic discharge damage to the transistor.

[Semiconductor Layer]

The semiconductor layer 108 can be formed using the materials described above.

In the case where the semiconductor layer 108 includes an In-M-Zn oxide, it is preferable that the atomic ratio of metal elements of a sputtering target used for forming the In-M-Zn oxide satisfy In>M The atomic ratio of metal elements in such a sputtering target is, for example, In:M:Zn=2:1:3, In:M:Zn=3:1:2, In:M:Zn=4:2:4.1, In:M:Zn=5:1:6, In:M:Zn=5:1:7, In:M:Zn=5:1:8, In:M:Zn=6:1:6, In:M:Zn=5:2:5, or the like.

In the case where the semiconductor layer 108 is formed of an In-M-Zn oxide, it is preferable to use a target including a polycrystalline In-M-Zn oxide as the sputtering target. The use of the target including a polycrystalline In-M-Zn oxide facilitates formation of the semiconductor layer 108 having crystallinity. Note that the atomic ratio of metal elements in the formed semiconductor layer 108 varies from the above atomic ratios of metal elements of the sputtering targets in a range of ±40%. For example, when a sputtering target with an atomic ratio of In to Ga to Zn of 4:2:4.1 is used, the atomic ratio of In to Ga to Zn in the formed semiconductor layer 108 may be 4:2:3 or in the neighborhood of 4:2:3.

The energy gap of the semiconductor layer 108 is 2 eV or more, preferably 2.5 eV or more. With the use of a metal oxide having such a wide energy gap, the off-state current of the transistor can be reduced.

Furthermore, the semiconductor layer 108 preferably has a non-single-crystal structure. Examples of the non-single-crystal structure include a c-axis-aligned crystalline oxide semiconductor (CAAC-OS) which is described later, a polycrystalline structure, a microcrystalline structure, and an amorphous structure. Among the non-single-crystal structures, the amorphous structure has the highest density of defect states, whereas the CAAC-OS has the lowest density of defect states.

[Insulating Layer 1 Functioning as Protective Insulating Layer]

The insulating layers 114 and 116 function as protective insulating layers for the transistor. In addition, the insulating layers 114 and 116 each have a function of supplying oxygen to the semiconductor layer 108. That is, the insulating layers 114 and 116 contain oxygen. The insulating layer 114 is an insulating layer that allows oxygen to pass therethrough. Note that the insulating layer 114 also functions as a film that relieves damage to the semiconductor layer 108 at the time of forming the insulating layer 116 in a later step.

A silicon oxide film, a silicon oxynitride film, or the like with a thickness greater than or equal to 5 nm and less than or equal to 150 nm, preferably greater than or equal to 5 nm and less than or equal to 50 nm can be used as the insulating layer 114.

In addition, it is preferable that the number of defects in the insulating layer 114 be small and typically, the spin density corresponding to a signal that appears at g=2.001 due to a dangling bond of silicon be lower than or equal to $3\times10^{17}$ spins/cm$^3$ by electron spin resonance (ESR) measurement. This is because if the density of defects in the insulating layer 114 is high, oxygen is bonded to the defects and the property of transmitting oxygen of the insulating layer 114 is lowered.

Note that all oxygen entering the insulating layer 114 from the outside does not move to the outside of the insulating layer 114 and some oxygen remains in the insulating layer 114. Furthermore, movement of oxygen occurs in the insulating layer 114 in some cases in such a manner that oxygen enters the insulating layer 114 and oxygen included in the insulating layer 114 moves to the outside of the insulating layer 114. When an oxide insulating layer that can transmit oxygen is formed as the insulating layer 114, oxygen released from the insulating layer 116 provided over the insulating layer 114 can be moved to the semiconductor layer 108 through the insulating layer 114.

Note that the insulating layer 114 can be formed using an oxide insulating film having a low density of states due to nitrogen oxide. Note that the density of states due to nitrogen oxide can be formed between the energy of the valence band maximum ($E_{v\_os}$) and the energy of the conduction band minimum ($E_{c\_os}$) of the metal oxide layer. A silicon oxynitride film that releases less nitrogen oxide, an aluminum oxynitride film that releases less nitrogen oxide, or the like can be used as the above oxide insulating film.

Note that a silicon oxynitride film that releases less nitrogen oxide is a film which releases ammonia more than nitrogen oxide in thermal desorption spectroscopy (TDS) analysis; the amount of released ammonia is typically greater than or equal to $1\times10^{18}$ molecules/cm$^3$ and less than or equal to $5\times10^{19}$ molecules/cm$^3$. Note that the amount of released ammonia is the amount of ammonia released by heat treatment with which the surface temperature of a film becomes higher than or equal to 50° C. and lower than or equal to 650° C., preferably higher than or equal to 50° C. and lower than or equal to 550° C.

Nitrogen oxide (NO$_x$; x is greater than 0 and less than or equal to 2, preferably greater than or equal to 1 and less than or equal to 2), typically NO$_2$ or NO, forms levels in the insulating layer 114, for example. The level is positioned in the energy gap of the semiconductor layer 108. Therefore, when nitrogen oxide is diffused to the interface between the insulating layer 114 and the semiconductor layer 108, an electron is in some cases trapped by the level on the insulating layer 114 side. As a result, the trapped electron remains in the vicinity of the interface between the insulating layer 114 and the semiconductor layer 108; thus, the threshold voltage of the transistor is shifted in the positive direction.

Nitrogen oxide reacts with ammonia and oxygen in heat treatment. Since nitrogen oxide included in the insulating layer 114 reacts with ammonia included in the insulating layer 116 in heat treatment, nitrogen oxide included in the insulating layer 114 is reduced. Therefore, an electron is hardly trapped at the interface between the insulating layer 114 and the semiconductor layer 108.

By using such an oxide insulating film for the insulating layer 114, the shift in the threshold voltage of the transistor can be reduced, which leads to a smaller change in the electrical characteristics of the transistor.

Note that in an ESR spectrum at 100 K or lower of the insulating layer 114, by heat treatment of a manufacturing process of the transistor, typically heat treatment at a temperature higher than or equal to 300° C. and lower than 350° C., a first signal that appears at a g-factor of greater than or equal to 2.037 and less than or equal to 2.039, a second signal that appears at a g-factor of greater than or equal to 2.001 and less than or equal to 2.003, and a third signal that appears at a g-factor of greater than or equal to 1.964 and less than or equal to 1.966 are observed. The split width of the first and second signals and the split width of the second and third signals that are obtained by ESR measurement using an X-band are each approximately 5 mT. The sum of the spin densities of the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 is lower than $1\times10^{18}$ spins/cm$^3$, typically higher than or equal to $1\times10^{17}$ spins/cm$^3$ and lower than $1\times10^{18}$ spins/cm$^3$.

In the ESR spectrum at 100 K or lower, the sum of the spin densities of the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 corresponds to the sum of the spin densities of signals attributed to nitrogen oxide (NO$_x$; x is greater than 0 and less than or equal to 2, preferably greater than or equal to 1 and less than or equal to 2). Typical examples of nitrogen oxide include nitrogen monoxide and nitrogen dioxide. In other words, the lower the total spin density of the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 is, the lower the content of nitrogen oxide in the oxide insulating film is.

The concentration of nitrogen of the above oxide insulating film measured by SIMS is lower than or equal to $6 \times 10^{20}$ atoms/cm$^3$.

The above oxide insulating film is formed by a PECVD method at a substrate temperature higher than or equal to 220° C. and lower than or equal to 350° C. using silane and dinitrogen monoxide, whereby a dense and hard film can be formed.

The insulating layer 116 is an oxide insulating film which contains oxygen at a higher proportion than the stoichiometric composition. Part of oxygen is released from the above oxide insulating film by heating. The amount of oxygen released from the oxide insulating film in TDS is greater than or equal to $1.0 \times 10^{19}$ atoms/cm$^3$, preferably greater than or equal to $3.0 \times 10^{20}$ atoms/cm$^3$. Note that the amount of released oxygen is the total amount of oxygen released by heat treatment in a temperature range of 50° C. to 650° C. or 50° C. to 550° C. in TDS. In addition, the amount of released oxygen is the total amount of released oxygen converted into oxygen atoms in TDS.

A silicon oxide film, a silicon oxynitride film, or the like with a thickness greater than or equal to 30 nm and less than or equal to 500 nm, preferably greater than or equal to 50 nm and less than or equal to 400 nm can be used as the insulating layer 116.

It is preferable that the number of defects in the insulating layer 116 be small and typically, the spin density corresponding to a signal that appears at g=2.001 due to a dangling bond of silicon be lower than $1.5 \times 10^{18}$ spins/cm$^3$, preferably lower than or equal to $1 \times 10^{18}$ spins/cm$^3$ by ESR measurement. Note that the insulating layer 116 is provided more apart from the semiconductor layer 108 than the insulating layer 114 is; thus, the insulating layer 116 may have higher density of defects than the insulating layer 114.

Furthermore, the insulating layers 114 and 116 can be formed using insulating films formed of the same kinds of materials; thus, a boundary between the insulating layers 114 and 116 cannot be clearly observed in some cases. Thus, in this embodiment, the boundary between the insulating layers 114 and 116 is shown by a dashed line. Although a two-layer structure of the insulating layers 114 and 116 is described in this embodiment, the present invention is not limited to this. For example, a single-layer structure of only the insulating layer 114 or a layered structure of three or more layers may be employed.

[Insulating Layer 2 Functioning as Protective Insulating Layer]

The insulating layer 118 functions as a protective insulating layer for the transistor.

The insulating layer 118 includes one or both of hydrogen and nitrogen. Alternatively, the insulating layer 118 includes nitrogen and silicon. The insulating layer 118 has a function of blocking oxygen, hydrogen, water, alkali metal, alkaline earth metal, or the like. The provision of the insulating layer 118 makes it possible to prevent outward diffusion of oxygen from the semiconductor layer 108, outward diffusion of oxygen included in the insulating layers 114 and 116, and entry of hydrogen, water, or the like into the semiconductor layer 108 from the outside.

A nitride insulating film, for example, can be used as the insulating layer 118. The nitride insulating film is formed using silicon nitride, silicon nitride oxide, aluminum nitride, aluminum nitride oxide, or the like.

Although the variety of films such as the conductive films, the insulating films, the metal oxide film, and the metal film which are described above can be formed by a sputtering method or a PECVD method, such films may be formed by a different method, e.g., a thermal chemical vapor deposition (CVD) method. A metal organic chemical vapor deposition (MOCVD) method and an atomic layer deposition (ALD) method can be given as examples of a thermal CVD method.

A thermal CVD method has an advantage that no defect due to plasma damage is generated since it does not utilize plasma for forming a film. In a thermal CVD method, a source gas is introduced into a chamber, the chamber is set at an atmospheric pressure or a reduced pressure, and a film is deposited on a substrate.

Furthermore, in an ALD method, a source gas is introduced into a chamber, the chamber is set at an atmospheric pressure or a reduced pressure, and a film is deposited on a substrate.

Manufacturing Method Example

A manufacturing method example of a transistor of one embodiment of the present invention will be described below. Here, description will be made using the transistor 100A in the above structure example 2 as an example.

Figure 7A:
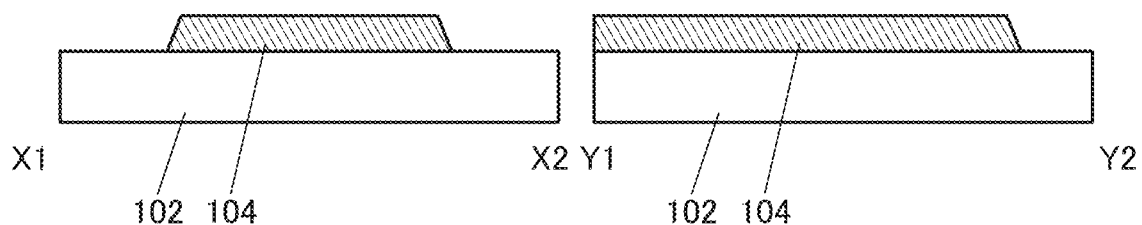
FIGS. 7A to 7C illustrate an example of a method for manufacturing a semiconductor device.

First, a conductive film is formed over the substrate 102 and processed through a lithography process and an etching process, whereby the conductive layer 104 functioning as the first gate electrode is formed (FIG. 7A).

Figure 7B:
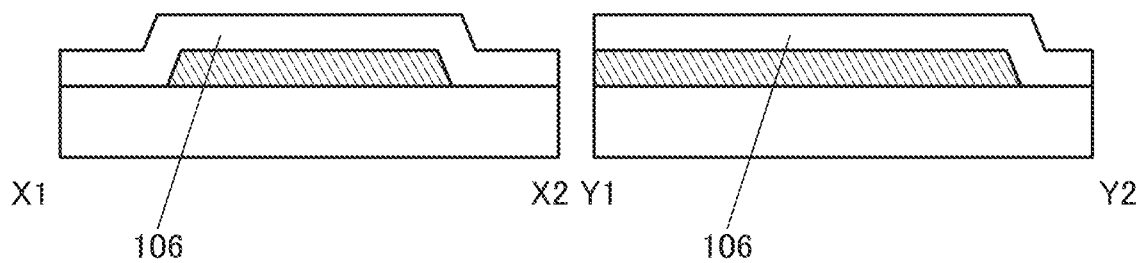

Then, the insulating layer 106 functioning as the first gate insulating layer is formed over the conductive layer 104 (FIG. 7B).

In this embodiment, a glass substrate is used as the substrate 102, and as the conductive layer 104, a 50-nm-thick titanium film and a 200-nm-thick copper film are each formed by a sputtering method. A 400-nm-thick silicon nitride film and a 50-nm-thick silicon oxynitride film as the insulating layer 106 are formed by a PECVD method.

Note that the above-described silicon nitride film has a three-layer structure of a first silicon nitride film, a second silicon nitride film, and a third silicon nitride film. An example of the three-layer structure is as follows.

For example, the first silicon nitride film can be formed to have a thickness of 50 nm under the conditions where silane at a flow rate of 200 sccm, nitrogen at a flow rate of 2000 sccm, and an ammonia gas at a flow rate of 100 sccm are supplied as a source gas to a reaction chamber of a PECVD apparatus, the pressure in the reaction chamber is controlled to 100 Pa, and a power of 2000 W is supplied using a 27.12 MHz high-frequency power source.

The second silicon nitride film can be formed to have a thickness of 300 nm under the conditions where silane at a flow rate of 200 sccm, nitrogen at a flow rate of 2000 sccm, and an ammonia gas at a flow rate of 2000 sccm are supplied as a source gas to the reaction chamber of the PECVD apparatus, the pressure in the reaction chamber is controlled to 100 Pa, and a power of 2000 W is supplied using a 27.12 MHz high-frequency power source.

The third silicon nitride film can be formed to have a thickness of 50 nm under the conditions where silane at a flow rate of 200 sccm and nitrogen at a flow rate of 5000 sccm are supplied as a source gas to the reaction chamber of the PECVD apparatus, the pressure in the reaction chamber is controlled to 100 Pa, and a power of 2000 W is supplied using a 27.12 MHz high-frequency power source.

Note that the first silicon nitride film, the second silicon nitride film, and the third silicon nitride film can each be formed at a substrate temperature of lower than or equal to 350° C.

The silicon nitride film with the above-described three-layer structure brings about the following effect, for example, in the case where a conductive film including copper is used as the conductive layer 104.

The first silicon nitride film can inhibit diffusion of copper from the conductive layer 104. The second silicon nitride film has a function of releasing hydrogen and can improve withstand voltage of the insulating film functioning as a gate insulating layer. The third silicon nitride film releases a small amount of hydrogen and can inhibit diffusion of hydrogen released from the second silicon nitride film.

Figure 7C:
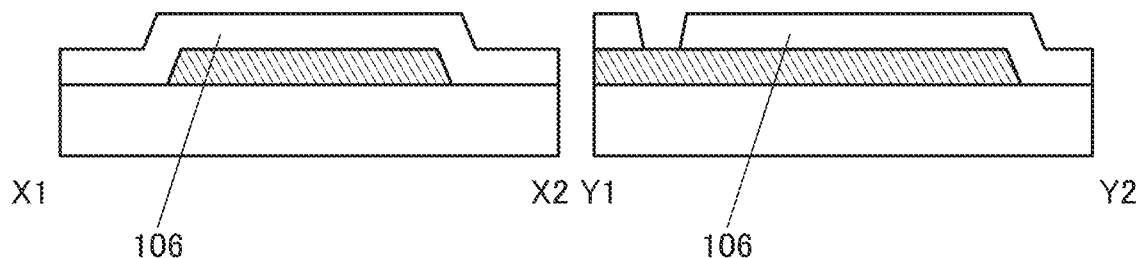

Then, the insulating layer 106 is processed by a lithography process and an etching process to form an opening reaching the conductive layer 104 (FIG. 7C). Note that the step of forming the opening in the insulating layer 106 may be performed after formation of the semiconductor layer 108.

Figure 8A:
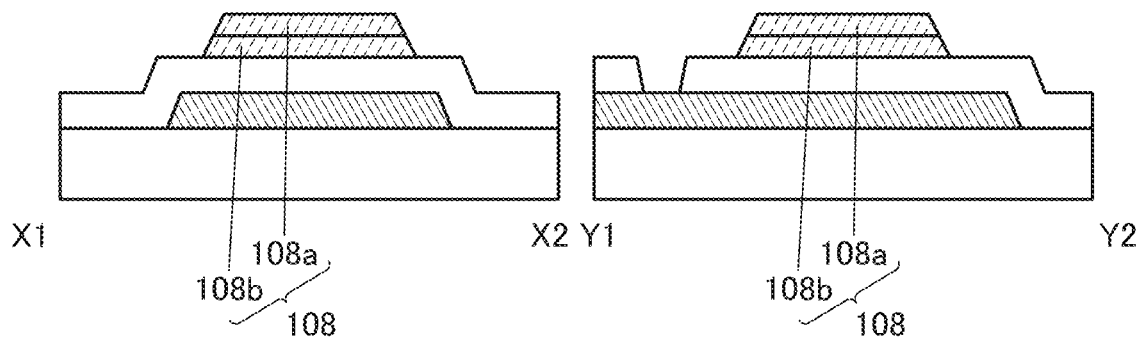
FIGS. 8A to 8C illustrate an example of a method for manufacturing a semiconductor device.

After that, semiconductor films are formed over the insulating layer 106 and are processed by a lithography process and an etching process, so that the semiconductor layer 108b and the semiconductor layer 108a are formed (FIG. 8A).

In this embodiment, metal oxide films are formed by a sputtering method as the semiconductor films to be the semiconductor layer 108b and the semiconductor layer 108a.

When the metal oxide film is formed, firstly, plasma discharge may be performed in an atmosphere containing an oxygen gas. At that time, oxygen is added to the insulating layer 106 over which the metal oxide film is to be formed. In the formation of the metal oxide film, an inert gas (e.g., a helium gas, an argon gas, or a xenon gas) may be mixed in addition to an oxygen gas. Here, the proportion of the oxygen gas in the whole gas is higher than 0% and lower than or equal to 100%, preferably higher than or equal to 10% and lower than or equal to 100%, further preferably higher than or equal to 30% and lower than or equal to 100%.

As a gas used to form the metal oxide film, at least one of an inert gas (typically, argon) and an oxygen gas is used. The proportion of the oxygen gas in the whole deposition gas for forming the metal oxide film is optimized in accordance with the purpose and set to be higher than 0% and lower than or equal to 100%, preferably higher than or equal to 10% and lower than or equal to 100%.

For example, one of an argon gas and an oxygen gas is used to form the metal oxide film to be the semiconductor layer 108b. The proportion of the flow rate of the oxygen gas to the flow rate of the whole gas (the proportion is also referred to as an oxygen flow rate ratio) at the time of forming the metal oxide film is higher than or equal to 0% and lower than or equal to 30%, preferably higher than or equal to 5% and lower than or equal to 15%. With the oxygen flow rate ratio in the above range, the semiconductor layer 108b can have low crystallinity. Furthermore, the oxygen flow rate ratio in the above range enables the material composition of the semiconductor layer 108b to be a CAC-OS described later.

The substrate temperature at the time of forming the metal oxide film to be the semiconductor layer 108b is set higher than or equal to room temperature (25° C.) and lower than or equal to 200° C., preferably higher than or equal to room temperature and lower than or equal to 130° C. The substrate temperature in the above range can prevent bending or warpage of the substrate in the case where the substrate is a large glass substrate.

For example, one of an argon gas and an oxygen gas is used to form the metal oxide film to be the semiconductor layer 108a. The oxygen flow rate ratio at the time of forming the metal oxide film is higher than 30% and lower than or equal to 100%, preferably higher than or equal to 50% and lower than or equal to 100%, further preferably higher than or equal to 70% and lower than or equal to 100%. With the oxygen flow rate ratio in the above range, the semiconductor layer 108a can have high crystallinity.

When the compositions of the metal oxide film to be the semiconductor layer 108a and the metal oxide film to be the semiconductor layer 108b are substantially the same, they can be formed using the same sputtering target and the manufacturing cost can be thus reduced. When the same sputtering target is used, the two metal oxide films can be formed successively in the same deposition apparatus in a vacuum. This can suppress entry of impurities into the interface between the semiconductor layer 108a and the semiconductor layer 108b. When heat treatment is performed after formation of the metal oxide film to be the lower semiconductor layer 108b, impurities at the interface between the semiconductor layer 108a and the semiconductor layer 108b can be further reduced.

The thickness of the semiconductor layer 108b is, for example, greater than or equal to 1 nm and less than or equal to 25 nm, preferably greater than or equal to 5 nm and less than or equal to 20 nm. The thickness of the semiconductor layer 108a is, for example, greater than or equal to 20 nm and less than or equal to 100 nm, preferably greater than or equal to 20 nm and less than or equal to 50 nm.

In this manner, the metal oxide film to be the semiconductor layer 108a is preferably formed with an oxygen flow rate ratio higher than that in formation of the metal oxide film to be the semiconductor layer 108b. In other words, the lower metal oxide film is preferably formed with an oxygen partial pressure lower than that in formation of the upper metal oxide film.

In addition, increasing the purity of a sputtering gas is necessary. For example, as an oxygen gas or an argon gas used as a sputtering gas, a gas which is highly purified to have a dew point of −40° C. or lower, preferably −80° C. or lower, further preferably −100° C. or lower, still further preferably −120° C. or lower is used, whereby entry of moisture or the like into the metal oxide film can be minimized.

In the case where the metal oxide film is deposited by a sputtering method, a chamber in a sputtering apparatus is preferably evacuated to be a high vacuum state (to the degree of about $5\times10^{-7}$ Pa to $1\times10^{-4}$ Pa) with an adsorption vacuum evacuation pump such as a cryopump in order to remove water or the like, which serves as an impurity for the metal oxide film, as much as possible. In particular, the partial pressure of gas molecules corresponding to $H_2O$ (gas molecules corresponding to m/z=18) in the chamber in the standby mode of the sputtering apparatus is preferably lower than or equal to $1\times10^{-4}$ Pa, further preferably lower than or equal to $5\times10^{-5}$ Pa.

In this embodiment, the metal oxide film to be the semiconductor layer 108b is formed by a sputtering method using an In—Ga—Zn oxide target (In:Ga:Zn=4:2:4.1 in an atomic ratio). The substrate temperature during the formation of the metal oxide film is room temperature, and an argon gas at a flow rate of 180 sccm and an oxygen gas at a flow rate of 20 sccm is used as a deposition gas (percentage of oxygen flow rate: 10%).

The metal oxide film to be the semiconductor layer 108a is formed by a sputtering method using an In—Ga—Zn oxide target (In:Ga:Zn=4:2:4.1 in an atomic ratio). The substrate temperature during the formation of the metal oxide film is room temperature, and an oxygen gas at a flow rate of 200 sccm is used as a deposition gas (percentage of oxygen flow rate: 100%).

Next, the two metal oxide films are processed into desired shapes, so that the island-shaped semiconductor layer 108b and the island-shaped semiconductor layer 108a are formed. In this embodiment, the semiconductor layer 108b and the semiconductor layer 108a constitute the island-shaped semiconductor layer 108 (see FIG. 8A).

Heat treatment (hereinafter referred to as first heat treatment) is preferably performed after the semiconductor layer 108 is formed. By the first heat treatment, water, hydrogen, or the like contained in the semiconductor layer 108 can be reduced. The heat treatment for the purpose of reducing hydrogen, water, and the like may be performed before the metal oxide films are processed into island shapes. Note that the first heat treatment is one kind of treatment for increasing the purity of the semiconductor layer 108.

The first heat treatment can be performed at a temperature of, for example, higher than or equal to 150° C. and lower than the strain point of the substrate, preferably higher than or equal to 200° C. and lower than or equal to 450° C., further preferably higher than or equal to 250° C. and lower than or equal to 350° C.

Moreover, an electric furnace, an RTA apparatus, or the like can be used for the first heat treatment. With the use of an RTA apparatus, the heat treatment can be performed at a temperature higher than or equal to the strain point of the substrate if the heating time is short. Therefore, the heat treatment time can be shortened. The first heat treatment may be performed in an atmosphere of nitrogen, oxygen, ultra-dry air (air with a water content of less than or equal to 20 ppm, preferably less than or equal to 1 ppm, further preferably less than or equal to 10 ppb), or a rare gas (e.g., argon, helium). It is preferable that hydrogen, water, and the like not be contained in the nitrogen, oxygen, ultra-dry air, or rare gas. Furthermore, after heat treatment is performed in a nitrogen atmosphere or a rare gas atmosphere, heat treatment may be additionally performed in an oxygen atmosphere or an ultra-dry air atmosphere. As a result, hydrogen, water, and the like can be released from the metal oxide film and oxygen can be supplied to the metal oxide film at the same time. Consequently, the number of oxygen vacancies in the metal oxide film can be reduced.

Figure 8B:
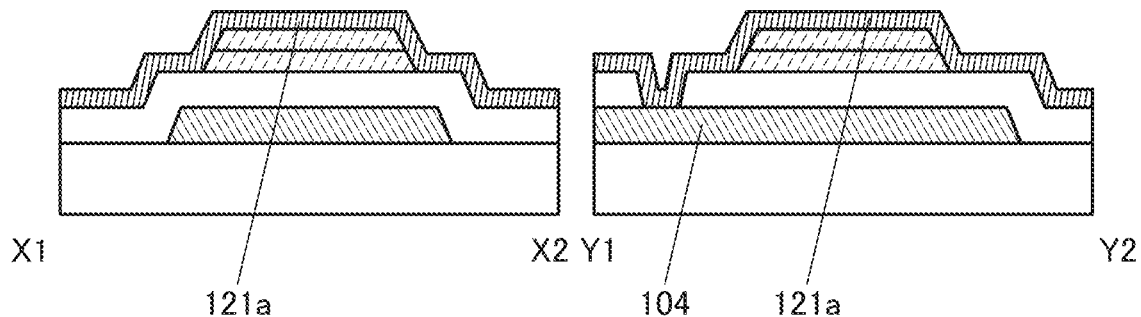

Next, a conductive film 121a is formed over the insulating layer 106 and the semiconductor layer 108 (FIG. 8B).

In this embodiment, a 30-nm-thick tungsten film or a 50-nm-thick titanium film is formed by a sputtering method as the conductive film 121a.

Figure 8C:
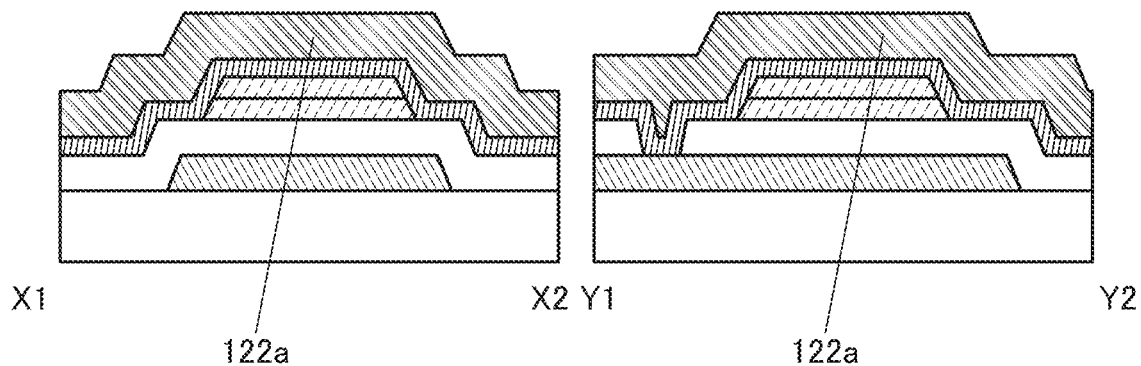

Subsequently, a conductive film 122a is formed over the conductive film 121a (FIG. 8C).

In this embodiment, a 200-nm-thick copper film is formed by a sputtering method as the conductive film 122a.

Then, a first layer 113a_1 is formed on a top surface of the conductive film 122a.

Figure 9A:
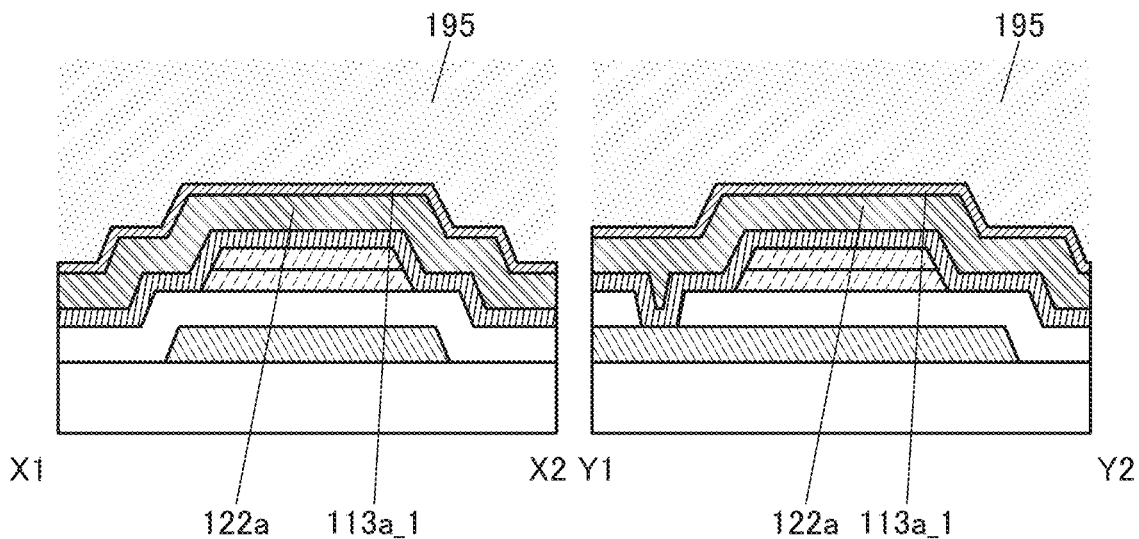
FIGS. 9A to 9C illustrate an example of a method for manufacturing a semiconductor device.

FIG. 9A is a schematic cross-sectional view of the inside of a plasma treatment apparatus used for the treatment to be described below. Plasma 195 generated inside the plasma treatment apparatus, which is a PECVD apparatus here, is schematically illustrated.

As pretreatment, a film containing an oxide and formed on a surface of the conductive film 122a (e.g., a native oxide film) is preferably removed to expose a metal surface of the conductive film 122a. Here, the pretreatment, silicification treatment to be described later, and plasma treatment to be described later are preferably performed in succession using one apparatus without exposure of the substrate 102 to the air.

Copper exposed on the top surface of the conductive film 122a readily forms an oxide film on its surface. For this reason, as pretreatment before silicification of the copper, the oxide film that covers the surface of the copper is removed by plasma discharge in an atmosphere containing a reducing gas (e.g., a hydrogen gas or an ammonia gas). At that time, the oxide film that covers the copper surface is reduced and the copper is exposed on the top surface of the conductive film 122a.

The reduction for removing the oxide film is not necessarily performed by the plasma treatment but may be performed by a different reducing method. For example, the reduction may be performed by exposing the surface of the copper to an atmosphere containing a reducing gas (e.g., a hydrogen gas or an ammonia gas) and performing heat treatment. The substrate temperature during the above plasma treatment and heat treatment is preferably higher than or equal to 300° C., further preferably higher than or equal to 350° C. The substrate temperature during the removal of the oxide film covering the copper surface is 350° C. in this embodiment.

Next, the surface of the conductive film 122a is exposed to an atmosphere containing a silane gas to cause a reaction between the copper and the silane gas, whereby the first layer 113a_1 is formed. Heating the substrate at this time sometimes forms copper silicide containing copper and silicon on the top surface of the conductive film 122a. Specifically, part of the conductive film 122a on its top surface side is silicified to be the first layer 113a_1 in some cases. The substrate temperature during the formation of copper silicide is preferably higher than or equal to 200° C. and lower than or equal to 400° C., further preferably higher than or equal to 220° C. and lower than or equal to 350° C. In this embodiment, the substrate temperature during the formation of copper silicide is 220° C. and the substrate 102 is exposed to a mixed atmosphere of a silane gas and a nitrogen gas.

The gas used in the formation of copper silicide contains at least silicon; a gas containing silicon accounts for greater than 0% and less than or equal to 100%, preferably greater than or equal to 0.1% and less than or equal to 50%, further preferably greater than or equal to 1% and less than or equal to 30% of the whole gas used in the formation of copper silicide.

Examples of the gas containing silicon include silane, disilane, trisilane, and silane fluoride. Silane is particularly preferable because it is a gas suitably used in manufacturing processes of semiconductor devices and is thus relatively inexpensive and safe.

The higher the percentage of a silane gas flow rate, the higher the reactivity, shortening the treatment time. The lower the percentage of a silane gas flow rate, the higher the controllability. The percentage of a silane gas flow rate is preferably low because too high a percentage of a silane gas flow rate causes a problem such as too large a thickness of the first layer 113a_1 or reduced planarity of a surface of the first layer 113a_1.

A higher treatment temperature tends to increase the reaction rate in silicification; thus, the percentage of a silane gas flow rate is preferably set in consideration of the treatment temperature. For example, when a mixed gas of a silane gas and a nitrogen gas is used and the treatment temperature (substrate temperature) is 350° C., the percentage of a silane gas flow rate can be higher than or equal to 0.1% and lower than or equal to 30%, preferably higher than or equal to 0.5% and lower than or equal to 20%, further preferably higher than or equal to 1% and lower than or equal to 10%.

Next, after the silicification, the plasma 195 is discharged in an atmosphere of a gas containing nitrogen, whereby the first layer 113a_1 containing copper, silicon, and nitrogen is formed. For example, following the completion of the silicification, the atmosphere is switched to a gas not containing a silane gas but containing a nitrogen gas, and the plasma 195 is discharged after the concentration of the silane gas in the apparatus falls below a certain level.

Note that the plasma treatment is not necessarily employed but a different method may be employed to make the first layer 113a_1 contain nitrogen. For example, the first layer 113a_1 containing copper, silicon, and nitrogen may be formed by exposing the substrate to an atmosphere of a gas containing silicon and nitrogen and by performing heat treatment.

Figure 9B:
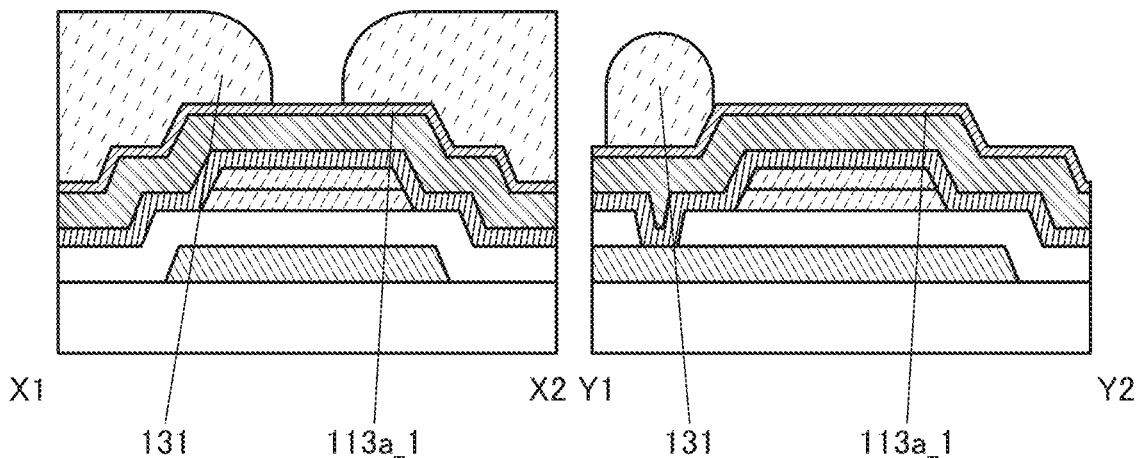

Then, a resist mask 131 is formed over the first layer 113a_1 by lithography or the like (FIG. 9B).

Figure 9C:
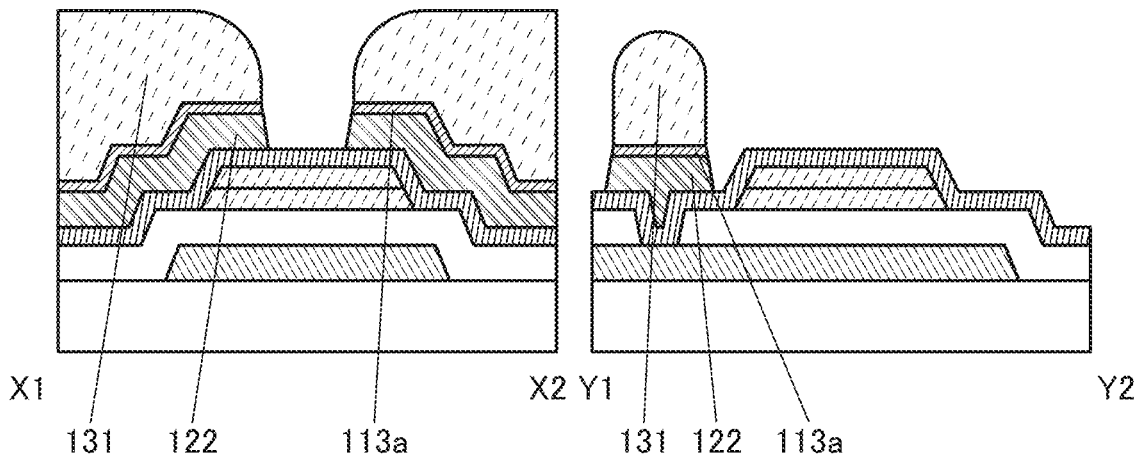

After that, part of each of the first layer 113a_1 and the conductive film 122a that is not covered with the resist mask 131 is etched. The etching of the first layer 113a1 forms the first layer 113a. The etching of the conductive film 122a forms the conductive layer 122 whose side surface is exposed (FIG. 9C).

The first layer 113a_1 and the conductive film 122a contain the same metal element and thus can be etched by the same step. For example, the first layer 113a_1 and the conductive film 122a can be etched by a wet etching method at the same time.

In the case where the conductive film 122a is formed using copper and the first layer 113a_1 and the conductive film 122a are etched by a wet etching method, silicon contained in the first layer 113a_1 sometimes aggregates without being etched and becomes a residue. In that case, the residue is preferably removed by a wet etching method, a dry etching method, or the like. It is possible to employ a method by which the conductive film 121a is not etched or a method by which an upper portion of the conductive film 121a is partly removed at the same time as the residue in such a way as not to remove the conductive film 121a completely.

Alternatively, the first layer 113a_1 may be etched by a dry etching method and the conductive film 122a may be etched by a wet etching method.

Figure 10A:
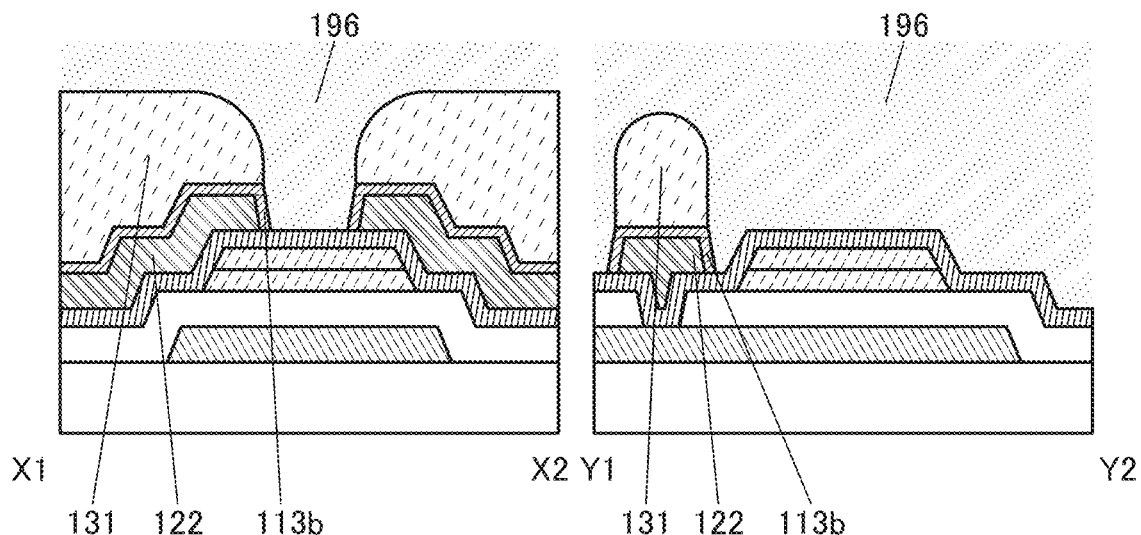
FIGS. 10A to 10C illustrate an example of a method for manufacturing a semiconductor device.

Next, the exposed side surface of the conductive layer 122 is exposed to an atmosphere containing a silane gas to cause a reaction between the copper and the silane gas, whereby the second layer 113b containing copper and silicon is formed (FIG. 10A). Heating the substrate at this time sometimes forms copper silicide containing copper and silicon on the side surface of the conductive layer 122. Plasma 196 generated inside a plasma treatment apparatus, which is a PECVD apparatus here, is schematically illustrated.

The method for forming the first layer 113a_1 can be referred to for the method for forming the second layer 113b. For example, pretreatment for removing the oxide film on the side surface of the conductive layer 122 is performed and the side surface of the conductive layer 122 is exposed to a gas containing silicon; thus, the second layer 113b that contains a metal element contained in the conductive layer 122 (here, copper) and silicon can be formed. Then, treatment for making the second layer 113b contain nitrogen is preferably performed to form the second layer 113b containing silicon, the metal element, and nitrogen.

Since the second layer 113b is formed by silicification of the side surface of the conductive layer 122 here, the reaction area is much smaller than that in the above-described step of forming the first layer 113a_1 where the top surface of the conductive film 122a is silicified. Therefore, the treatment is preferably performed under such conditions that silicification is more facilitated than that in the formation of the first layer 113a. For example, the treatment temperature or the percentage of a silane gas flow rate can be set higher. Alternatively, the treatment time can be set longer than that for the formation of the first layer 113a. In this embodiment, when a mixed gas of a silane gas and a nitrogen gas is used and the treatment temperature is 350° C., the percentage of a silane gas flow rate is 3% in the treatment.

Next, part of the conductive film 121a that is not covered with the resist mask 131 is etched to form the conductive layer 121. In this manner, the electrode 112a and the electrode 112b can be formed (FIG. 10B).

A wet etching method is suitable for the etching of the conductive film 121a, although a dry etching method may also be used.

After the electrode 112a and the electrode 112b are formed, a surface (on the back channel side) of the semiconductor layer 108 (specifically, the semiconductor layer 108a) may be cleaned. The cleaning may be performed, for example, using a chemical solution such as a phosphoric acid. The cleaning using a chemical solution such as a phosphoric acid can remove impurities (e.g., an element included in the electrode 112a and the electrode 112b) attached to a surface of the semiconductor layer 108a. Note that the cleaning is not necessarily performed; in some cases, the cleaning is not performed.

Figure 10B:
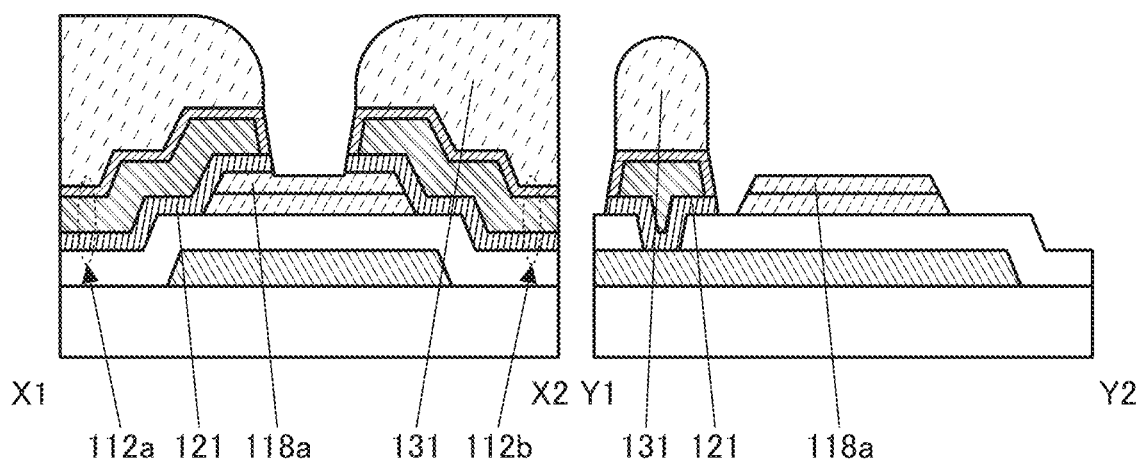

In the step of etching the conductive film 121a or the step of cleaning the surface of the semiconductor layer 108, part of the semiconductor layer 108 (here, the semiconductor layer 108a) is sometimes etched to be thinner as illustrated in FIG. 10B and other drawings.

After that, the resist mask 131 is removed.

Figure 10C:
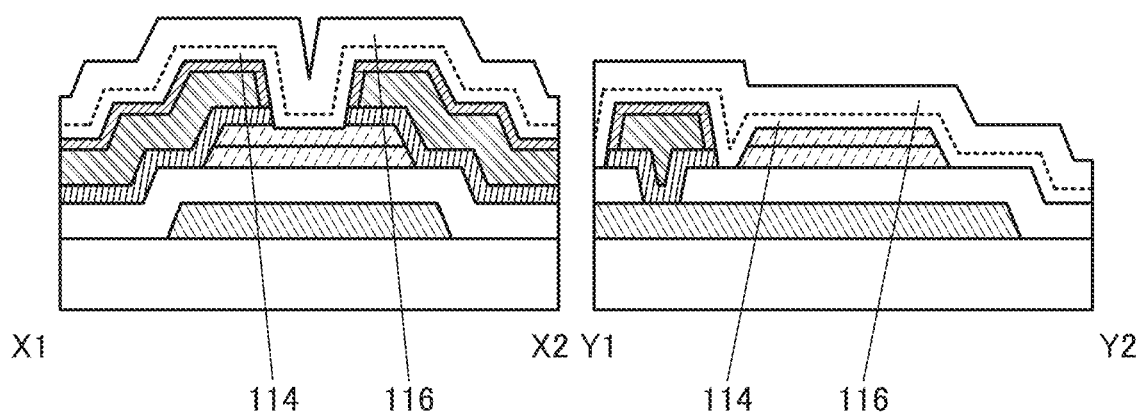

Next, the insulating layer 114 and the insulating layer 116 are formed over the semiconductor layer 108, the electrode 112a, and the electrode 112b (see FIG. 10C).

Here, after the insulating layer 114 is formed, the insulating layer 116 is preferably formed successively without exposure to the air. When the insulating layer 116 is formed successively after the formation of the insulating layer 114 without exposure of the apparatus to the air while the flow rate of a source gas, pressure, a high-frequency power, a substrate temperature, and the like are adjusted, the concentration of impurities attributed to the atmospheric component at the interface between the insulating layer 114 and the insulating layer 116 can be reduced and oxygen in the insulating layers 114 and 116 can be moved to the semiconductor layer 108; accordingly, the amount of oxygen vacancies in the semiconductor layer 108 can be reduced.

For example, as the insulating layer 114, a silicon oxynitride film can be formed by a PECVD method. In that case, a deposition gas containing silicon and an oxidizing gas are preferably used as a source gas. Typical examples of the deposition gas containing silicon include silane, disilane, trisilane, and silane fluoride. Examples of the oxidizing gas include dinitrogen monoxide and nitrogen dioxide. An insulating film containing nitrogen and having a small number of defects can be formed as the insulating layer 114 by a PECVD method under the conditions where the flow rate of the oxidizing gas is higher than 20 times and lower than 100 times, preferably higher than or equal to 40 times and lower than or equal to 80 times, that of the deposition gas; and the pressure in a treatment chamber is lower than 100 Pa, preferably lower than or equal to 50 Pa.

In this embodiment, a silicon oxynitride film is formed as the insulating layer 114 by a PECVD method under the conditions where the substrate 102 is held at a temperature of 220° C., silane at a flow rate of 50 sccm and dinitrogen monoxide at a flow rate of 2000 sccm are used as a source gas, the pressure in the treatment chamber is 20 Pa, and a high-frequency power of 100 W at 13.56 MHz ($1.6 \times 10^{-2}$ $W/cm^2$ as the power density) is supplied to a parallel-plate electrode.

As the insulating layer 116, a silicon oxide film or a silicon oxynitride film is formed under the following conditions: the substrate placed in the treatment chamber of the PECVD apparatus that is vacuum-evacuated is held at a temperature of higher than or equal to 180° C. and lower than or equal to 350° C., the pressure in the treatment chamber is higher than or equal to 100 Pa and lower than or equal to 250 Pa, preferably higher than or equal to 100 Pa and lower than or equal to 200 Pa, with introduction of a source gas into the treatment chamber, and a high-frequency power of greater than or equal to 0.17 $W/cm^2$ and less than or equal to 0.5 $W/cm^2$, preferably greater than or equal to 0.25 $W/cm^2$ and less than or equal to 0.35 $W/cm^2$ is supplied to an electrode provided in the treatment chamber.

As the deposition conditions of the insulating layer 116, the high-frequency power having the above power density is supplied to the reaction chamber having the above pressure, whereby the degradation efficiency of the source gas in plasma is increased, oxygen radicals are increased, and oxidation of the source gas is promoted; thus, the oxygen content in the insulating layer 116 becomes higher than that in the stoichiometric composition. In the film formed at a substrate temperature within the above temperature range, the bond between silicon and oxygen is weak, and accordingly, part of oxygen in the film is released by heat treatment in a later step. Thus, it is possible to form an oxide insulating film which contains more oxygen than that in the stoichiometric composition and from which part of oxygen is released by heating.

Note that the insulating layer 114 functions as a protective film for the semiconductor layer 108 in the step of forming the insulating layer 116. Therefore, the insulating layer 116 can be formed using the high-frequency power having a high power density while damage to the semiconductor layer 108 is reduced.

Note that in the deposition conditions of the insulating layer 116, when the flow rate of the deposition gas containing silicon with respect to the oxidizing gas is increased, the amount of defects in the insulating layer 116 can be reduced. Typically, it is possible to form an oxide insulating film in which the amount of defects is small, i.e., the spin density of a signal which appears at g=2.001 due to a dangling bond of silicon, is lower than $6 \times 10^{17}$ $spins/cm^3$, preferably lower than or equal to $3 \times 10^{17}$ $spins/cm^3$, further preferably lower than or equal to $1.5 \times 10^{17}$ $spins/cm^3$ by ESR measurement. As a result, the reliability of the transistor can be improved.

Heat treatment (hereinafter referred to as second heat treatment) is preferably performed after the insulating layers 114 and 116 are formed. The second heat treatment can reduce nitrogen oxide included in the insulating layers 114 and 116. By the second heat treatment, part of oxygen contained in the insulating layers 114 and 116 can be transferred to the semiconductor layer 108, so that the amount of oxygen vacancies included in the semiconductor layer 108 can be reduced.

The temperature of the second heat treatment is typically lower than 400° C., preferably lower than 375° C., further preferably higher than or equal to 150° C. and lower than or equal to 350° C. The second heat treatment may be performed in an atmosphere of nitrogen, oxygen, ultra-dry air (air with a water content of less than or equal to 20 ppm, preferably less than or equal to 1 ppm, further preferably less than or equal to 10 ppb), or a rare gas (e.g., argon, helium). It is preferable that hydrogen, water, and the like not be contained in the nitrogen, oxygen, ultra-dry air, or rare gas. An electric furnace, an RTA apparatus, or the like can be used for the heat treatment.

Figure 11A:
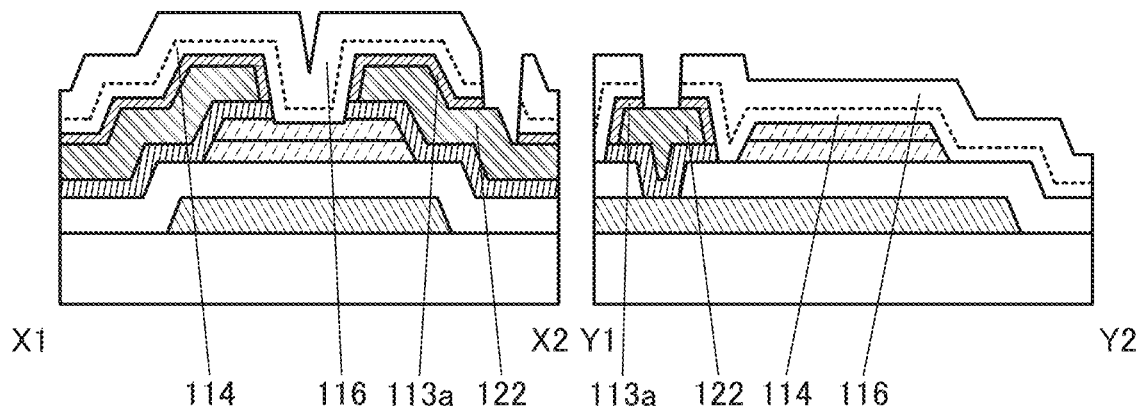
FIGS. 11A to 11C illustrate an example of a method for manufacturing a semiconductor device.

Next, a mask is formed over the insulating layer 116 through a lithography process, and openings are formed in desired regions of the insulating layers 114 and 116 (FIG. 11A). Note that the openings can be formed to reach the electrode 112a, the electrode 112b, and the like. The openings reaching the conductive layer 122 are formed in the example described here. In the case where the first layer 113a is sufficiently conductive, the first layer 113a may be left in the opening portion.

Figure 11B:
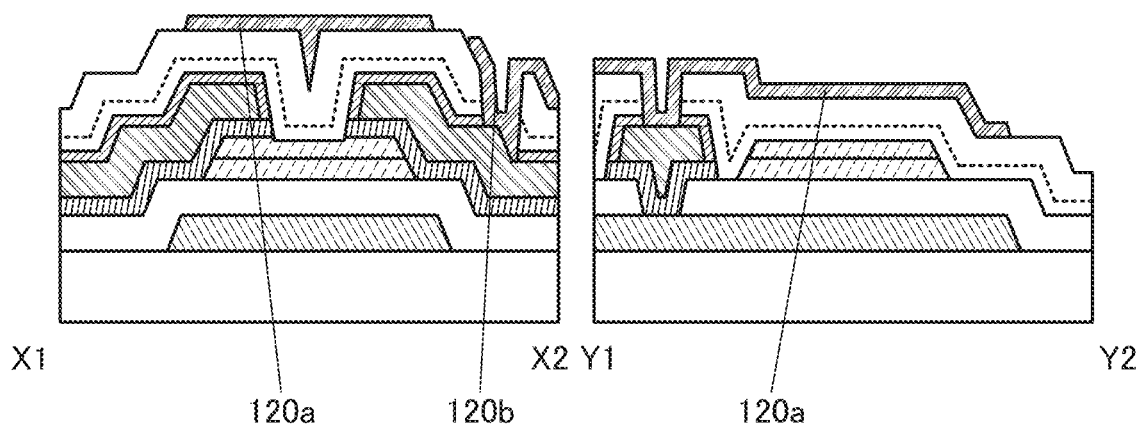

Then, a conductive film is formed over the insulating layer 116 to cover the openings and is processed by a lithography process and an etching process, whereby the conductive layer 120a, the conductive layer 120b, and the like are formed (FIG. 11B). The conductive layer 120a serves as a second gate electrode.

Here, oxygen can be added to the insulating layer 116 by performing plasma treatment in an atmosphere containing an oxygen gas before the formation of the conductive film. Alternatively, when the conductive film is formed using a metal oxide by a sputtering method in an atmosphere containing an oxygen gas, oxygen can be added to the insulating layer 116 at the time of the formation of the conductive film.

A gas in which an oxygen gas and a rare gas (e.g., a helium gas, an argon gas, or a xenon gas) and/or a nitrogen gas are mixed may be used. At that time, the percentage of an oxygen gas flow rate is preferably high. When the flow rate of the oxygen gas is set higher, oxygen can be favorably added to the insulating layer 116. As an example of the formation conditions of the conductive film, the proportion of the oxygen gas in the whole gas is higher than or equal to 50% and lower than or equal to 100%, preferably higher than or equal to 80% and lower than or equal to 100%.

The conductive film is formed at a substrate temperature of higher than or equal to room temperature and lower than 340° C., preferably higher than or equal to room temperature and lower than or equal to 300° C., more preferably higher than or equal to 100° C. and lower than or equal to 250° C., more preferably higher than or equal to 100° C. and lower than or equal to 200° C. The conductive film is formed while being heated, so that the crystallinity of the conductive film can be increased. On the other hand, in the case where a large-sized glass substrate (e.g., the 6th generation to the 10th generation) is used as the substrate 102 and the conductive film is formed at a substrate temperature of higher than or equal to 150° C. and lower than 340° C., the substrate 102 might be changed in shape (distorted or warped). Therefore, in the case where a large-sized glass substrate is used, the change in the shape of the glass substrate can be suppressed by forming the conductive film at a substrate temperature of higher than or equal to 100° C. and lower than 150° C.

In this embodiment, the conductive film is formed by a sputtering method using an In—Ga—Zn metal oxide target (In:Ga:Zn=4:2:4.1 in an atomic ratio). The substrate temperature when the conductive film is formed is set to 170° C. As the deposition gas for forming the conductive film, an oxygen gas at a flow rate of 100 sccm is used.

As the conductive film, the above-described metal oxide film (with an atomic ratio of In:Ga:Zn=1:1:1, In:Ga:Zn=1:3:2, In:Ga:Zn=1:3:4, In:Ga:Zn=1:3:6, In:Ga:Zn=3:1:2, In:Ga:Zn=4:2:3, or In:Ga:Zn=5:1:6, for example) can be used.

Although oxygen is added to the insulating layer 116 when the conductive film is formed in this embodiment, the method for adding oxygen is not limited to this example. For example, oxygen may be further added to the insulating layer 116 at the time of or after the formation of the conductive film to be the conductive layer 120*a* and the conductive layer 120*b* or after the formation of the conductive layer 120*a* and the conductive layer 120*b*.

As a method for adding oxygen to the insulating layer 116, a 5-nm-thick film of an oxide including indium, tin, and silicon (also referred to as ITSO) is formed as an oxide conductive film with the use of an ITSO target (In$_2$O$_3$:SnO$_2$:SiO$_2$=85:10:5 in wt %), for example.

In that case, the thickness of the oxide conductive film is preferably greater than or equal to 1 nm and less than or equal to 20 nm or greater than or equal to 2 nm and less than or equal to 10 nm, in which case oxygen is favorably transmitted and release of oxygen can be inhibited. Then, oxygen is added to the insulating layer 116 through the oxide conductive film. Oxygen can be added by, for example, ion doping, ion implantation, or plasma treatment. By application of a bias voltage to the substrate side when oxygen is added, oxygen can be effectively added to the insulating layer 116. An ashing apparatus is used, for example, and the power density of the bias voltage applied to the substrate side of the ashing apparatus can be greater than or equal to 1 W/cm$^2$ and less than or equal to 5 W/cm$^2$. The substrate temperature during addition of oxygen is higher than or equal to room temperature and lower than or equal to 300° C., preferably higher than or equal to 100° C. and lower than or equal to 250° C., whereby oxygen can be added efficiently to the insulating layer 116.

Figure 11C:
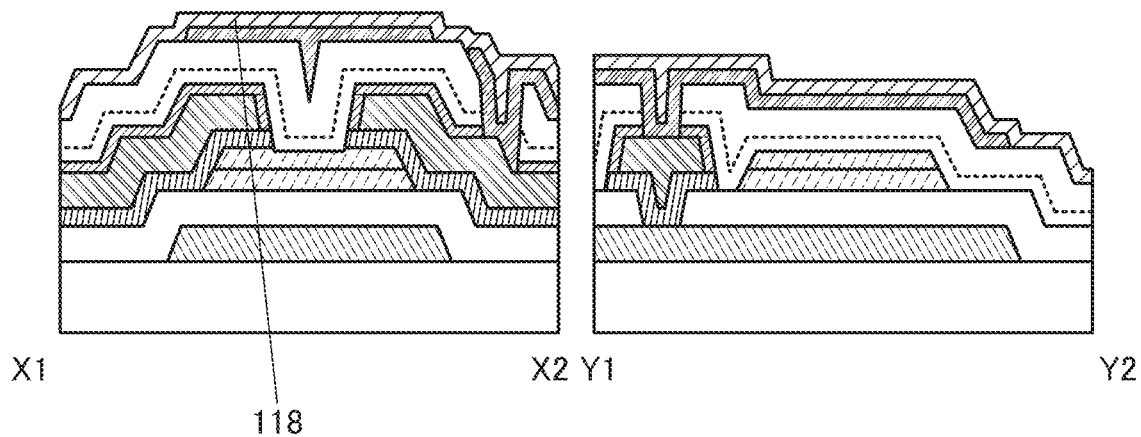

Next, the insulating layer 118 is formed over the insulating layer 116 and the conductive layers 120*a* and 120*b* (FIG. 11C).

The insulating layer 118 includes either or both of hydrogen and nitrogen. As the insulating layer 118, a silicon nitride film is preferably used, for example. The insulating layer 118 can be formed by a sputtering method or a PECVD method, for example. In the case where the insulating layer 118 is formed by a PECVD method, for example, the substrate temperature is lower than 400° C., preferably lower than 375° C., and further preferably higher than or equal to 180° C. and lower than or equal to 350° C. The substrate temperature at which the insulating layer 118 is formed is preferably within the above range because a dense film can be formed. Furthermore, when the substrate temperature at which the insulating layer 118 is formed is within the above range, oxygen or excess oxygen in the insulating layers 114 and 116 can be moved to the semiconductor layer 108.

After the insulating layer 118 is formed, heat treatment similar to the first heat treatment or the second heat treatment (hereinafter referred to as third heat treatment) may be performed. Through such heat treatment at lower than 400° C., preferably lower than 375° C., further preferably higher than or equal to 180° C. and lower than or equal to 350° C. after the addition of oxygen to the insulating layer 116 when the insulating layer 118 is formed, oxygen or excess oxygen in the insulating layer 116 can be moved to the semiconductor layer 108 (particularly, the semiconductor layer 108*b*) and compensate oxygen vacancies in the semiconductor layer 108.

The insulating layer 118 includes either or both of hydrogen and nitrogen. Thus, one of or both hydrogen and nitrogen is/are added to the conductive layers 120*a* and 120*b* in contact with the formed insulating layer 118, so that the conductive layers 120*a* and 120*b* have a high carrier density and can function as oxide conductive films.

In the case where a silicon nitride film is formed by a PECVD method as the insulating layer 118, a deposition gas containing silicon, nitrogen, and ammonia are preferably used as a source gas. A small amount of ammonia compared with the amount of nitrogen is used, whereby ammonia is dissociated in the plasma and activated species are generated. The activated species cleave a bond between silicon and hydrogen which are included in a deposition gas including silicon and a triple bond between nitrogen molecules. As a result, a dense silicon nitride film having few defects, in which bonds between silicon and nitrogen are promoted and bonds between silicon and hydrogen are few, can be formed. If the amount of ammonia with respect to nitrogen is large, decomposition of a deposition gas including silicon and decomposition of nitrogen are not promoted, so that a sparse silicon nitride film in which bonds between silicon and hydrogen remain and defects are increased is formed. Therefore, in the source gas, the flow rate of nitrogen is set to be preferably 5 times or more and 50 times or less, further preferably 10 times or more and 50 times or less the flow rate of ammonia.

In this embodiment, with the use of a PECVD apparatus, a 100-nm-thick silicon nitride film is formed as the insulating layer 118 using silane, nitrogen, and ammonia as a source gas. The flow rate of silane is 50 sccm, the flow rate of nitrogen is 5000 sccm, and the flow rate of ammonia is 100 sccm. The pressure in the treatment chamber is 100 Pa, the substrate temperature is 350° C., and a high-frequency power of 1000 W is supplied to a parallel-plate electrode with a 27.12 MHz high-frequency power source. The PECVD apparatus is a parallel-plate PECVD apparatus in which the electrode area is 6000 cm$^2$, and the power per unit area (power density) into which the supplied power is converted is $1.7 \times 10^{-1}$ W/cm$^2$.

Through the above process, the transistor 100A illustrated in FIGS. 3A to 3C can be manufactured.

Modification Example

A transistor manufacturing method example partly different from the above manufacturing method example will be described below.

Figure 12A:
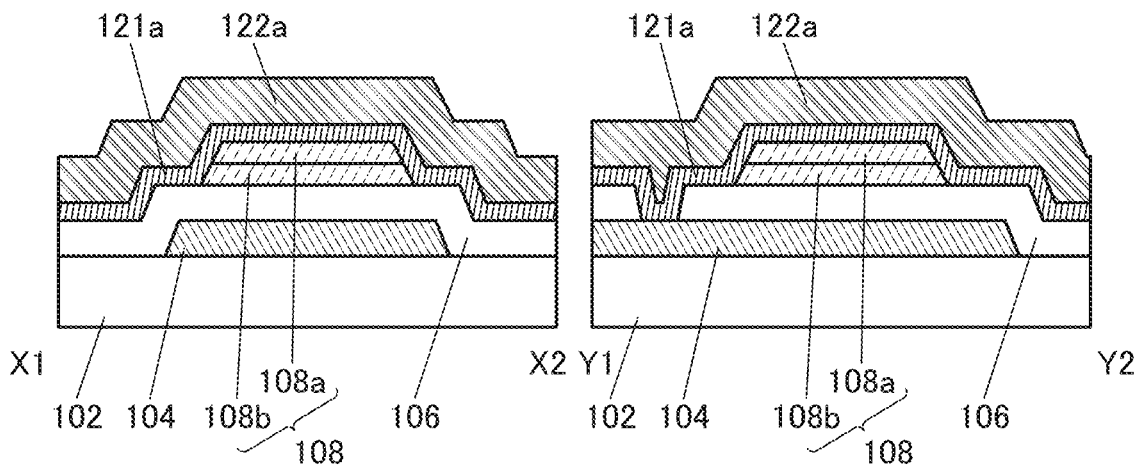
FIGS. 12A to 12C illustrate an example of a method for manufacturing a semiconductor device.

First, as in the above manufacturing method example, the conductive layer 104, the insulating layer 106, the semiconductor layer 108 (the semiconductor layer 108*a* and the semiconductor layer 108*b*), the conductive film 121*a*, and the conductive film 122*a* are formed over the substrate 102 (FIG. 12A).

Then, the resist mask 131 is formed over the conductive film 122*a*.

Figure 12B:
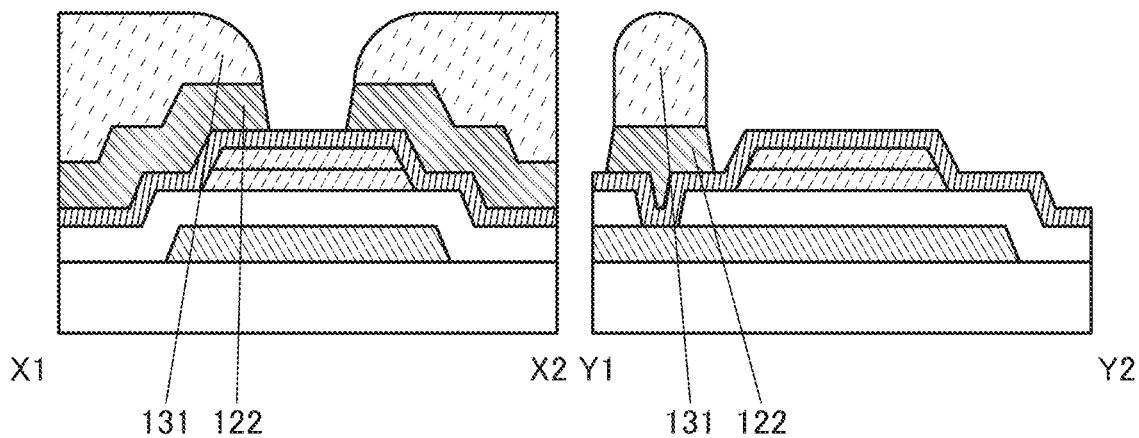

Next, part of the conductive film 122a that is not covered with the resist mask 131 is removed by etching to form the conductive layer 122 (FIG. 12B). A wet etching method is suitable for the etching.

Figure 12C:
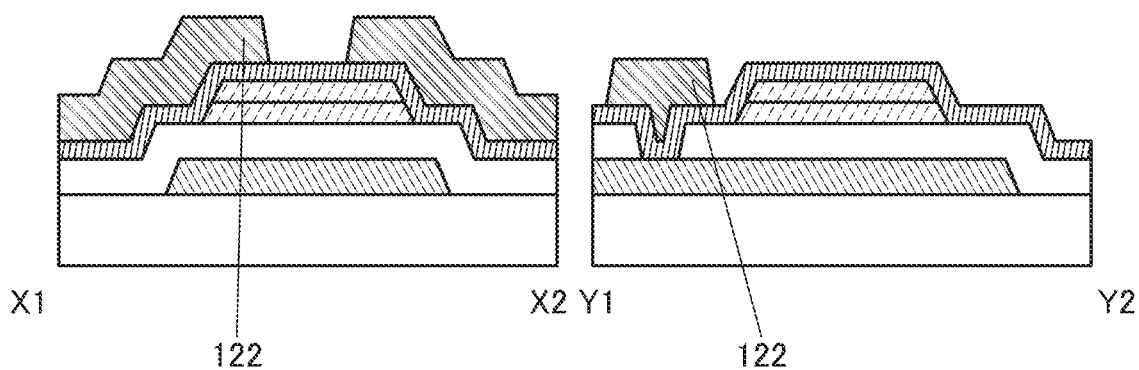

After that, the resist mask 131 is removed (FIG. 12C).

Figure 13A:
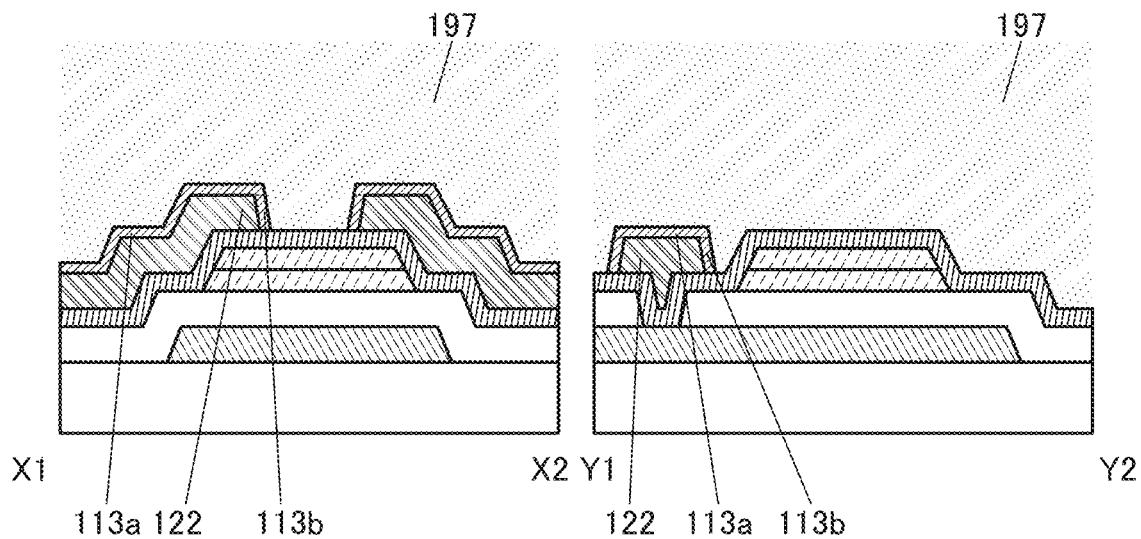
FIGS. 13A to 13C illustrate an example of a method for manufacturing a semiconductor device.

Then, the top surface and the side surface of the conductive layer 122 are silicified, whereby the first layer 113a and the second layer 113b that contain copper and silicon are formed at the same time (FIG. 13A). Here, plasma 197 generated inside a plasma treatment apparatus, which is a PECVD apparatus here, is schematically illustrated.

For a method for forming the first layer 113a and the second layer 113b, the above manufacturing method example can be referred to. For example, pretreatment for removing an oxide film on the top surface and the side surface of the conductive layer 122 and treatment for silicifying the top surface and the side surface of the conductive layer 122 are performed; thus, the first layer 113a and the second layer 113b that contain a metal element contained in the conductive layer 122 (here, copper) and silicon are formed at the same time. Subsequently, treatment for making the first layer 113a and the second layer 113b contain nitrogen is preferably performed.

Figure 13B:
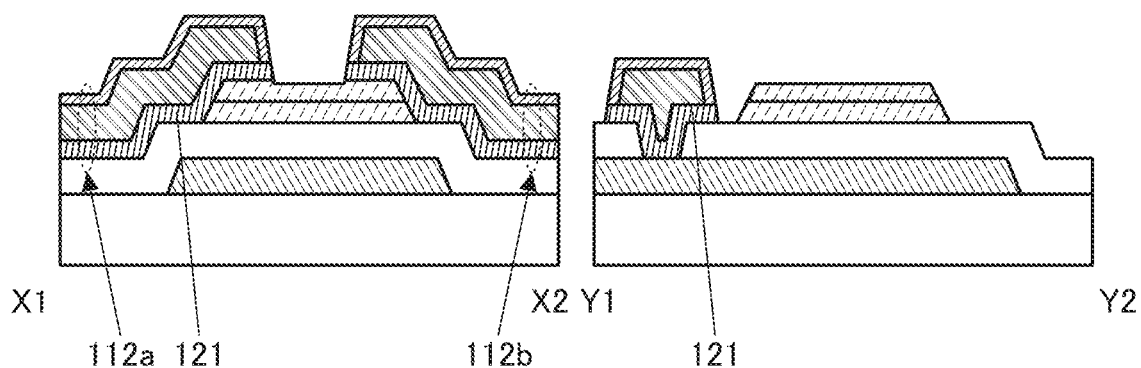

Then, part of the conductive film 121a that is not covered with the first layer 113a and the second layer 113b is removed by etching with the first layer 113a and the second layer 113b used as masks for etching (also referred to as hard masks), so that the conductive layer 121 is formed (FIG. 13B).

The conductive film 121a is preferably etched by a method by which the first layer 113a and the second layer 113b are not etched or not easily etched. Here, by containing copper silicide, the first layer 113a and the second layer 113b have higher resistance to etching than the conductive layer 122. Accordingly, the range of choices of an etching method can be widened. Wet etching is particularly suitable for the etching of the conductive film 121a, where a hydrogen peroxide solution, an acid such as a phosphoric acid, or the like can be suitably used.

Subsequently, the insulating layer 114, the insulating layer 116, the conductive layer 120a, the conductive layer 120b, and the insulating layer 118 are formed as in the above manufacturing method example.

Figure 13C:
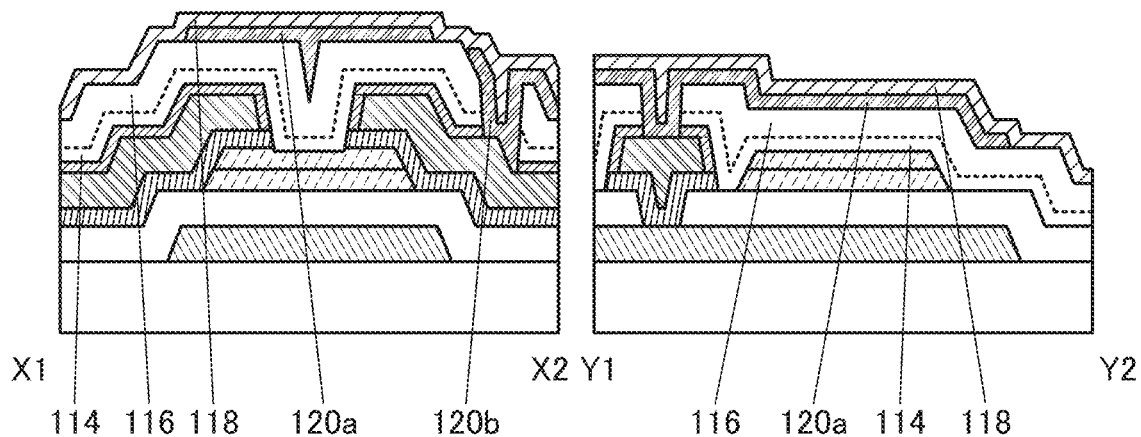

Through the above process, the transistor 100A can be manufactured (FIG. 13C).

The manufacturing method described here simplifies the process because the first layer 113a covering the top surface of the conductive layer 122 and the second layer 113b covering the side surface of the conductive layer 122 can be formed at the same time.

The above is the description of the modification example.

At least part of this embodiment can be implemented in combination with any of the other embodiments described in this specification as appropriate.

Embodiment 2

<Composition of CAC-OS>

Described below is the composition of a cloud-aligned composite oxide semiconductor (CAC-OS) applicable to a transistor disclosed in one embodiment of the present invention.

In this specification and the like, a metal oxide means an oxide of metal in a broad sense. Metal oxides are classified into an oxide insulator, an oxide conductor (including a transparent oxide conductor), an oxide semiconductor (also simply referred to as an OS), and the like. For example, a metal oxide used in an active layer of a transistor is called an oxide semiconductor in some cases. In other words, an OS FET is a transistor including a metal oxide or an oxide semiconductor.

In this specification, a metal oxide in which regions functioning as a conductor and regions functioning as a dielectric are mixed and which functions as a semiconductor as a whole is defined as a CAC-OS or a CAC-metal oxide.

The CAC-OS has, for example, a composition in which elements included in a metal oxide are unevenly distributed. The material including unevenly distributed elements has a region with a size of greater than or equal to 0.5 nm and less than or equal to 10 nm, preferably greater than or equal to 0.5 nm and less than or equal to 3 nm, or a similar size. Note that in the following description of a metal oxide, a state in which one or more elements are unevenly distributed and regions including the element(s) are mixed is referred to as a mosaic pattern or a patch-like pattern. The region has a size of greater than or equal to 0.5 nm and less than or equal to 10 nm, preferably greater than or equal to 0.5 nm and less than or equal to 3 nm, or a similar size.

The physical properties of a region including an unevenly distributed element are determined by the properties of the element. For example, a region including an unevenly distributed element which relatively tends to serve as an insulator among elements included in a metal oxide serves as a dielectric region. In contrast, a region including an unevenly distributed element which relatively tends to serve as a conductor among elements included in a metal oxide serves as a conductive region. A material in which conductive regions and dielectric regions are mixed to form a mosaic pattern serves as a semiconductor.

That is, a metal oxide in one embodiment of the present invention is a kind of matrix composite or metal matrix composite, in which materials having different physical properties are mixed.

Note that the metal oxide preferably contains indium. In that case, indium and zinc are preferably contained. In addition, an element M (M is one or more of gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium) may be contained. The metal oxide may contain zinc or zinc and M, without containing indium.

For example, of the CAC-OS, an In—Ga—Zn oxide with the CAC composition (such an In—Ga—Zn oxide may be particularly referred to as CAC-IGZO) has a composition in which materials are separated into indium oxide ($InO_{X1}$, where X1 is a real number greater than 0) or indium zinc oxide ($In_{X2}Zn_{Y2}O_{Z2}$, where X2, Y2, and Z2 are real numbers greater than 0), and gallium oxide ($GaO_{X3}$, where X3 is a real number greater than 0) or the like, gallium zinc oxide ($Ga_{X4}Zn_{Y4}O_{Z4}$, where X4, Y4, and Z4 are real numbers greater than 0), and a mosaic pattern is formed. Then, $InO_{X1}$ or $In_{X2}Zn_{Y2}O_{Z2}$ forming the mosaic pattern is evenly distributed in the film. This composition is also referred to as a cloud-like composition.

That is, the CAC-OS is a composite metal oxide with a composition in which a region including $GaO_{X3}$ as a main component and a region including $In_{X2}Zn_{Y2}O_{Z2}$ or $InO_{X1}$ as a main component are mixed. Note that in this specification, for example, when the atomic ratio of In to an element M in a first region is greater than the atomic ratio of In to an element M in a second region, the first region has higher In concentration than the second region.

Note that a compound including In, Ga, Zn, and O is also known as IGZO. Typical examples of IGZO include a crystalline compound represented by $InGaO_3(ZnO)_{m1}$ (m1 is a natural number) and a crystalline compound represented by $In_{(1+x0)}Ga_{(1-x0)}O_3(ZnO)_{m0}$ ($-1 \leq x0 \leq 1$; m0 is a given number).

The above crystalline compounds have a single crystal structure, a polycrystalline structure, or a CAAC structure. Note that the CAAC structure is a crystal structure in which a plurality of IGZO nanocrystals have c-axis alignment and are connected in the a-b plane direction without alignment.

On the other hand, the CAC-OS relates to the material composition of a metal oxide. In a material composition of a CAC-OS including In, Ga, Zn, and O, for example, nanoparticle regions including Ga as a main component are observed in part of the CAC-OS and nanoparticle regions including In as a main component are observed in part thereof. These nanoparticle regions are randomly dispersed to form a mosaic pattern. Therefore, the crystal structure is a secondary element for the CAC-OS.

Note that in the CAC-OS, a stacked-layer structure including two or more films with different atomic ratios is not included. For example, a two-layer structure of a film including In as a main component and a film including Ga as a main component is not included.

A boundary between the region including $GaO_{X3}$ as a main component and the region including $In_{X2}Zn_{Y2}O_{Z2}$ or $InO_{X1}$ as a main component is not clearly observed in some cases.

In the case where one or more of aluminum, silicon, boron, yttrium, tin, copper, vanadium, beryllium, titanium, iron, nickel, germanium, zirconium, molybdenum, lanthanum, cerium, neodymium, hafnium, tantalum, tungsten, magnesium, and the like are contained instead of gallium in a CAC-OS, nanoparticle regions including the selected element(s) as a main component(s) are observed in part of the CAC-OS and nanoparticle regions including In as a main component are observed in part thereof, and these nanoparticle regions are randomly dispersed to form a mosaic pattern in the CAC-OS.

<Analysis of CAC-OS>

Next, measurement results of a metal oxide over a substrate by a variety of methods are described.

<<Structure of Samples and Formation Method Thereof>>

Nine samples of one embodiment of the present invention are described below. The samples are formed at different substrate temperatures and with different oxygen gas flow rate ratios in formation of the metal oxide. Note that each sample includes a substrate and a metal oxide over the substrate.

A method for forming the samples is described.

A glass substrate is used as the substrate. Over the glass substrate, a 100-nm-thick In—Ga—Zn oxide is formed as a metal oxide with a sputtering apparatus. The formation conditions are as follows: the pressure in a chamber is 0.6 Pa, and an oxide target (with an atomic ratio of In:Ga:Zn=4: 2:4.1) is used as a target. The oxide target provided in the sputtering apparatus is supplied with an AC power of 2500 W.

As for the conditions in the formation of the oxide of the nine samples, the substrate temperature is set to a temperature that is not increased by intentional heating (hereinafter such a temperature is also referred to as room temperature or R.T.), to 130° C., and to 170° C. The ratio of a flow rate of an oxygen gas to a flow rate of a mixed gas of Ar and oxygen (also referred to as an oxygen gas flow rate ratio) is set to 10%, 30%, and 100%.

<<Analysis by X-Ray Diffraction>>

In this section, results of X-ray diffraction (XRD) measurement performed on the nine samples are described. As an XRD apparatus, D8 ADVANCE manufactured by Bruker AXS is used. The conditions are as follows: scanning is performed by an out-of-plane method at θ/2θ, the scanning range is 15 deg. to 50 deg., the step width is 0.02 deg., and the scanning speed is 3.0 deg./min.

Figure 14:
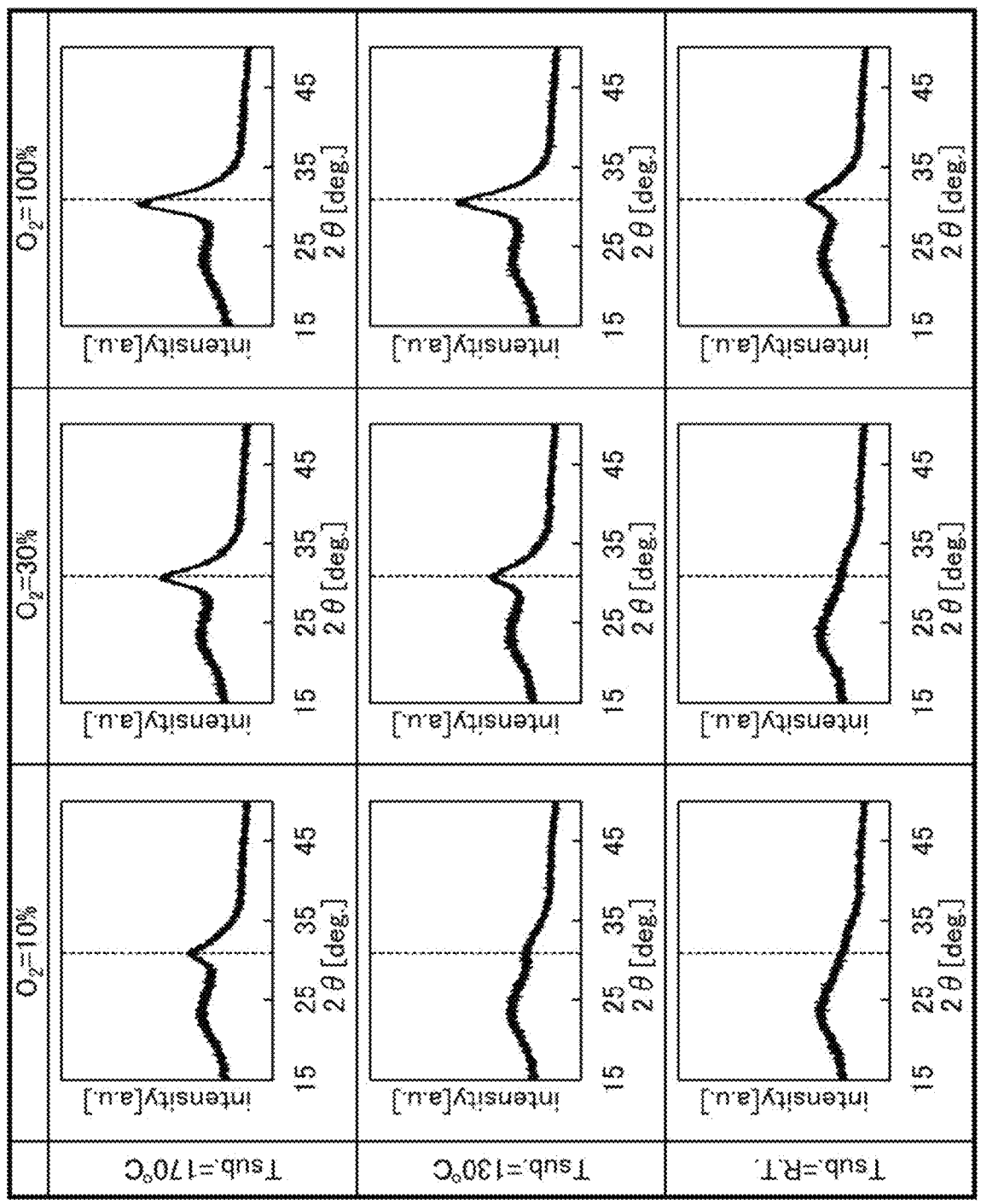
FIG. 14 shows measured XRD spectra of samples.

FIG. 14 shows XRD spectra measured by an out-of-plane method. In FIG. 14, the top row shows the measurement results of the samples formed at a substrate temperature of 170° C.; the middle row shows the measurement results of the samples formed at a substrate temperature of 130° C.; and the bottom row shows the measurement results of the samples formed at a substrate temperature of R.T. The left column shows the measurement results of the samples formed with an oxygen gas flow rate ratio of 10%; the middle column shows the measurement results of the samples formed with an oxygen gas flow rate ratio of 30%; and the right column shows the measurement results of the samples formed with an oxygen gas flow rate ratio of 100%.

In the XRD spectra shown in FIG. 14, the higher the substrate temperature at the time of formation is or the higher the oxygen gas flow rate ratio at the time of formation is, the higher the intensity of the peak at around $2\theta=31°$ is. Note that it is found that the peak at around $2\theta=31°$ is derived from a crystalline IGZO compound whose c-axes are aligned in a direction substantially perpendicular to a formation surface or a top surface of the crystalline IGZO compound (such a compound is also referred to as c-axis aligned crystalline (CAAC) IGZO).

As shown in the XRD spectra in FIG. 14, as the substrate temperature at the time of formation is lower or the oxygen gas flow rate ratio at the time of formation is lower, a peak becomes less clear. Accordingly, it is found that there are no alignment in the a-b plane direction and c-axis alignment in the measured areas of the samples that are formed at a lower substrate temperature or with a lower oxygen gas flow rate ratio.

<<Analysis with Electron Microscope>>

This section describes the observation and analysis results of the samples formed at a substrate temperature of R.T. and with an oxygen gas flow rate ratio of 10% with a high-angle annular dark-field scanning transmission electron microscope (HAADF-STEM). An image obtained with an HAADF-STEM is also referred to as a TEM image.

Described are the results of image analysis of plan-view images and cross-sectional images obtained with an HAADF-STEM (also referred to as plan-view TEM images and cross-sectional TEM images, respectively). The TEM images are observed with a spherical aberration corrector function. The HAADF-STEM images are obtained using an atomic resolution analytical electron microscope JEM-ARM200F manufactured by JEOL Ltd. under the following conditions: the acceleration voltage is 200 kV, and irradiation with an electron beam with a diameter of approximately 0.1 nm is performed.

FIG. 15A is a plan-view TEM image of the sample formed at a substrate temperature of R.T. and with an oxygen gas flow rate ratio of 10%. FIG. 15B is a cross-sectional TEM image of the sample formed at a substrate temperature of R.T. and with an oxygen gas flow rate ratio of 10%.

<<Analysis of Electron Diffraction Patterns>>

This section describes electron diffraction patterns obtained by irradiation of the sample formed at a substrate temperature of R.T. and an oxygen gas flow rate ratio of 10% with an electron beam with a probe diameter of 1 nm (also referred to as a nanobeam).

Electron diffraction patterns of points indicated by black dots a1, a2, a3, a4, and a5 in the plan-view TEM image in FIG. 15A of the sample formed at a substrate temperature of R.T. and an oxygen gas flow rate ratio of 10% are observed. Note that the electron diffraction patterns are observed while electron beam irradiation is performed at a constant rate for 35 seconds. FIGS. 15C, 15D, 15E, 15F, and 15G show the results of the points indicated by the black dots a1, a2, a3, a4, and a5, respectively.

In FIGS. 15C, 15D, 15E, 15F, and 15G, regions with high luminance in a circular (ring) pattern can be shown. Furthermore, a plurality of spots can be shown in a ring-like shape.

Electron diffraction patterns of points indicated by black dots b1, b2, b3, b4, and b5 in the cross-sectional TEM image in FIG. 15B of the sample formed at a substrate temperature of R.T. and an oxygen gas flow rate ratio of 10% are observed. FIGS. 15H, 15I, 15J, 15K, and 15L show the results of the points indicated by the black dots b1, b2, b3, b4, and b5, respectively.

In FIGS. 15H, 15I, 15J, 15K, and 15L, regions with high luminance in a ring pattern can be shown. Furthermore, a plurality of spots can be shown in a ring-like shape.

For example, when an electron beam with a probe diameter of 300 nm is incident on a CAAC-OS including an InGaZnO$_4$ crystal in a direction parallel to the sample surface, a diffraction pattern including a spot derived from the (009) plane of the InGaZnO$_4$ crystal is obtained. That is, the CAAC-OS has c-axis alignment and the c-axes are aligned in the direction substantially perpendicular to the formation surface or the top surface of the CAAC-OS. Meanwhile, a ring-like diffraction pattern is shown when an electron beam with a probe diameter of 300 nm is incident on the same sample in a direction perpendicular to the sample surface. That is, it is found that the CAAC-OS has neither a-axis alignment nor b-axis alignment.

Furthermore, a diffraction pattern like a halo pattern is observed when an oxide semiconductor including a nanocrystal (a nanocrystalline oxide semiconductor (nc-OS)) is subjected to electron diffraction using an electron beam with a large probe diameter (e.g., 50 nm or larger). Meanwhile, bright spots are shown in a nanobeam electron diffraction pattern of the nc-OS obtained using an electron beam with a small probe diameter (e.g., smaller than 50 nm). Furthermore, in a nanobeam electron diffraction pattern of the nc-OS, regions with high luminance in a circular (ring) pattern are shown in some cases. Also in a nanobeam electron diffraction pattern of the nc-OS, a plurality of bright spots are shown in a ring-like shape in some cases.

The electron diffraction pattern of the sample formed at a substrate temperature of R.T. and with an oxygen gas flow rate ratio of 10% has regions with high luminance in a ring pattern and a plurality of bright spots appear in the ring-like pattern. Accordingly, the sample formed at a substrate temperature of R.T. and with an oxygen gas flow rate ratio of 10% exhibits an electron diffraction pattern similar to that of the nc-OS and does not show alignment in the plane direction and the cross-sectional direction.

According to what is described above, a metal oxide formed at a low substrate temperature or with a low oxygen gas flow rate ratio is likely to have characteristics distinctly different from those of a metal oxide film having an amorphous structure and a metal oxide film having a single crystal structure.

<<Elementary Analysis>>

This section describes the analysis results of elements included in the sample formed at a substrate temperature of R.T. and with an oxygen gas flow rate ratio of 10%. For the analysis, by energy dispersive X-ray spectroscopy (EDX), EDX mapping images are obtained. An energy dispersive X-ray spectrometer AnalysisStation JED-2300T manufactured by JEOL Ltd. is used as an elementary analysis apparatus in the EDX measurement. A Si drift detector is used to detect an X-ray emitted from the sample.

In the EDX measurement, an EDX spectrum of a point is obtained in such a manner that electron beam irradiation is performed on the point in a detection target region of a sample, and the energy of characteristic X-ray of the sample generated by the irradiation and its frequency are measured. In this embodiment, peaks of an EDX spectrum of the point are attributed to electron transition to the L shell in an In atom, electron transition to the K shell in a Ga atom, and electron transition to the K shell in a Zn atom and the K shell in an O atom, and the proportions of the atoms in the point are calculated. An EDX mapping image indicating distributions of proportions of atoms can be obtained through the process in an analysis target region of a sample.

Figure 16A:
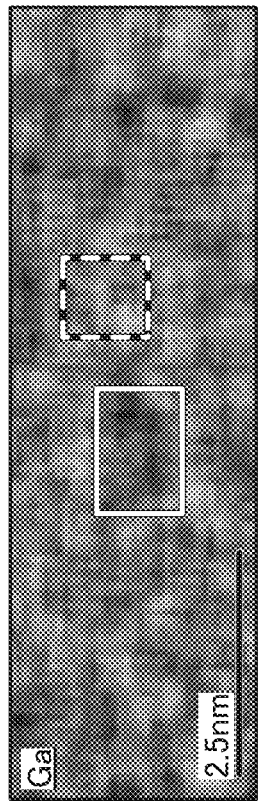
FIGS. 16A to 16C show EDX mapping images of a sample.
Figure 16B:
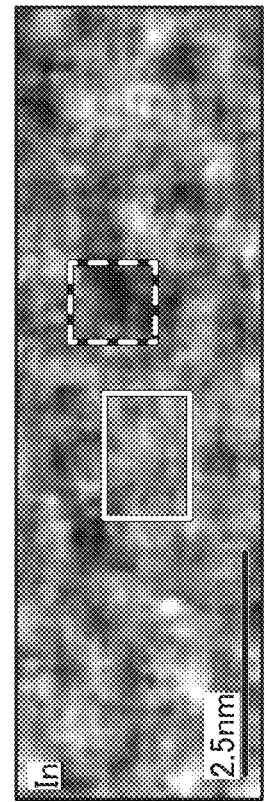
Figure 16C:
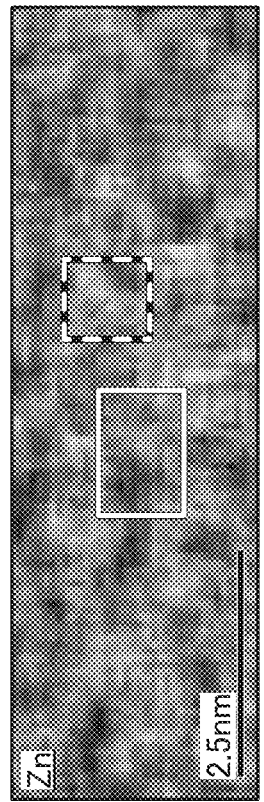

FIGS. 16A to 16C show EDX mapping images in a cross section of the sample formed at a substrate temperature of R.T. and with an oxygen gas flow rate ratio of 10%. FIG. 16A shows an EDX mapping image of Ga atoms. The proportion of the Ga atoms in all the atoms is 1.18 atomic % to 18.64 atomic %. FIG. 16B shows an EDX mapping image of In atoms. The proportion of the In atoms in all the atoms is 9.28 atomic % to 33.74 atomic %. FIG. 16C shows an EDX mapping image of Zn atoms. The proportion of the Zn atoms in all the atoms is 6.69 atomic % to 24.99 atomic %. FIGS. 16A to 16C show the same region in the cross section of the sample formed at a substrate temperature of R.T. and with an oxygen gas flow rate ratio of 10%. In the EDX mapping images, the proportion of an element is indicated by gray scale: the more measured atoms exist in a region, the brighter the region is; the less measured atoms exist in a region, the darker the region is. The magnification of the EDX mapping images in FIGS. 16A to 16C is 7200000 times.

The EDX mapping images in FIGS. 16A to 16C show relative distribution of brightness indicating that each element has a distribution in the sample formed at a substrate temperature of R.T. and with an oxygen gas flow rate ratio of 10%. Areas surrounded by solid lines and areas surrounded by dashed lines in FIGS. 16A to 16C are examined.

In FIG. 16A, a relatively dark region occupies a large area in the area surrounded by the solid line, while a relatively bright region occupies a large area in the area surrounded by the dashed line. In FIG. 16B, a relatively bright region occupies a large area in the area surrounded by the solid line, while a relatively dark region occupies a large area in the area surrounded by the dashed line.

That is, the areas surrounded by the solid lines are regions including a relatively large number of In atoms and the areas surrounded by the dashed lines are regions including a relatively small number of In atoms. In FIG. 16C, the right portion of the area surrounded by the solid line is relatively bright and the left portion thereof is relatively dark. Thus, the area surrounded by the solid line is a region including $In_{X2}Zn_{Y2}O_{Z2}$, $InO_{X1}$, or the like as a main component.

The area surrounded by the solid line is a region including a relatively small number of Ga atoms and the area surrounded by the dashed line is a region including a relatively large number of Ga atoms. In FIG. 16C, the upper left portion of the area surrounded by the dashed line is relatively bright and the lower right portion thereof is relatively dark. Thus, the area surrounded by the dashed line is a region including $GaO_{X3}$, $Ga_{X4}Zn_{Y4}O_{Z4}$, or the like as a main component.

Furthermore, as shown in FIGS. 16A to 16C, the In atoms are relatively more uniformly distributed than the Ga atoms, and regions including $InO_{X1}$ as a main component are seemingly joined to each other through a region including $In_{X2}Zn_{Y2}O_{Z2}$ as a main component. Thus, the regions including $In_{X2}Zn_{Y2}O_{Z2}$ and $InO_{X1}$ as main components extend like a cloud.

An In—Ga—Zn oxide having a composition in which the regions including $GaO_{X3}$ or the like as a main component and the regions including $In_{X2}Zn_{Y2}O_{Z2}$ or $InO_{X1}$ as a main component are unevenly distributed and mixed can be referred to as a CAC-OS.

The crystal structure of the CAC-OS includes an nc structure. In an electron diffraction pattern of the CAC-OS with the nc structure, several or more bright spots appear in addition to bright sports derived from IGZO including a single crystal, a polycrystal, or a CAAC. Alternatively, the crystal structure is defined as having high luminance regions appearing in a ring pattern in addition to the several or more bright spots.

As shown in FIGS. 16A to 16C, each of the regions including $GaO_{X3}$ or the like as a main component and the regions including $In_{X2}Zn_{Y2}O_{Z2}$ or $InO_{X1}$ as a main component has a size of greater than or equal to 0.5 nm and less than or equal to 10 nm, or greater than or equal to 1 nm and less than or equal to 3 nm. Note that it is preferable that a diameter of a region including each metal element as a main component be greater than or equal to 1 nm and less than or equal to 2 nm in the EDX mapping images.

As described above, the CAC-OS has a structure different from that of an IGZO compound in which metal elements are evenly distributed, and has characteristics different from those of the IGZO compound. That is, in the CAC-OS, regions including $GaO_{X3}$ or the like as a main component and regions including $In_{X2}Zn_{Y2}O_{Z2}$ or $InO_{X1}$ as a main component are separated to form a mosaic pattern.

The conductivity of a region including $In_{X2}Zn_{Y2}O_{Z2}$ or $InO_{X1}$ as a main component is higher than that of a region including $GaO_{X3}$ or the like as a main component. In other words, when carriers flow through regions including $In_{X2}Zn_{Y2}O_{Z2}$ or $InO_{X1}$ as a main component, the conductivity of a metal oxide is exhibited. Accordingly, when regions including $In_{X2}Zn_{Y2}O_{Z2}$ or $InO_{X1}$ as a main component are distributed in a metal oxide like a cloud, a high field-effect mobility ($\mu$) can be achieved.

In contrast, the insulating property of a region including $GaO_{X3}$ or the like as a main component is higher than that of a region including $In_{X2}Zn_{Y2}O_{Z2}$ or $InO_{X1}$ as a main component. In other words, when regions including $GaO_{X3}$ or the like as a main component are distributed in a metal oxide, leakage current can be suppressed and favorable switching operation can be achieved.

Accordingly, when a CAC-OS is used for a semiconductor element, the insulating property derived from $GaO_{X3}$ or the like and the conductivity derived from $In_{X2}Zn_{Y2}O_{Z2}$ or $InO_{X1}$ complement each other, whereby a high on-state current ($I_{on}$) and a high field-effect mobility ($\mu$) can be achieved.

A semiconductor element including a CAC-OS has high reliability. Thus, the CAC-OS is suitably used in a variety of semiconductor devices typified by a display.

At least part of this embodiment can be implemented in combination with any of the other embodiments described in this specification as appropriate.

Embodiment 3

In this embodiment, examples of a display device that includes the transistor described in the above embodiments are described below with reference to FIG. 17, FIG. 18, and FIG. 19.

Figure 17:
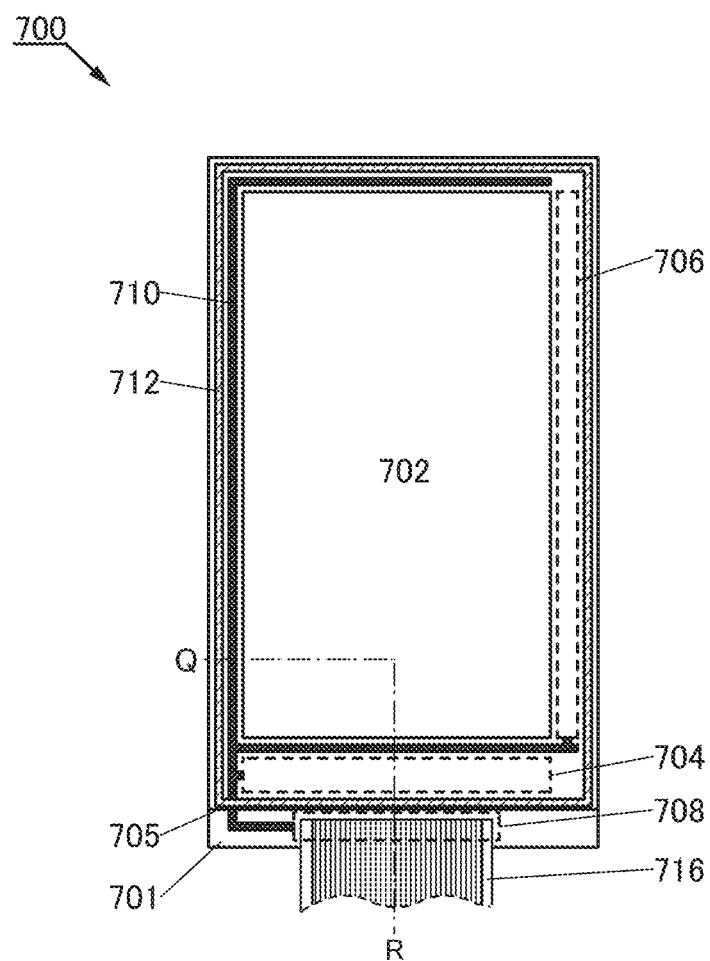
FIG. 17 is a top view illustrating one mode of a display device.

FIG. 17 is a top view illustrating an example of a display device. A display device 700 in FIG. 17 includes a pixel portion 702 provided over a first substrate 701, a source driver circuit portion 704 and a gate driver circuit portion 706 that are provided over the first substrate 701, a sealant 712 provided to surround the pixel portion 702, the source driver circuit portion 704, and the gate driver circuit portion 706, and a second substrate 705 provided to face the first substrate 701. The first substrate 701 and the second substrate 705 are sealed with the sealant 712. That is, the pixel portion 702, the source driver circuit portion 704, and the gate driver circuit portion 706 are enclosed by the first substrate 701, the sealant 712, and the second substrate 705. Although not illustrated in FIG. 17, a display element is provided between the first substrate 701 and the second substrate 705.

In the display device 700, a flexible printed circuit (FPC) terminal portion 708 that is electrically connected to the pixel portion 702, the source driver circuit portion 704, and the gate driver circuit portion 706 is provided in a region different from the region that is over the first substrate 701 and surrounded by the sealant 712. Furthermore, an FPC 716 is connected to the FPC terminal portion 708, and a variety of signals and the like are supplied from the FPC 716 to the pixel portion 702, the source driver circuit portion 704, and the gate driver circuit portion 706. Furthermore, a signal line 710 is connected to the pixel portion 702, the source driver circuit portion 704, the gate driver circuit portion 706, and the FPC terminal portion 708. Through the signal line 710, a variety of signals and the like are supplied from the FPC 716 to the pixel portion 702, the source driver circuit portion 704, the gate driver circuit portion 706, and the FPC terminal portion 708.

A plurality of gate driver circuit portions 706 may be provided in the display device 700. The structure of the display device 700 is not limited to the example shown here, in which the source driver circuit portion 704 and the gate driver circuit portion 706 as well as the pixel portion 702 are formed over the first substrate 701. For example, only the gate driver circuit portion 706 may be formed over the first substrate 701, or only the source driver circuit portion 704 may be formed over the first substrate 701. In this case, a substrate over which a source driver circuit, a gate driver circuit, or the like is formed (e.g., a driver circuit board formed using a single crystal semiconductor film or a polycrystalline semiconductor film) may be formed on the first substrate 701. Note that there is no particular limitation on the method for connecting the separately prepared driver circuit board, and a chip on glass (COG) method, a wire bonding method, or the like can be used.

The pixel portion 702, the source driver circuit portion 704, and the gate driver circuit portion 706 included in the display device 700 include a plurality of transistors. The transistor which is a semiconductor device of one embodiment of the present invention can be used.

The display device 700 can include a variety of elements. As examples of the elements, an electroluminescent (EL)

element (e.g., an EL element containing organic and inorganic materials, an organic EL element, an inorganic EL element, or an LED), a light-emitting transistor element (a transistor that emits light depending on current), an electron emitter, a liquid crystal element, an electronic ink element, an electrophoretic element, an electrowetting element, a plasma display panel (PDP), micro electro mechanical systems (MEMS) display (e.g., a grating light valve (GLV), a digital micromirror device (DMD), a digital micro shutter (DMS) element, or an interferometric modulator display (IMOD) element), a piezoelectric ceramic display, and the like can be given.

An example of a display device including an EL element is an EL display. Examples of a display device including an electron emitter include a field emission display (FED) and an SED-type flat panel display (SED: surface-conduction electron-emitter display). An example of a display device including a liquid crystal element is a liquid crystal display (a transmissive liquid crystal display, a transflective liquid crystal display, a reflective liquid crystal display, a direct-view liquid crystal display, or a projection liquid crystal display). An example of a display device including an electronic ink element or an electrophoretic element is electronic paper. In a transflective liquid crystal display or a reflective liquid crystal display, some or all of pixel electrodes may function as reflective electrodes. For example, some or all of pixel electrodes may contain aluminum, silver, or the like. In this case, a memory circuit such as an SRAM can be provided under the reflective electrodes, leading to lower power consumption.

As a display system of the display device 700, a progressive system, an interlace system, or the like can be employed. Furthermore, color elements controlled in pixels at the time of color display are not limited to three colors: R, G, and B (R, G, and B correspond to red, green, and blue, respectively). For example, four pixels of an R pixel, a G pixel, a B pixel, and a W (white) pixel may be used. Alternatively, a color element may be composed of two colors of R, G, and B as in PenTile layout. The two colors may differ depending on the color elements. Alternatively, one or more colors of yellow, cyan, magenta, and the like may be added to RGB. Note that the size of a display region may differ between dots of color elements. One embodiment of the disclosed invention is not limited to a color display device; the disclosed invention can also be applied to a monochrome display device.

A coloring layer (also referred to as a color filter) may be used to obtain a full-color display device in which white light (W) is used for a backlight (e.g., an organic EL element, an inorganic EL element, an LED, or a fluorescent lamp). For example, a red (R) coloring layer, a green (G) coloring layer, a blue (B) coloring layer, and a yellow (Y) coloring layer can be combined as appropriate. With the use of the coloring layer, high color reproducibility can be obtained as compared with the case without the coloring layer. Here, by providing a region with a coloring layer and a region without a coloring layer, white light in the region without the coloring layer may be directly utilized for display. By partly providing the region without a coloring layer, a decrease in the luminance of a bright image due to the coloring layer can be suppressed, and power consumption can be reduced by approximately 20% to 30% in some cases. In the case where full-color display is performed using a self-luminous element such as an organic EL element or an inorganic EL element, elements may emit light in their respective colors R, G, B, Y, and W. By using a self-luminous element, power consumption may be further reduced as compared with the case of using a coloring layer.

As a coloring system, any of the following systems may be used: the above-described color filter system in which part of white light is converted into red light, green light, and blue light through color filters; a three-color system in which red light, green light, and blue light are used; and a color conversion system or a quantum dot system in which part of blue light is converted into red light or green light.

In this embodiment, a structure including a liquid crystal element as a display element and a structure including an EL element as a display element are described with reference to FIG. 18 and FIG. 19. FIG. 18 is a cross-sectional view taken along dashed-dotted line Q-R in FIG. 17 and illustrate the structure including a liquid crystal element as a display element. FIG. 19 is a cross-sectional view taken along dashed-dotted line Q-R in FIG. 17 and illustrates the structure including an EL element as a display element.

Figure 18:
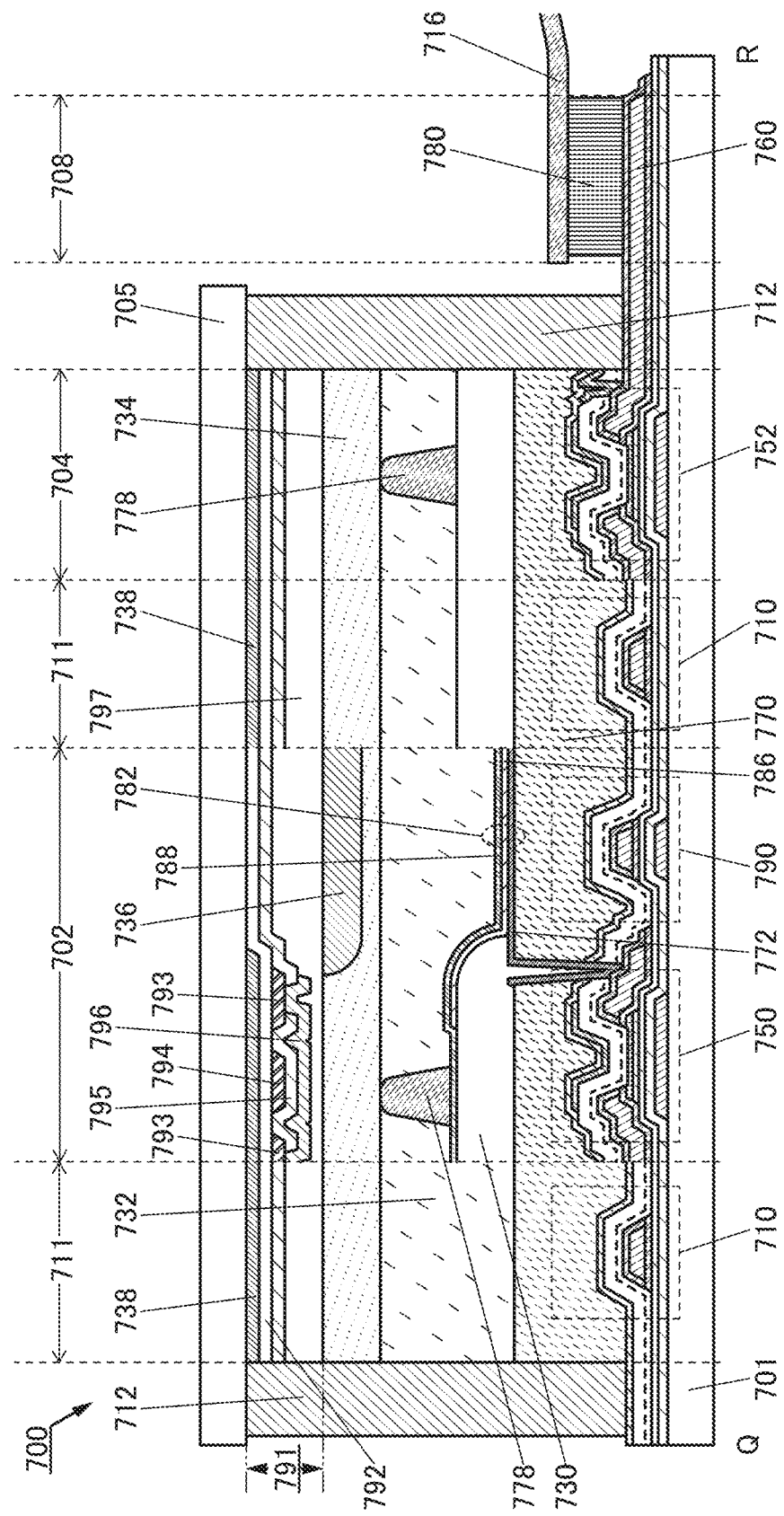
FIG. 18 is a cross-sectional view illustrating one mode of a display device.
Figure 19:
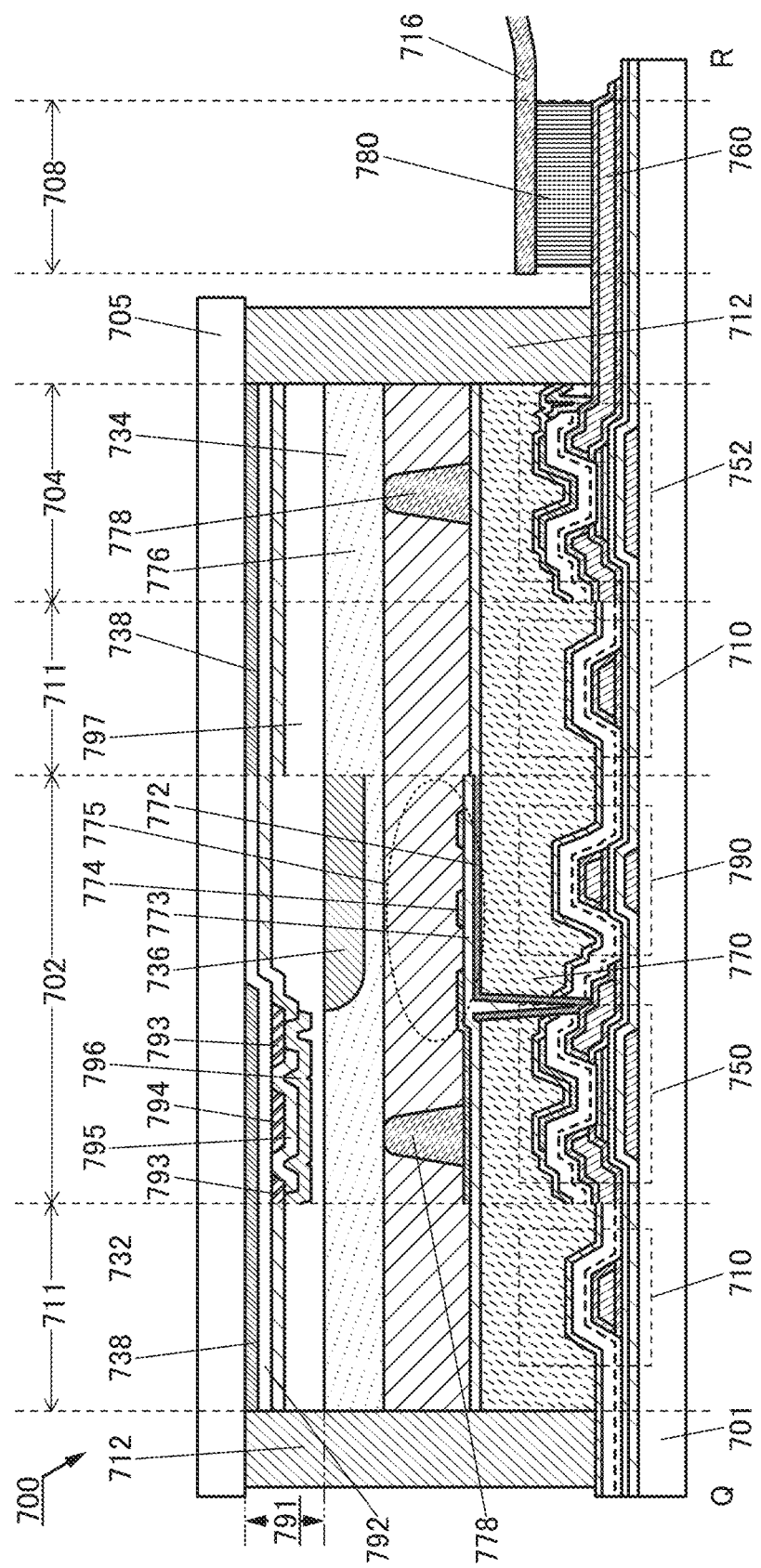
FIG. 19 is a cross-sectional view illustrating one mode of a display device.

Portions common to FIG. 18 and FIG. 19 are described first, and then, different portions are described.

<3-1. Portions Common to Display Devices>

The display device 700 in FIG. 18 and FIG. 19 includes a lead wiring portion 711, the pixel portion 702, the source driver circuit portion 704, and the FPC terminal portion 708. The lead wiring portion 711 includes the signal line 710. The pixel portion 702 includes a transistor 750 and a capacitor 790. The source driver circuit portion 704 includes a transistor 752.

The transistor 750 and the transistor 752 each have a structure similar to that of the transistor 100A described above. Note that the transistor 750 and the transistor 752 may each have the structure of any of the other transistors described in the above embodiments.

The transistor used in this embodiment includes a metal oxide film that is highly purified and in which formation of oxygen vacancies is inhibited. The transistor can have a low off-state current. Accordingly, an electrical signal such as an image signal can be held for a long time, and a long writing interval can be set in an on state. Accordingly, the frequency of refresh operation can be reduced, which suppresses power consumption.

In addition, the transistor used in this embodiment can have relatively high field-effect mobility and thus is capable of high-speed operation. For example, in a liquid crystal display device that includes such a transistor capable of high-speed operation, a switching transistor in a pixel portion and a driver transistor in a driver circuit portion can be formed over one substrate. That is, no additional semiconductor device formed using a silicon wafer or the like is needed as a driver circuit; therefore, the number of components of the semiconductor device can be reduced. In addition, by using the transistor capable of high-speed operation in the pixel portion, a high-quality image can be provided.

The capacitor 790 includes a lower electrode and an upper electrode. The lower electrode is formed through a step of processing a conductive film to be a conductive film functioning as a first gate electrode of the transistor 750. The upper electrode is formed through a step of processing a conductive film to be a conductive film functioning as source and drain electrodes of the transistor 750. Between the lower electrode and the upper electrode, an insulating film formed through a step of forming an insulating film to be an insulating film functioning as a first gate insulating film of the transistor 750 is provided. That is, the capacitor 790 has a stacked-layer structure in which an insulating film functioning as a dielectric film is positioned between the pair of electrodes.

In FIG. 18 and FIG. 19, a planarization insulating film 770 is provided over the transistor 750, the transistor 752, and the capacitor 790.

The planarization insulating film 770 can be formed using a heat-resistant organic material such as a polyimide resin, an acrylic resin, a polyimide amide resin, a benzocyclobutene resin, a polyamide resin, or an epoxy resin. Note that the planarization insulating film 770 may be formed by stacking a plurality of insulating films formed from these materials. Alternatively, a structure without the planarization insulating film 770 may be employed.

Although FIG. 18 and FIG. 19 each illustrate an example in which the transistor 750 included in the pixel portion 702 and the transistor 752 included in the source driver circuit portion 704 have the same structure, one embodiment of the present invention is not limited thereto. For example, the pixel portion 702 and the source driver circuit portion 704 may include different transistors. Specifically, a structure in which a staggered transistor is used in the pixel portion 702 and an inverted-staggered transistor described in Embodiment 1 is used in the source driver circuit portion 704, or a structure in which the inverted-staggered transistor described in Embodiment 1 is used in the pixel portion 702 and the staggered transistor is used in the source driver circuit portion 704 may be employed. Note that the term "source driver circuit portion 704" can be replaced by the term "gate driver circuit portion".

The signal line 710 is formed through the same process as the conductive films functioning as source electrodes and drain electrodes of the transistors 750 and 752. In the case where the signal line 710 is formed using a material containing a copper element, signal delay or the like due to wiring resistance is reduced, which enables display on a large screen.

The FPC terminal portion 708 includes a connection electrode 760, an anisotropic conductive film 780, and the FPC 716. Note that the connection electrode 760 is formed through the same process as the conductive films functioning as source electrodes and drain electrodes of the transistors 750 and 752. The connection electrode 760 is electrically connected to a terminal included in the FPC 716 through the anisotropic conductive film 780.

For example, glass substrates can be used as the first substrate 701 and the second substrate 705. As the first substrate 701 and the second substrate 705, flexible substrates may also be used. An example of the flexible substrate is a plastic substrate.

A structure 778 is provided between the first substrate 701 and the second substrate 705. The structure 778 is a columnar spacer obtained by selective etching of an insulating film and is provided to control the distance (cell gap) between the first substrate 701 and the second substrate 705. Alternatively, a spherical spacer may also be used as the structure 778.

A light-blocking film 738 functioning as a black matrix, a coloring film 736 functioning as a color filter, and an insulating film 734 in contact with the light-blocking film 738 and the coloring film 736 are provided on the second substrate 705 side.

<3-2. Structure Example of Input/Output Device of Display Device>

In the display device 700 shown in FIG. 18 and FIG. 19, a touch panel 791 as an input/output device is provided.

Note that the display device 700 that does not include the touch panel 791 may be used.

The touch panel 791 illustrated in FIG. 18 and FIG. 19 is what is called an in-cell touch panel provided between the second substrate 705 and the coloring film 736. The touch panel 791 is formed on the second substrate 705 side before the coloring film 736 is formed.

The touch panel 791 includes the light-blocking film 738, an insulating film 792, an electrode 793, an electrode 794, an insulating film 795, an electrode 796, and an insulating film 797. A change in the capacitance between the electrode 793 and the electrode 794 can be sensed when an object such as a finger or a stylus approaches, for example.

A portion in which the electrode 793 intersects with the electrode 794 is illustrated in the upper portion of the transistor 750 illustrated in FIG. 18 and FIG. 19. The electrode 796 is electrically connected to the two electrodes 793 between which the electrode 794 is sandwiched through openings provided in the insulating film 795. Note that a structure in which a region where the electrode 796 is provided is provided in the pixel portion 702 is illustrated in FIG. 18 and FIG. 19 as an example; however, one embodiment of the present invention is not limited thereto. For example, the region where the electrode 796 is provided may be provided in the source driver circuit portion 704.

The electrode 793 and the electrode 794 are provided in a region overlapping with the light-blocking film 738. As illustrated in FIG. 18, it is preferable that the electrode 793 not overlap with a light-emitting element 782. As illustrated in FIG. 19, it is preferable that the electrode 793 not overlap with a liquid crystal element 775. In other words, the electrode 793 has an opening in a region overlapping with the light-emitting element 782 and the liquid crystal element 775. That is, the electrode 793 has a mesh shape. With such a structure, the electrode 793 does not block light emitted from the light-emitting element 782, or alternatively the electrode 793 does not block light transmitted through the liquid crystal element 775. Thus, since luminance is hardly reduced even when the touch panel 791 is provided, a display device with high visibility and low power consumption can be obtained. Note that the electrode 794 can have a structure similar to that of the electrode 793.

Since the electrode 793 and the electrode 794 do not overlap with the light-emitting element 782, a metal material having low transmittance with respect to visible light can be used for the electrode 793 and the electrode 794. Furthermore, since the electrode 793 and the electrode 794 do not overlap with the liquid crystal element 775, a metal material having low transmittance with respect to visible light can be used for the electrode 793 and the electrode 794.

Thus, as compared with the case of using an oxide material whose transmittance of visible light is high, the resistance of the electrodes 793 and 794 can be reduced, whereby sensitivity of the sensor of the touch panel can be increased.

For example, a conductive nanowire may be used for the electrodes 793, 794, and 796. The nanowire may have a mean diameter of greater than or equal to 1 nm and less than or equal to 100 nm, preferably greater than or equal to 5 nm and less than or equal to 50 nm, further preferably greater than or equal to 5 nm and less than or equal to 25 nm. As the nanowire, a carbon nanotube or a metal nanowire such as an Ag nanowire, a Cu nanowire, or an Al nanowire may be used. For example, in the case where an Ag nanowire is used for any one of or all of the electrodes 793, 794, and 796, the transmittance of visible light can be greater than or equal to 89% and the sheet resistance can be greater than or equal to 40 Ω/sq. and less than or equal to 100 Ω/sq.

Although the structure of the in-cell touch panel is illustrated in FIG. 18 and FIG. 19, one embodiment of the present invention is not limited thereto. For example, a touch panel formed over the display device 700, what is called an on-cell touch panel, or a touch panel attached to the display device 700, what is called an out-cell touch panel may be used. In this manner, the display device 700 of one embodiment of the present invention can be combined with various types of touch panels.

<3-3. Display Device Including Light-Emitting Element>

The display device 700 illustrated in FIG. 18 includes the light-emitting element 782. The light-emitting element 782 includes a conductive film 772, an EL layer 786, and a conductive film 788. The display device 700 illustrated in FIG. 18 can display an image by utilizing light emission from the EL layer 786 of the light-emitting element 782. Note that the EL layer 786 contains an organic compound or an inorganic compound such as a quantum dot.

Examples of materials that can be used for an organic compound include a fluorescent material and a phosphorescent material. Examples of materials that can be used for a quantum dot include a colloidal quantum dot material, an alloyed quantum dot material, a core-shell quantum dot material, and a core quantum dot material. A material containing elements belonging to Groups 12 and 16, elements belonging to Groups 13 and 15, or elements belonging to Groups 14 and 16, may be used. Alternatively, a quantum dot material containing an element such as cadmium (Cd), selenium (Se), zinc (Zn), sulfur (S), phosphorus (P), indium (In), tellurium (Te), lead (Pb), gallium (Ga), arsenic (As), or aluminum (Al) may be used.

In the display device 700 in FIG. 18, an insulating film 730 is provided over the planarization insulating film 770 and the conductive film 772. The insulating film 730 covers part of the conductive film 772. Note that the light-emitting element 782 has a top-emission structure. Thus, the conductive film 788 has a light-transmitting property and transmits light emitted from the EL layer 786. Although the top-emission structure is described as an example in this embodiment, the structure is not limited thereto. For example, a bottom-emission structure in which light is emitted to the conductive film 772 side or a dual-emission structure in which light is emitted to both the conductive film 772 side and the conductive film 788 side may also be employed.

The coloring film 736 is provided to overlap with the light-emitting element 782, and the light-blocking film 738 is provided in the lead wiring portion 711 and the source driver circuit portion 704 to overlap with the insulating film 730. The coloring film 736 and the light-blocking film 738 are covered with the insulating film 734. A space between the light-emitting element 782 and the insulating film 734 is filled with a sealing film 732. The structure of the display device 700 is not limited to the example in FIG. 21, in which the coloring film 736 is provided. For example, a structure without the coloring film 736 may also be employed in the case where the EL layer 786 is formed by separate coloring.

<3-4. Structure Example of Display Device Including Liquid Crystal Element>

The display device 700 illustrated in FIG. 19 includes the liquid crystal element 775. The liquid crystal element 775 includes the conductive film 772, an insulating film 773, a conductive film 774, and a liquid crystal layer 776. In such a structure, the conductive film 774 functions as a common electrode, and an electric field generated between the conductive film 772 and the conductive film 774 through the insulating film 773 can control the alignment state in the liquid crystal layer 776. The display device 700 in FIG. 19 is capable of displaying an image in such a manner that transmission or non-transmission is controlled by change in the alignment state of the liquid crystal layer 776 depending on a voltage applied to the conductive film 772 and the conductive film 774.

The conductive film 772 is electrically connected to the conductive film functioning as the source electrode or the drain electrode of the transistor 750. The conductive film 772 is formed over the planarization insulating film 770 and functions as a pixel electrode, that is, one electrode of the display element.

A conductive film that transmits visible light or a conductive film that reflects visible light can be used as the conductive film 772. For example, a material containing an element selected from indium (In), zinc (Zn), and tin (Sn) is preferably used for the conductive film that transmits visible light. For example, a material containing aluminum or silver is preferably used for the conductive film that reflects visible light. In this embodiment, the conductive film that reflects visible light is used for the conductive film 772.

Although FIG. 19 illustrates an example in which the conductive film 772 is connected to the conductive film functioning as the drain electrode of the transistor 750, one embodiment of the present invention is not limited to this example. For example, the conductive film 772 may be electrically connected to the conductive film functioning as the drain electrode of the transistor 750 through a conductive film functioning as a connection electrode.

Although not shown in FIG. 19, an alignment film may be provided in contact with the liquid crystal layer 776. Although not illustrated in FIG. 19, an optical member (optical substrate) and the like such as a polarizing member, a retardation member, or an anti-reflection member may be provided as appropriate. For example, circular polarization may be employed by using a polarizing substrate and a retardation substrate. In addition, a backlight, a side light, or the like may be used as a light source.

In the case where a liquid crystal element is used as the display element, a thermotropic liquid crystal, a low-molecular liquid crystal, a high-molecular liquid crystal, a polymer dispersed liquid crystal, a ferroelectric liquid crystal, an anti-ferroelectric liquid crystal, or the like can be used. These liquid crystal materials exhibit a cholesteric phase, a smectic phase, a cubic phase, a chiral nematic phase, an isotropic phase, or the like depending on conditions.

In the case where a horizontal electric field mode is employed, a liquid crystal exhibiting a blue phase for which an alignment film is unnecessary may be used. The blue phase is a liquid crystal phase, which is generated just before transition from a cholesteric phase to an isotropic phase when the temperature of a cholesteric liquid crystal is increased. Since the blue phase appears only in a narrow temperature range, a liquid crystal composition in which several weight percent or more of a chiral material is mixed is used for the liquid crystal layer in order to improve the temperature range. The liquid crystal composition containing a liquid crystal exhibiting a blue phase and a chiral material has a short response time and optical isotropy, which eliminates the need for an alignment process. An alignment film does not need to be provided, and thus, rubbing treatment is not necessary; accordingly, electrostatic discharge damage caused by the rubbing treatment can be prevented, and defects and damage of a liquid crystal display device in the manufacturing process can be reduced. Moreover, the liquid crystal material that exhibits a blue phase has small viewing angle dependence.

In the case where a liquid crystal element is used as a display element, a twisted nematic (TN) mode, an in-plane switching (IPS) mode, a fringe field switching (FFS) mode, an axially symmetric aligned micro-cell (ASM) mode, an optical compensated birefringence (OCB) mode, a ferroelectric liquid crystal (FLC) mode, an anti-ferroelectric liquid crystal (AFLC) mode, or the like can be used.

Furthermore, a normally black liquid crystal display device such as a vertical alignment (VA) mode transmissive liquid crystal display device may also be used. There are some examples of a vertical alignment mode; for example, a multi-domain vertical alignment (MVA) mode, a patterned vertical alignment (PVA) mode, and an ASV mode, or the like can be employed.

At least part of this embodiment can be implemented in combination with any of the other embodiments described in this specification as appropriate.

Embodiment 4

In this embodiment, an example of a display panel which can be used for a display portion or the like in a display device including a semiconductor device of one embodiment of the present invention is described with reference to FIG. 20 and FIG. 21. The display panel described below as an example includes both a reflective liquid crystal element and a light-emitting element and can display an image in both the light-emitting mode and the reflective mode.

4-1. Structure Example of Display Panel

Figure 20:
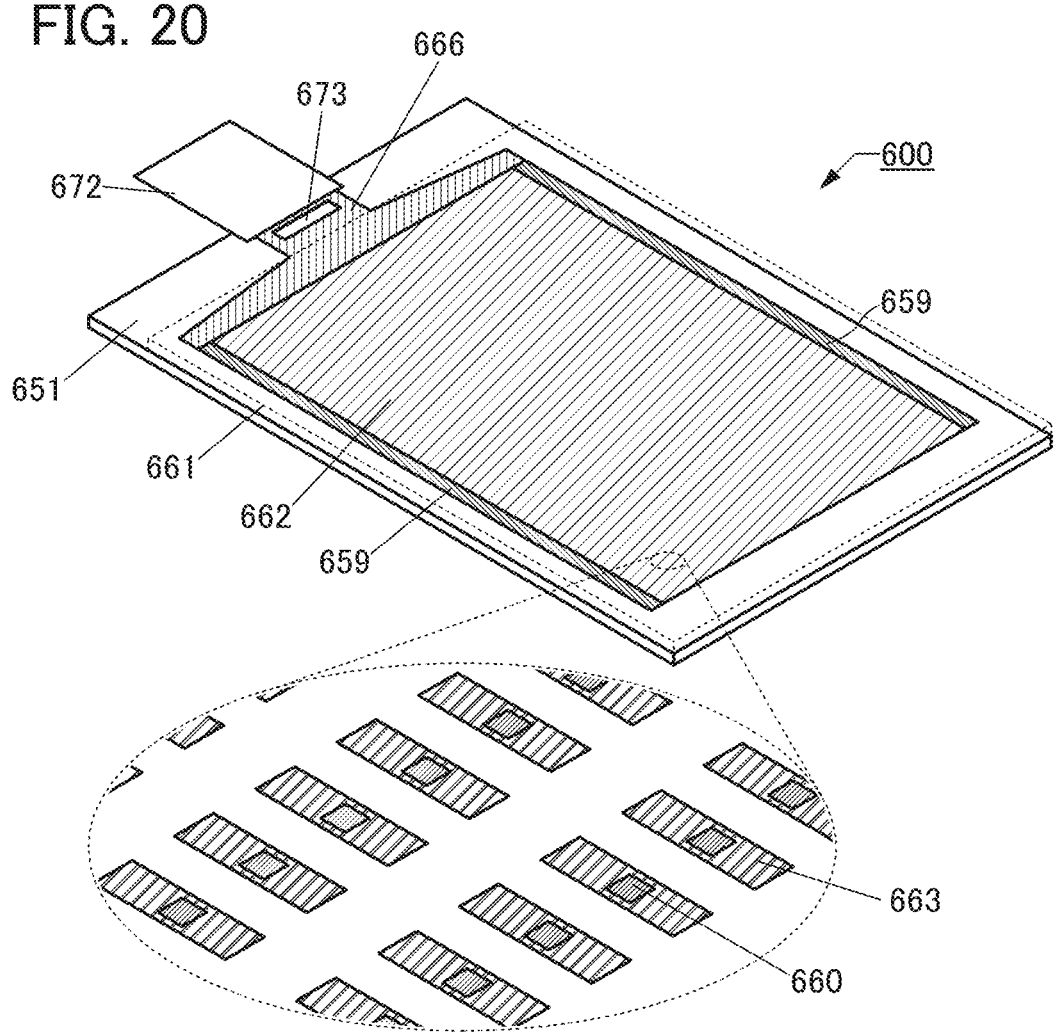
FIG. 20 illustrates a structure example of a display panel.

FIG. 20 is a schematic perspective view illustrating a display panel 600 of one embodiment of the present invention. In the display panel 600, a substrate 651 and a substrate 661 are attached to each other. In FIG. 20, the substrate 661 is denoted by a dashed line.

The display panel 600 includes a display portion 662, a circuit 659, a wiring 666, and the like. The substrate 651 is provided with the circuit 659, the wiring 666, a conductive film 663 which serves as a pixel electrode, and the like. In FIG. 20, an IC 673 and an FPC 672 are mounted on the substrate 651. Thus, the structure illustrated in FIG. 20 can be referred to as a display module including the display panel 600, the FPC 672, and the IC 673.

As the circuit 659, for example, a circuit functioning as a scan line driver circuit can be used.

The wiring 666 has a function of supplying a signal or electric power to the display portion or the circuit 659. The signal or electric power is input to the wiring 666 from the outside through the FPC 672 or from the IC 673.

FIG. 20 shows an example in which the IC 673 is provided by a chip on glass (COG) method or the like on the substrate 651. As the IC 673, an IC functioning as a scan line driver circuit, a signal line driver circuit, or the like can be used. Note that it is possible that the IC 673 is not provided when, for example, the display panel 600 includes circuits serving as a scan line driver circuit and a signal line driver circuit and when the circuits serving as a scan line driver circuit and a signal line driver circuit are provided outside and a signal for driving the display panel 600 is input through the FPC 672. Alternatively, the IC 673 may be mounted by a chip on film (COF) method or the like on the FPC 672.

FIG. 20 also shows an enlarged view of part of the display portion 662. The conductive films 663 included in a plurality of display elements are arranged in a matrix in the display portion 662. The conductive film 663 has a function of reflecting visible light and serves as a reflective electrode of a liquid crystal element 640 described later.

As illustrated in FIG. 20, the conductive film 663 has an opening. A light-emitting element 660 is positioned closer to the substrate 651 than the conductive film 663 is. Light is emitted from the light-emitting element 660 to the substrate 661 side through the opening in the conductive film 663.

4-2. Cross-Sectional Structure Example

Figure 21:
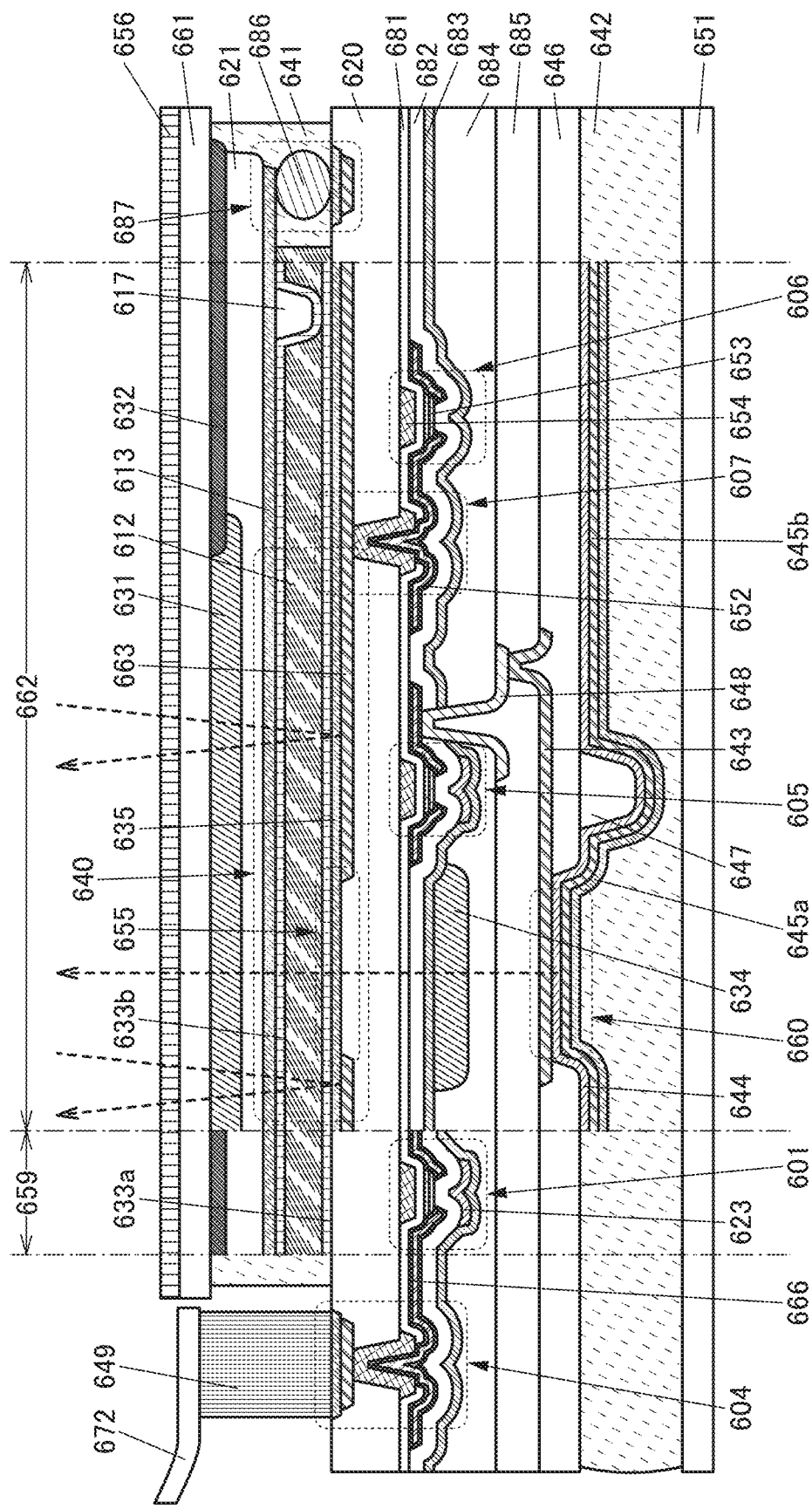
FIG. 21 illustrates a structure example of a display panel.

FIG. 21 shows an example of cross sections of part of a region including the FPC 672, part of a region including the circuit 659, and part of a region including the display portion 662 of the display panel illustrated in FIG. 20.

The display panel includes an insulating film 620 between the substrates 651 and 661. The display panel also includes the light-emitting element 660, a transistor 601, a transistor 605, a transistor 606, a coloring layer 634, and the like between the substrate 651 and the insulating film 620. Furthermore, the display panel includes the liquid crystal element 640, a coloring layer 631, and the like between the insulating film 620 and the substrate 661. The substrate 661 and the insulating film 620 are bonded with an adhesive layer 641. The substrate 651 and the insulating film 620 are bonded with an adhesive layer 642.

The transistor 606 is electrically connected to the liquid crystal element 640 and the transistor 605 is electrically connected to the light-emitting element 660. Since the transistors 605 and 606 are formed on a surface of the insulating film 620 which is on the substrate 651 side, the transistors 605 and 606 can be formed through the same process.

The substrate 661 is provided with the coloring layer 631, a light-blocking film 632, an insulating film 621, a conductive film 613 serving as a common electrode of the liquid crystal element 640, an alignment film 633b, an insulating film 617, and the like. The insulating film 617 serves as a spacer for holding a cell gap of the liquid crystal element 640.

Insulating layers such as an insulating film 681, an insulating film 682, an insulating film 683, an insulating film 684, and an insulating film 685 are provided on the substrate 651 side of the insulating film 620. Part of the insulating film 681 functions as a gate insulating layer of each transistor. The insulating films 682, 683, and 684 are provided to cover each transistor. The insulating film 685 is provided to cover the insulating film 684. The insulating films 684 and 685 each function as a planarization layer. Note that an example where the three insulating layers, the insulating films 682, 683, and 684, are provided to cover the transistors and the like is described here; however, one embodiment of the present invention is not limited to this example, and four or more insulating layers, a single insulating layer, or two insulating layers may be provided. The insulating film 684 functioning as a planarization layer is not necessarily provided when not needed.

The transistors 601, 605, and 606 each include a conductive film 654 part of which functions as a gate, a conductive film 652 part of which functions as a source or a drain, and a semiconductor film 653. Here, a plurality of layers obtained by processing the same conductive film are shown with the same hatching pattern.

The liquid crystal element 640 is a reflective liquid crystal element. The liquid crystal element 640 has a stacked structure of a conductive film 635, a liquid crystal layer 612, and the conductive film 613. In addition, the conductive film 663 which reflects visible light is provided in contact with the substrate 651 side of the conductive film 635. The conductive film 663 includes an opening 655. The conductive films 635 and 613 contain a material transmitting visible light. In addition, an alignment film 633*a* is provided between the liquid crystal layer 612 and the conductive film 635 and the alignment film 633*b* is provided between the liquid crystal layer 612 and the conductive film 613. A polarizing plate 656 is provided on an outer surface of the substrate 661.

In the liquid crystal element 640, the conductive film 663 has a function of reflecting visible light and the conductive film 613 has a function of transmitting visible light. Light entering from the substrate 661 side is polarized by the polarizing plate 656, passes through the conductive film 613 and the liquid crystal layer 612, and is reflected by the conductive film 663. Then, the light passes through the liquid crystal layer 612 and the conductive film 613 again and reaches the polarizing plate 656. In this case, alignment of the liquid crystal is controlled with a voltage that is applied between the conductive film 613 and the conductive film 663, and thus optical modulation of light can be controlled. That is, the intensity of light emitted through the polarizing plate 656 can be controlled. Light excluding light in a particular wavelength region is absorbed by the coloring layer 631, and thus, emitted light is red light, for example.

The light-emitting element 660 is a bottom-emission light-emitting element. The light-emitting element 660 has a structure in which a conductive film 643, an EL layer 644, and a conductive film 645*b* are stacked in this order from the insulating film 620 side. In addition, a conductive film 645*a* is provided to cover the conductive film 645*b*. The conductive film 645*b* contains a material reflecting visible light, and the conductive films 643 and 645*a* contain a material transmitting visible light. Light is emitted from the light-emitting element 660 to the substrate 661 side through the coloring layer 634, the insulating film 620, the opening 655, the conductive film 613, and the like.

Here, as illustrated in FIG. 21, the conductive film 635 transmitting visible light is preferably provided for the opening 655. Accordingly, the liquid crystal layer 612 is aligned in a region overlapping with the opening 655 as well as in the other regions, in which case an alignment defect of the liquid crystal is prevented from being generated in the boundary portion of these regions and undesired light leakage can be suppressed.

As the polarizing plate 656 provided on an outer surface of the substrate 661, a linear polarizing plate or a circularly polarizing plate can be used. An example of a circularly polarizing plate is a stack including a linear polarizing plate and a quarter-wave retardation plate. Such a structure can reduce reflection of external light. The cell gap, alignment, drive voltage, and the like of the liquid crystal element used as the liquid crystal element 640 are controlled depending on the kind of the polarizing plate so that desirable contrast is obtained.

In addition, an insulating film 647 is provided on the insulating film 646 covering an end portion of the conductive film 643. The insulating film 647 has a function of a spacer for preventing the insulating film 620 and the substrate 651 from getting closer more than necessary. In the case where the EL layer 644 or the conductive film 645*a* is formed using a blocking mask (metal mask), the insulating film 647 may have a function of preventing the blocking mask from being in contact with a surface on which the EL layer 644 or the conductive film 645*a* is formed. Note that the insulating film 647 is not necessarily provided when not needed.

One of a source and a drain of the transistor 605 is electrically connected to the conductive film 643 of the light-emitting element 660 through a conductive film 648.

One of a source and a drain of the transistor 606 is electrically connected to the conductive film 663 through a connection portion 607. The conductive films 663 and 635 are in contact with and electrically connected to each other. Here, in the connection portion 607, the conductive layers provided on both surfaces of the insulating film 620 are connected to each other through an opening in the insulating film 620.

A connection portion 604 is provided in a region where the substrate 651 and the substrate 661 do not overlap with each other. The connection portion 604 is electrically connected to the FPC 672 through a connection layer 649. The connection portion 604 has a structure similar to that of the connection portion 607. On the top surface of the connection portion 604, a conductive layer obtained by processing the same conductive film as the conductive film 635 is exposed. Thus, the connection portion 604 and the FPC 672 can be electrically connected to each other through the connection layer 649.

A connection portion 687 is provided in part of a region where the adhesive layer 641 is provided. In the connection portion 687, the conductive layer obtained by processing the same conductive film as the conductive film 635 is electrically connected to part of the conductive film 613 with a connector 686. Accordingly, a signal or a potential input from the FPC 672 connected to the substrate 651 side can be supplied to the conductive film 613 formed on the substrate 661 side through the connection portion 687.

As the connector 686, a conductive particle can be used, for example. As the conductive particle, a particle of an organic resin, silica, or the like coated with a metal material can be used. It is preferable to use nickel or gold as the metal material because contact resistance can be reduced. It is also preferable to use a particle coated with layers of two or more kinds of metal materials, such as a particle coated with nickel and further with gold. As the connector 686, a material capable of elastic deformation or plastic deformation is preferably used. As illustrated in FIG. 21, the connector 686 which is the conductive particle has a shape that is vertically crushed in some cases. With the crushed shape, the contact area between the connector 686 and a conductive layer electrically connected to the connector 686 can be increased, thereby reducing contact resistance and suppressing the generation of problems such as disconnection.

The connector 686 is preferably provided so as to be covered with the adhesive layer 641. For example, the connectors 686 are dispersed in the adhesive layer 641 before curing of the adhesive layer 641.

FIG. 21 illustrates an example of the circuit 659 in which the transistor 601 is provided.

The structure in which the semiconductor film 653 where a channel is formed is provided between two gates is used as an example of the transistors 601 and 605 in FIG. 21. One gate is formed using the conductive film 654 and the other gate is formed using a conductive film 623 overlapping with the semiconductor film 653 with the insulating film 682 provided therebetween. Such a structure enables control of threshold voltages of a transistor. In that case, the two gates may be connected to each other and supplied with the same signal to operate the transistor. Such a transistor can have higher field-effect mobility and thus have a higher on-state current than other transistors. Consequently, a circuit capable of high-speed operation can be obtained. Furthermore, the area occupied by a circuit portion can be reduced. The use of the transistor having a high on-state current can reduce signal delay in wirings and can reduce display unevenness even in a display panel in which the number of wirings is increased because of an increase in size or resolution.

Note that the transistor included in the circuit 659 and the transistor included in the display portion 662 may have the same structure. A plurality of transistors included in the circuit 659 may have the same structure or different structures. A plurality of transistors included in the display portion 662 may have the same structure or different structures.

A material through which impurities such as water and hydrogen do not easily diffuse is preferably used for at least one of the insulating films 682 and 683 which cover the transistors. That is, the insulating film 682 or the insulating film 683 can function as a barrier film. Such a structure can effectively suppress diffusion of the impurities into the transistors from the outside, and a highly reliable display panel can be provided.

The insulating film 621 is provided on the substrate 661 side to cover the coloring layer 631 and the light-blocking film 632. The insulating film 621 may have a function as a planarization layer. The insulating film 621 enables the conductive film 613 to have an almost flat surface, resulting in a uniform alignment state of the liquid crystal layer 612.

An example of the method for manufacturing the display panel 600 is described. For example, the conductive film 635, the conductive film 663, and the insulating film 620 are formed in order over a support substrate provided with a separation layer, and the transistor 605, the transistor 606, the light-emitting element 660, and the like are formed. Then, the substrate 651 and the support substrate are bonded with the adhesive layer 642. After that, separation is performed at the interface between the separation layer and each of the insulating film 620 and the conductive film 635, whereby the support substrate and the separation layer are removed. Separately, the coloring layer 631, the light-blocking film 632, the conductive film 613, and the like are formed over the substrate 661 in advance. Then, a liquid crystal is dropped onto the substrate 651 or 661 and the substrates 651 and 661 are bonded with the adhesive layer 641, whereby the display panel 600 can be manufactured.

A material for the separation layer can be selected as appropriate such that separation occurs at the interfaces with the insulating film 620 and the conductive film 635. In particular, it is preferable that a stack of a layer including a high-melting-point metal material, such as tungsten, and a layer including an oxide of the metal material be used as the separation layer, and a stack of a plurality of layers, such as a silicon nitride layer, a silicon oxynitride layer, and a silicon nitride oxide layer, be used as the insulating film 620 over the separation layer. The use of the high-melting-point metal material for the separation layer can increase the formation temperature of a layer formed in a later step, which reduces impurity concentration and achieves a highly reliable display panel.

As the conductive film 635, an oxide or a nitride such as a metal oxide, a metal nitride, or an oxide semiconductor whose resistance is reduced is preferably used. In the case of using an oxide semiconductor, a material in which at least one of the concentrations of hydrogen, boron, phosphorus, nitrogen, and other impurities and the number of oxygen vacancies is made to be higher than those in a semiconductor layer of a transistor is used for the conductive film 635.

4-3. Components

The above components will be described below. Note that descriptions of structures having functions similar to those in the above embodiments are omitted.

[Adhesive Layer]

As the adhesive layer, a variety of curable adhesives such as a reactive curable adhesive, a thermosetting adhesive, an anaerobic adhesive, and a photocurable adhesive such as an ultraviolet curable adhesive can be used. Examples of these adhesives include an epoxy resin, an acrylic resin, a silicone resin, a phenol resin, a polyimide resin, an imide resin, a polyvinyl chloride (PVC) resin, a polyvinyl butyral (PVB) resin, and an ethylene vinyl acetate (EVA) resin. In particular, a material with low moisture permeability, such as an epoxy resin, is preferred. Alternatively, a two-component-mixture-type resin may be used. Further alternatively, an adhesive sheet or the like may be used.

Furthermore, the resin may include a drying agent. For example, a substance that adsorbs moisture by chemical adsorption, such as an oxide of an alkaline earth metal (e.g., calcium oxide or barium oxide), can be used. Alternatively, a substance that adsorbs moisture by physical adsorption, such as zeolite or silica gel, may be used. The drying agent is preferably included because it can prevent impurities such as moisture from entering the element, thereby improving the reliability of the display panel.

In addition, it is preferable to mix a filler with a high refractive index or a light-scattering member into the resin, in which case light extraction efficiency can be enhanced. For example, titanium oxide, barium oxide, zeolite, zirconium, or the like can be used.

[Connection Layer]

As the connection layer, an anisotropic conductive film (ACF), an anisotropic conductive paste (ACP), or the like can be used.

[Coloring Layer]

Examples of a material that can be used for the coloring layers include a metal material, a resin material, and a resin material containing a pigment or dye.

[Light-Blocking Layer]

Examples of a material that can be used for the light-blocking layer include carbon black, titanium black, a metal, a metal oxide, and a composite oxide containing a solid solution of a plurality of metal oxides. The light-blocking layer may be a film containing a resin material or a thin film of an inorganic material such as a metal. Stacked films containing the material of the coloring layer can also be used for the light-blocking layer. For example, a stacked-layer structure of a film containing a material of a coloring layer which transmits light of a certain color and a film containing a material of a coloring layer which transmits light of another color can be employed. It is preferable that the coloring layer and the light-blocking layer be formed using the same material because the same manufacturing apparatus can be used and the process can be simplified.

The above is the description of the components.

4-4. Manufacturing Method Example

A manufacturing method example of a display panel using a flexible substrate is described.

Here, layers including a display element, a circuit, a wiring, an electrode, optical members such as a coloring layer and a light-blocking layer, an insulating layer, and the like, are collectively referred to as an element layer. The element layer includes, for example, a display element, and may additionally include a wiring electrically connected to the display element or an element such as a transistor used in a pixel or a circuit.

In addition, here, a flexible member which supports the element layer at a stage at which the display element is completed (the manufacturing process is finished) is referred to as a substrate. For example, a substrate includes an extremely thin film with a thickness greater than or equal to 10 nm and less than or equal to 300 μm and the like.

As a method for forming an element layer over a flexible substrate provided with an insulating surface, typically, there are two methods shown below. One of them is to directly form an element layer over the substrate. The other method is to form an element layer over a support substrate that is different from the substrate and then to separate the element layer from the support substrate to be transferred to the substrate. Although not described in detail here, in addition to the above two methods, there is a method in which an element layer is formed over a substrate which does not have flexibility and the substrate is thinned by polishing or the like to have flexibility.

In the case where a material of the substrate can withstand heating temperature in a process for forming the element layer, it is preferable that the element layer be formed directly over the substrate, in which case a manufacturing process can be simplified. At this time, the element layer is preferably formed in a state where the substrate is fixed to the support substrate, in which case transfer thereof in an apparatus and between apparatuses can be easy.

In the case of employing the method in which the element layer is formed over the support substrate and then transferred to the substrate, first, a separation layer and an insulating layer are stacked over the support substrate, and then the element layer is formed over the insulating layer. Next, the element layer is separated from the support substrate and then transferred to the substrate. At this time, selected is a material with which separation at an interface between the support substrate and the separation layer, at an interface between the separation layer and the insulating layer, or in the separation layer occurs. With the method, it is preferable that a material having high heat resistance be used for the support substrate or the separation layer, in which case the upper limit of the temperature applied when the element layer is formed can be increased, and an element layer including a more highly reliable element can be formed.

For example, it is preferable that a stack of a layer containing a high-melting-point metal material, such as tungsten, and a layer containing an oxide of the metal material be used as the separation layer, and a stack of a plurality of layers, such as a silicon oxide layer, a silicon nitride layer, a silicon oxynitride layer, and a silicon nitride oxide layer, be used as the insulating layer over the separation layer.

As the method for separating the support substrate from the element layer, applying mechanical force, etching the separation layer, and making a liquid permeate the separation interface are given as examples. Alternatively, separation may be performed by heating or cooling two layers of the separation interface by utilizing a difference in thermal expansion coefficient.

The separation layer is not necessarily provided in the case where the separation can be performed at an interface between the support substrate and the insulating layer.

For example, glass and an organic resin such as polyimide can be used as the support substrate and the insulating layer, respectively. In that case, a separation trigger may be formed by, for example, locally heating part of the organic resin with laser light or the like, or by physically cutting part of or making a hole through the organic resin with a sharp tool, and separation may be performed at an interface between the glass and the organic resin. As the above-described organic resin, a photosensitive material is preferably used because an opening or the like can be easily formed. The above-described laser light preferably has a wavelength region, for example, from visible light to ultraviolet light. For example, light having a wavelength of greater than or equal to 200 nm and less than or equal to 400 nm, preferably greater than or equal to 250 nm and less than or equal to 350 nm can be used. In particular, an excimer laser having a wavelength of 308 nm is preferably used because the productivity is increased. Alternatively, a solid-state UV laser (also referred to as a semiconductor UV laser), such as a UV laser having a wavelength of 355 nm which is the third harmonic of an Nd:YAG laser, may be used.

Alternatively, a heat generation layer may be provided between the support substrate and the insulating layer formed of an organic resin, and separation may be performed at an interface between the heat generation layer and the insulating layer by heating the heat generation layer. For the heat generation layer, any of a variety of materials such as a material which generates heat when current flows therethrough, a material which generates heat when absorbing light, and a material which generates heat when a magnetic field is applied thereto can be used. For example, for the heat generation layer, a material selected from a semiconductor, a metal, and an insulator can be used.

In the above-described methods, the insulating layer formed of an organic resin can be used as a substrate after the separation.

The above is the description of a manufacturing method of a flexible display panel.

At least part of this embodiment can be implemented in combination with any of the other embodiments described in this specification as appropriate.

Embodiment 5

In this embodiment, a display device including a semiconductor device of one embodiment of the present invention is described with reference to FIGS. 22A to 22C.

<Circuit Configuration of Display Device>

A display device illustrated in FIG. 22A includes a region including pixels (hereinafter referred to as a pixel portion 502), a circuit portion that is provided outside the pixel portion 502 and includes a circuit for driving the pixels (hereinafter, the circuit portion is referred to as a driver circuit portion 504), circuits having a function of protecting elements (hereinafter, the circuits are referred to as protection circuits 506), and a terminal portion 507. Note that the protection circuits 506 are not necessarily provided.

Part or the whole of the driver circuit portion 504 is preferably formed over a substrate over which the pixel portion 502 is formed. Thus, the number of components and the number of terminals can be reduced. When part or the whole of the driver circuit portion 504 is not formed over the substrate over which the pixel portion 502 is formed, the part or the whole of the driver circuit portion 504 can be mounted by COG or tape automated bonding (TAB).

The pixel portion 502 includes a plurality of circuits for driving display elements arranged in X (X is a natural number of 2 or more) rows and Y (Y is a natural number of 2 or more) columns (hereinafter, the circuits are referred to as pixel circuits 501). The driver circuit portion 504 includes driver circuits such as a circuit for supplying a signal (scan signal) to select a pixel (hereinafter, the circuit is referred to as a gate driver 504a) and a circuit for supplying a signal (data signal) to drive a display element in a pixel (hereinafter, the circuit is referred to as a source driver 504b).

The gate driver 504a includes a shift register or the like. The gate driver 504a receives a signal for driving the shift register through the terminal portion 507 and outputs a signal. For example, the gate driver 504a receives a start pulse signal, a clock signal, or the like and outputs a pulse signal. The gate driver 504a has a function of controlling the potentials of wirings supplied with scan signals (hereinafter referred to as scan lines GL_1 to GL_X). Note that a plurality of gate drivers 504a may be provided to control the scan lines GL_1 to GL_X separately. Alternatively, the gate driver 504a has a function of supplying an initialization signal. Without being limited thereto, another signal can be supplied from the gate driver 504a.

The source driver 504b includes a shift register or the like. The source driver 504b receives a signal (image signal) from which a data signal is generated, as well as a signal for driving the shift register, through the terminal portion 507. The source driver 504b has a function of generating a data signal to be written to the pixel circuit 501 from the image signal. In addition, the source driver 504b has a function of controlling output of a data signal in response to a pulse signal produced by input of a start pulse signal, a clock signal, or the like. Furthermore, the source driver 504b has a function of controlling the potentials of wirings supplied with data signals (hereinafter referred to as data lines DL_1 to DL_Y). Alternatively, the source driver 504b has a function of supplying an initialization signal. Without being limited thereto, another signal can be supplied from the source driver 504b.

The source driver 504b includes a plurality of analog switches, for example. The source driver 504b can output, as data signals, time-divided image signals obtained by sequentially turning on the plurality of analog switches. The source driver 504b may include a shift register or the like.

A pulse signal and a data signal are input to each of the plurality of pixel circuits 501 through one of the plurality of scan lines GL supplied with scan signals and one of the plurality of data lines DL supplied with data signals, respectively. Writing and holding of the data signal in each of the plurality of pixel circuits 501 are controlled by the gate driver 504a. For example, to the pixel circuit 501 in the m-th row and the n-th column (m is a natural number of X or less, and n is a natural number of Y or less), a pulse signal is input from the gate driver 504a through the scan line GL_m, and a data signal is input from the source driver 504b through the data line DL_n in accordance with the potential of the scan line GL_m.

Figure 22A:
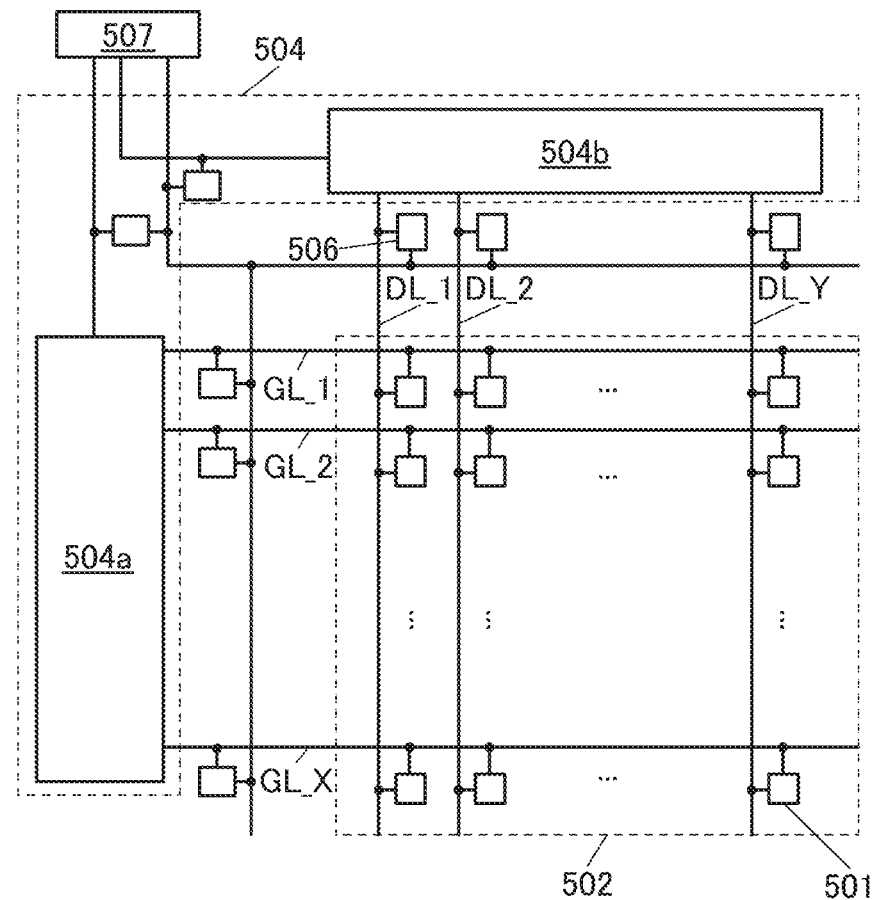
FIGS. 22A to 22C are a block diagram and circuit diagrams illustrating a display device.

The protection circuit 506 in FIG. 22A is connected to, for example, the scan line GL between the gate driver 504a and the pixel circuit 501. Alternatively, the protection circuit 506 is connected to the data line DL between the source driver 504b and the pixel circuit 501. Alternatively, the protection circuit 506 can be connected to a wiring between the gate driver 504a and the terminal portion 507. Alternatively, the protection circuit 506 can be connected to a wiring between the source driver 504b and the terminal portion 507. Note that the terminal portion 507 refers to a portion having terminals for inputting power, control signals, and image signals from external circuits to the display device.

The protection circuit 506 electrically connects a wiring connected to the protection circuit to another wiring when a potential out of a certain range is supplied to the wiring connected to the protection circuit.

As illustrated in FIG. 22A, the protection circuits 506 provided for the pixel portion 502 and the driver circuit portion 504 can improve the resistance of the display device to overcurrent generated by electrostatic discharge (ESD) or the like. Note that the configuration of the protection circuits 506 is not limited thereto; for example, the protection circuit 506 can be connected to the gate driver 504a or the source driver 504b. Alternatively, the protection circuit 506 can be connected to the terminal portion 507.

One embodiment of the present invention is not limited to the example in FIG. 22A, in which the driver circuit portion 504 includes the gate driver 504a and the source driver 504b. For example, only the gate driver 504a may be formed, and a separately prepared substrate over which a source driver circuit is formed (e.g., a driver circuit board formed using a single crystal semiconductor film or a polycrystalline semiconductor film) may be mounted.

Figure 22B:
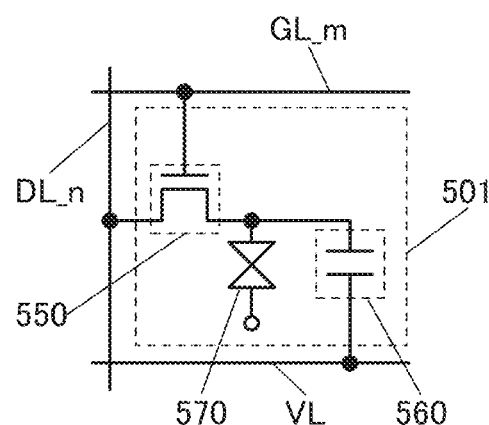

Each of the plurality of pixel circuits 501 in FIG. 22A can have the configuration illustrated in FIG. 22B, for example.

The pixel circuit 501 in FIG. 22B includes a liquid crystal element 570, a transistor 550, and a capacitor 560. As the transistor 550, the transistor described in the above embodiment can be used.

The potential of one of a pair of electrodes of the liquid crystal element 570 is set as appropriate in accordance with the specifications of the pixel circuit 501. The alignment state of the liquid crystal element 570 depends on data written thereto. A common potential may be supplied to the one of the pair of electrodes of the liquid crystal element 570 included in each of the plurality of pixel circuits 501. The potential supplied to the one of the pair of electrodes of the liquid crystal element 570 in the pixel circuit 501 may differ between rows.

Examples of a method for driving the display device including the liquid crystal element 570 include a TN mode, an STN mode, a VA mode, an axially symmetric aligned micro-cell (ASM) mode, an optically compensated birefringence (OCB) mode, a ferroelectric liquid crystal (FLC) mode, an anti-ferroelectric liquid crystal (AFLC) mode, an MVA mode, a patterned vertical alignment (PVA) mode, an IPS mode, an FFS mode, and a transverse bend alignment (TBA) mode. Other examples of the method for driving the display device include an electrically controlled birefringence (ECB) mode, a polymer-dispersed liquid crystal (PDLC) mode, a polymer network liquid crystal (PNLC) mode, and a guest-host mode. Without being limited thereto, various liquid crystal elements and driving methods can be used.

In the pixel circuit 501 in the m-th row and the n-th column, one of a source electrode and a drain electrode of the transistor 550 is electrically connected to the data line DL_n, and the other of the source electrode and the drain electrode of the transistor 550 is electrically connected to the other of the pair of electrodes of the liquid crystal element 570. A gate electrode of the transistor 550 is electrically connected to the scan line GL_m. The transistor 550 is configured to be turned on or off to control whether a data signal is written.

One of a pair of electrodes of the capacitor 560 is electrically connected to a wiring through which a potential is supplied (hereinafter referred to as a potential supply line VL), and the other of the pair of electrodes of the capacitor 560 is electrically connected to the other of the pair of electrodes of the liquid crystal element 570. The potential of the potential supply line VL is set as appropriate in accordance with the specifications of the pixel circuit 501. The capacitor 560 functions as a storage capacitor for storing written data.

For example, in the display device including the pixel circuits 501 in FIG. 22B, the gate driver 504*a* in FIG. 22A sequentially selects the pixel circuits 501 row by row to turn on the transistors 550, and data signals are written.

When the transistor 550 is turned off, the pixel circuit 501 to which the data has been written is brought into a holding state. This operation is sequentially performed row by row; thus, an image can be displayed.

Figure 22C:
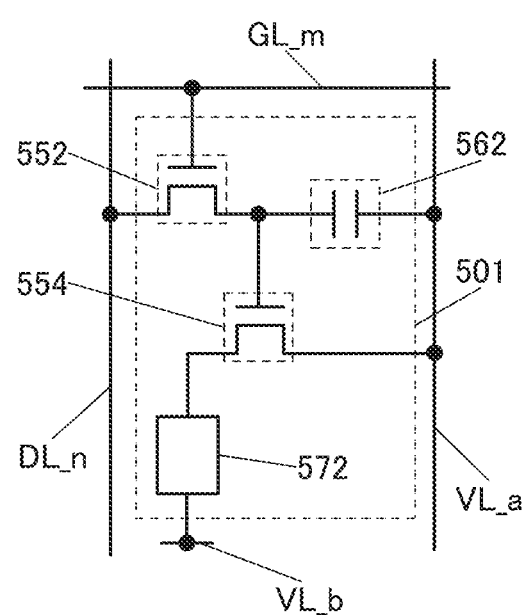

Alternatively, each of the plurality of pixel circuits 501 in FIG. 22A can have the configuration illustrated in FIG. 22C, for example.

The pixel circuit 501 in FIG. 22C includes transistors 552 and 554, a capacitor 562, and a light-emitting element 572. The transistor described in the above embodiment can be used as the transistor 552 and/or the transistor 554.

One of a source electrode and a drain electrode of the transistor 552 is electrically connected to a data line DL_n, and a gate electrode of the transistor 552 is electrically connected to a scan line GL_m.

The transistor 552 is configured to be turned on or off to control whether a data signal is written.

One of a pair of electrodes of the capacitor 562 is electrically connected to a potential supply line VL_a, and the other of the pair of electrodes of the capacitor 562 is electrically connected to the other of the source electrode and the drain electrode of the transistor 552.

The capacitor 562 functions as a storage capacitor for storing written data.

One of a source electrode and a drain electrode of the transistor 554 is electrically connected to the potential supply line VL_a. A gate electrode of the transistor 554 is electrically connected to the other of the source electrode and the drain electrode of the transistor 552.

One of an anode and a cathode of the light-emitting element 572 is electrically connected to a potential supply line VL_b, and the other of the anode and the cathode of the light-emitting element 572 is electrically connected to the other of the source electrode and the drain electrode of the transistor 554.

As the light-emitting element 572, an organic electroluminescent element (also referred to as an organic EL element) can be used, for example. Note that the light-emitting element 572 is not limited thereto and may be an inorganic EL element including an inorganic material.

A high power supply potential $V_{DD}$ is supplied to one of the potential supply line VL_a and the potential supply line VL_b, and a low power supply potential $V_{SS}$ is supplied to the other of the potential supply line VL_a and the potential supply line VL_b.

In the display device including the pixel circuits 501 in FIG. 22C, the gate driver 504*a* in FIG. 22A sequentially selects the pixel circuits 501 row by row to turn on the transistors 552, and data signals are written.

When the transistor 552 is turned off, the pixel circuit 501 to which the data has been written is brought into a holding state. Furthermore, the amount of current flowing between the source electrode and the drain electrode of the transistor 554 is controlled in accordance with the potential of the written data signal. The light-emitting element 572 emits light with a luminance corresponding to the amount of flowing current. This operation is sequentially performed row by row; thus, an image can be displayed.

At least part of this embodiment can be implemented in combination with any of the other embodiments described in this specification as appropriate.

Embodiment 6

In this embodiment, a display module and electronic devices, each of which includes a semiconductor device of one embodiment of the present invention, are described with reference to FIG. 23, FIGS. 24A to 24E, and FIGS. 25A to 25G.

<6-1. Display Module>

Figure 23:
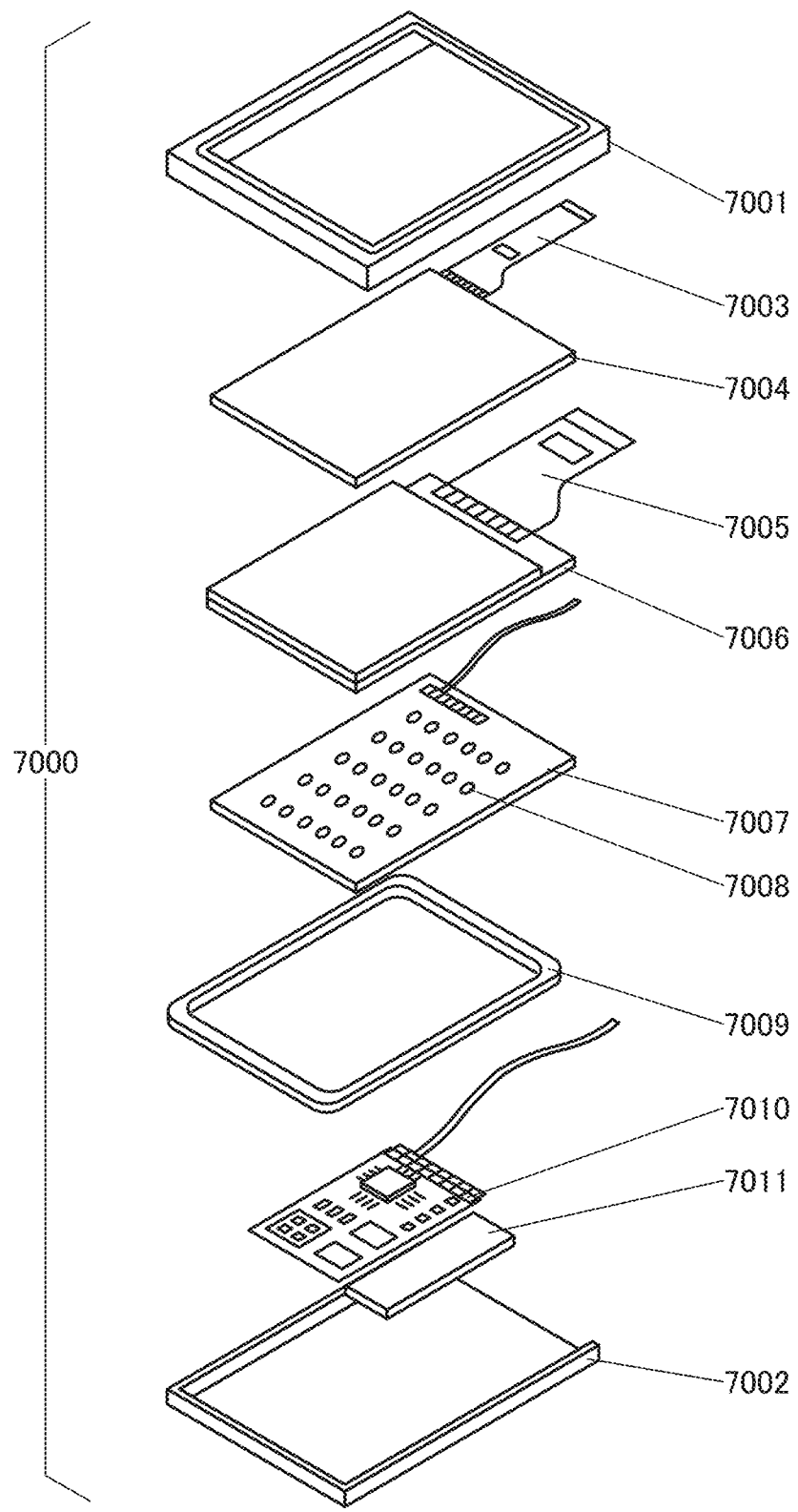
FIG. 23 illustrates a display module.

In a display module 7000 illustrated in FIG. 23, a touch panel 7004 connected to an FPC 7003, a display panel 7006 connected to an FPC 7005, a backlight 7007, a frame 7009, a printed-circuit board 7010, and a battery 7011 are provided between an upper cover 7001 and a lower cover 7002.

The semiconductor device of one embodiment of the present invention can be used for the display panel 7006, for example.

The shapes and sizes of the upper cover 7001 and the lower cover 7002 can be changed as appropriate in accordance with the sizes of the touch panel 7004 and the display panel 7006.

The touch panel 7004 can be a resistive touch panel or a capacitive touch panel and overlap with the display panel 7006. Alternatively, a counter substrate (sealing substrate) of the display panel 7006 can have a touch panel function. Alternatively, a photosensor may be provided in each pixel of the display panel 7006 to form an optical touch panel.

The backlight 7007 includes a light source 7008. One embodiment of the present invention is not limited to the structure in FIG. 23, in which the light source 7008 is provided over the backlight 7007. For example, a structure in which the light source 7008 is provided at an end portion of the backlight 7007 and a light diffusion plate is further provided may be employed. Note that the backlight 7007 need not be provided in the case where a self-luminous light-emitting element such as an organic EL element is used or in the case where a reflective panel or the like is employed.

The frame 7009 protects the display panel 7006 and functions as an electromagnetic shield for blocking electromagnetic waves generated by the operation of the printed-circuit board 7010. The frame 7009 may also function as a radiator plate.

The printed-circuit board 7010 includes a power supply circuit and a signal processing circuit for outputting a video signal and a clock signal. As a power source for supplying power to the power supply circuit, an external commercial power source or the separate battery 7011 may be used. The battery 7011 can be omitted in the case where a commercial power source is used.

The display module 7000 may be additionally provided with a member such as a polarizing plate, a retardation plate, or a prism sheet.

<6-2. Electronic Device 1>

Next, FIGS. 24A to 24E illustrate examples of electronic devices.

Figure 24A:
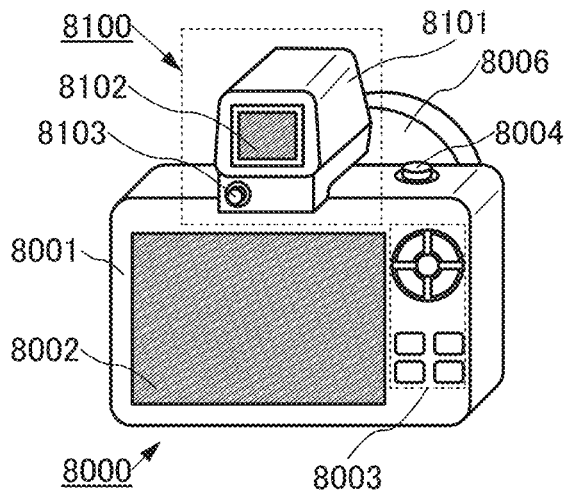
FIGS. 24A to 24E illustrate electronic devices.

FIG. 24A is an external view of a camera 8000 to which a finder 8100 is attached.

The camera 8000 includes a housing 8001, a display portion 8002, an operation button 8003, a shutter button 8004, and the like. Furthermore, an attachable lens 8006 is attached to the camera 8000.

Although the lens 8006 of the camera 8000 here is detachable from the housing 8001 for replacement, the lens 8006 may be included in the housing 8001.

Images can be taken with the camera 8000 at the press of the shutter button 8004. In addition, images can be taken at the touch of the display portion 8002 that serves as a touch panel.

The housing 8001 of the camera 8000 includes a mount including an electrode, so that the finder 8100, a stroboscope, or the like can be connected to the housing 8001.

The finder 8100 includes a housing 8101, a display portion 8102, a button 8103, and the like.

The housing 8101 includes a mount for engagement with the mount of the camera 8000 so that the finder 8100 can be connected to the camera 8000. The mount includes an electrode, and an image or the like received from the camera 8000 through the electrode can be displayed on the display portion 8102.

The button 8103 serves as a power button. The display portion 8102 can be turned on and off with the button 8103.

A display device of one embodiment of the present invention can be used in the display portion 8002 of the camera 8000 and the display portion 8102 of the finder 8100.

Although the camera 8000 and the finder 8100 are separate and detachable electronic devices in FIG. 24A, the housing 8001 of the camera 8000 may include a finder having a display device.

Figure 24B:
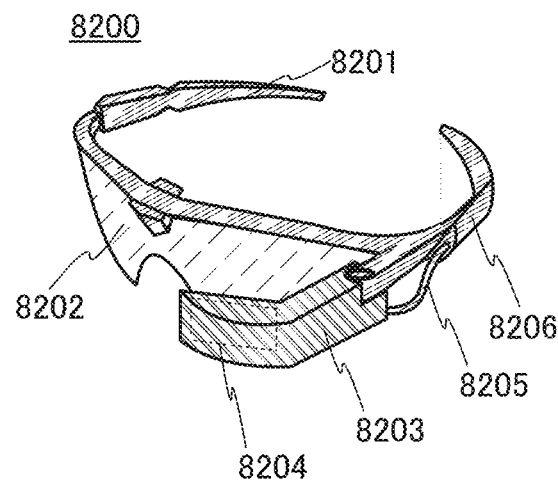

FIG. 24B is an external view of a head-mounted display 8200.

The head-mounted display 8200 includes a mounting portion 8201, a lens 8202, a main body 8203, a display portion 8204, a cable 8205, and the like. The mounting portion 8201 includes a battery 8206.

Power is supplied from the battery 8206 to the main body 8203 through the cable 8205. The main body 8203 includes a wireless receiver or the like to receive video data, such as image data, and display it on the display portion 8204. The movement of the eyeball and the eyelid of a user is captured by a camera in the main body 8203 and then coordinates of the points the user looks at are calculated using the captured data to utilize the eye of the user as an input unit.

The mounting portion 8201 may include a plurality of electrodes so as to be in contact with the user. The main body 8203 may be configured to sense current flowing through the electrodes with the movement of the user's eyeball to recognize the points the user looks at. The main body 8203 may be configured to sense current flowing through the electrodes to monitor the user's pulse. The mounting portion 8201 may include sensors, such as a temperature sensor, a pressure sensor, or an acceleration sensor so that the user's biological information can be displayed on the display portion 8204. The main body 8203 may be configured to sense the movement of the user's head or the like to move an image displayed on the display portion 8204 in synchronization with the movement of the user's head or the like.

The display device of one embodiment of the present invention can be used in the display portion 8204.

Figure 24C:
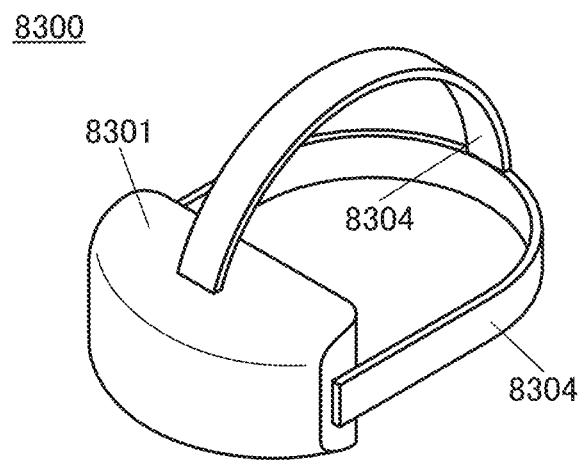
Figure 24D:
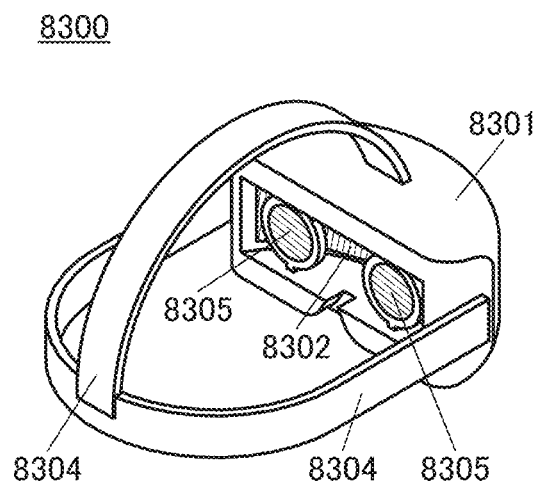
Figure 24E:
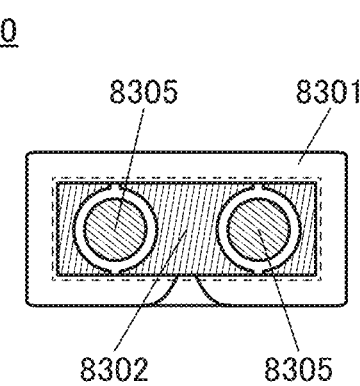

FIGS. 24C to 24E are external views of a head-mounted display 8300. The head-mounted display 8300 includes a housing 8301, a display portion 8302, an object for fixing, such as a band, 8304, and a pair of lenses 8305.

A user can see display on the display portion 8302 through the lenses 8305. It is favorable that the display portion 8302 be curved. When the display portion 8302 is curved, a user can feel high realistic sensation of images. Although the structure described in this embodiment as an example has one display portion 8302, the number of the display portions 8302 provided is not limited to one. For example, two display portions 8302 may be provided, in which case one display portion is provided for one corresponding user's eye, so that three-dimensional display using parallax or the like is possible.

The display device of one embodiment of the present invention can be used in the display portion 8302. The display device including the semiconductor device of one embodiment of the present invention has an extremely high resolution; thus, even when an image is magnified using the lenses 8305 as illustrated in FIG. 24E, the user does not perceive pixels, and thus a more realistic image can be displayed.

<6-3. Electronic Device 2>

Next, FIGS. 25A to 25G illustrate examples of electronic devices that are different from those illustrated in FIGS. 24A to 24E.

Electronic devices illustrated in FIGS. 25A to 25G include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 9008, and the like.

The electronic devices in FIGS. 25A to 25G have a variety of functions such as a function of displaying a variety of information (e.g., a still image, a moving image, and a text image) on the display portion, a touch panel function, a function of displaying a calendar, date, time, and the like, a function of controlling processing with a variety of software (programs), a wireless communication function, a function of being connected to a variety of computer networks with a wireless communication function, a function of transmitting and receiving a variety of data with a wireless communication function, and a function of reading out a program or data stored in a memory medium and displaying it on the display portion. Note that functions of the electronic devices in FIGS. 25A to 25G are not limited thereto, and the electronic devices can have a variety of functions. Although not illustrated in FIGS. 25A to 25G, the electronic devices may each have a plurality of display portions. Furthermore, the electronic devices may each be provided with a camera and the like to have a function of taking a still image, a function of taking a moving image, a function of storing the taken image in a memory medium (an external memory medium or a memory medium incorporated in the camera), a function of displaying the taken image on the display portion, or the like.

The electronic devices in FIGS. 25A to 25G are described in detail below.

Figure 25A:
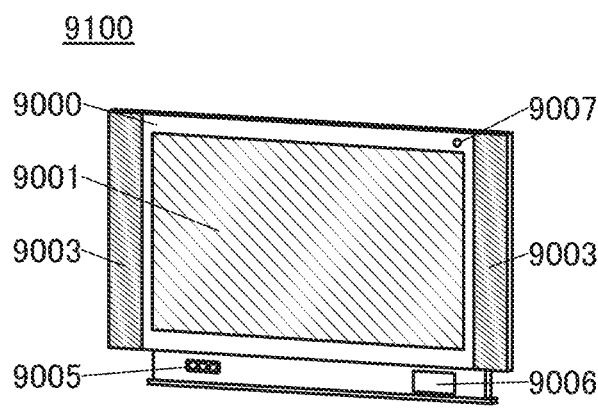
FIGS. 25A to 25G illustrate electronic devices.

FIG. 25A is a perspective view illustrating a television device 9100. The television device 9100 can include the display portion 9001 having a large screen size of, for example, 50 inches or more, or 100 inches or more.

Figure 25D:
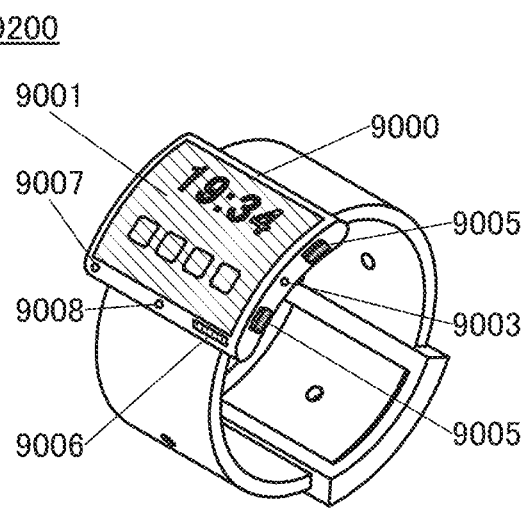
Figure 25B:
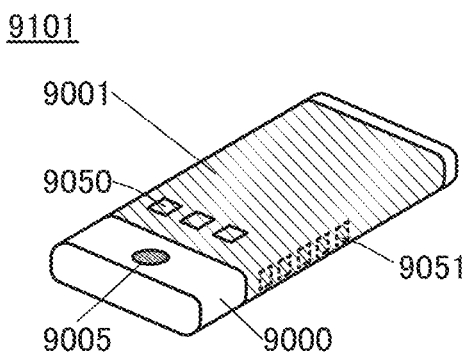

FIG. 25B is a perspective view of a portable information terminal 9101. The portable information terminal 9101 functions as, for example, one or more of a telephone set, a notebook, and an information browsing system. Specifically, the portable information terminal 9101 can be used as a smartphone. Note that the portable information terminal 9101 may include the speaker 9003, the connection terminal 9006, the sensor 9007, or the like. The portable information terminal 9101 can display text and image information on its plurality of surfaces. For example, three operation buttons 9050 (also referred to as operation icons or simply as icons) can be displayed on one surface of the display portion 9001. Furthermore, information 9051 indicated by dashed rectangles can be displayed on another surface of the display portion 9001. Examples of the information 9051 include display indicating reception of an e-mail, a social networking service (SNS) message, or a telephone call, the title and sender of an e-mail or an SNS message, date, time, remaining battery, and reception strength of an antenna. Alternatively, the operation buttons 9050 or the like may be displayed in place of the information 9051.

Figure 25E:
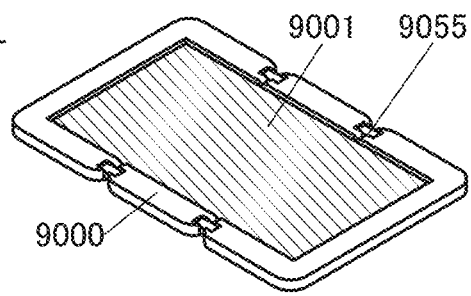
Figure 25C:
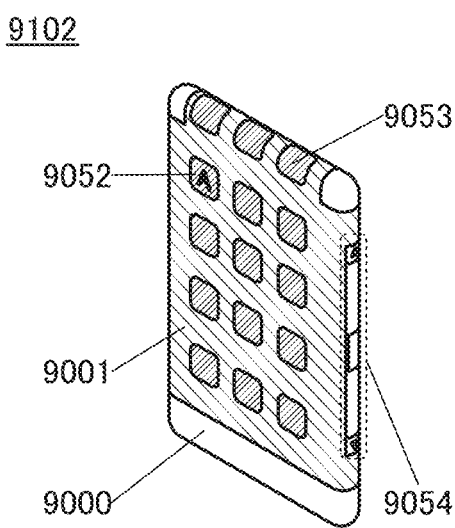

FIG. 25C is a perspective view of a portable information terminal 9102. The portable information terminal 9102 has a function of displaying information on three or more surfaces of the display portion 9001. Here, information 9052, information 9053, and information 9054 are displayed on different surfaces. For example, a user of the portable information terminal 9102 can see the display (here, the information 9053) on the portable information terminal 9102 put in a breast pocket of his/her clothes. Specifically, a caller's phone number, name, or the like of an incoming call is displayed in a position that can be seen from above the portable information terminal 9102. The user can see the display without taking out the portable information terminal 9102 from the pocket and decide whether to answer the call.

FIG. 25D is a perspective view of a watch-type portable information terminal 9200. The portable information terminal 9200 is capable of executing a variety of applications such as mobile phone calls, e-mailing, reading and editing texts, music reproduction, Internet communication, and a computer game. The display surface of the display portion 9001 is curved, and display can be performed on the curved display surface. The portable information terminal 9200 can employ near field communication conformable to a communication standard. For example, hands-free calling can be achieved by mutual communication between the portable information terminal 9200 and a headset capable of wireless communication. Moreover, the portable information terminal 9200 includes the connection terminal 9006 and can perform direct data communication with another information terminal via a connector. Charging through the connection terminal 9006 is also possible. Note that the charging operation may be performed by wireless power feeding without using the connection terminal 9006.

Figure 25F:
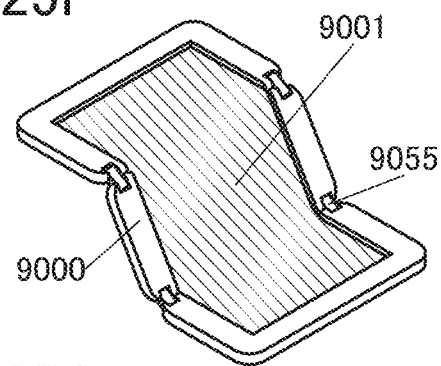
Figure 25G:
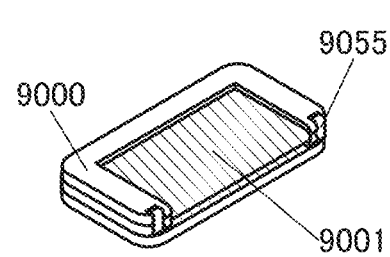

FIGS. 25E, 25F, and 25G are perspective views of a foldable portable information terminal 9201 that is opened, that is shifted from the opened state to the folded state or from the folded state to the opened state, and that is folded, respectively. The portable information terminal 9201 is highly portable when folded. When the portable information terminal 9201 is opened, a seamless large display region is highly browsable. The display portion 9001 of the portable information terminal 9201 is supported by three housings 9000 joined by hinges 9055. By being folded at the hinges 9055 between the two adjacent housings 9000, the portable information terminal 9201 can be reversibly changed in shape from the opened state to the folded state. For example, the portable information terminal 9201 can be bent with a radius of curvature greater than or equal to 1 mm and less than or equal to 150 mm.

The electronic devices described in this embodiment each include the display portion for displaying some sort of data. Note that the semiconductor device of one embodiment of the present invention can also be used for an electronic device that does not have a display portion.

At least part of this embodiment can be implemented in combination with any of the other embodiments described in this specification as appropriate.

This application is based on Japanese Patent Application Serial No. 2016-145082 filed with Japan Patent Office on Jul. 25, 2016, the entire contents of which are hereby incorporated by reference.

What is claimed is:

1. A semiconductor device comprising:
   a semiconductor layer;
   a first electrode and a second electrode each in contact with the semiconductor layer;
   an insulating layer over the first electrode and the second electrode; and
   a third conductive layer over the insulating layer,
   wherein the first electrode and the second electrode each comprise:
      a first conductive layer in contact with a top surface of the semiconductor layer;
      a second conductive layer over the first conductive layer;
      a second layer covering a side surface of the second conductive layer; and
      a first layer covering a top surface of the second conductive layer and a top surface of the second layer,
   wherein the first layer and the second layer each contain silicide containing nitrogen and a metal element contained in the second conductive layer,
   wherein the third conductive layer is in contact with the second conductive layer of one of the first electrode and the second electrode through openings of the insulating layer and the first layer, and
   wherein a side surface of the first layer, a side surface of the second layer, and a side surface of the first conductive layer are aligned with each other and in contact with the insulating layer.

2. The semiconductor device according to claim 1, wherein the second conductive layer has higher conductivity than the first conductive layer.

3. The semiconductor device according to claim 1, wherein the second conductive layer has a lower melting point than the first conductive layer.

4. The semiconductor device according to claim 1, wherein:
   the metal element contained in the second conductive layer is capable of forming the silicide by reacting with silicon.

5. The semiconductor device according to claim 1, wherein:
   the first conductive layer contains titanium or tungsten, and
   the metal element contained in the second conductive layer is copper.

6. The semiconductor device according to claim 1, wherein the semiconductor layer contains a metal oxide.

7. The semiconductor device according to claim 6, wherein the metal oxide contains at least one of indium, zinc, and gallium.

8. A semiconductor device comprising:
   a semiconductor layer;
   a first electrode and a second electrode each in contact with the semiconductor layer;

an insulating layer over the first electrode and the second electrode; and
a third conductive layer over the insulating layer,
wherein the first electrode and the second electrode each comprise:
   a first conductive layer in contact with a top surface of the semiconductor layer;
   a second conductive layer over the first conductive layer;
   a second layer covering a side surface of the second conductive layer; and
   a first layer covering a top surface of the second conductive layer and a top surface of the second layer,
wherein the first conductive layer contains titanium or tungsten,
wherein the second conductive layer contains copper,
wherein the first layer and the second layer each contains copper silicide nitride,
wherein the third conductive layer is in contact with the second conductive layer of one of the first electrode and the second electrode through openings of the insulating layer and the first layer, and
wherein a side surface of the first layer, a side surface of the second layer, and a side surface of the first conductive layer are aligned with each other and in contact with the insulating layer.

9. The semiconductor device according to claim 8, wherein the second conductive layer has higher conductivity than the first conductive layer.

10. The semiconductor device according to claim 8, wherein the semiconductor layer contains a metal oxide.

11. The semiconductor device according to claim 10, wherein the metal oxide contains at least one of indium, zinc, and gallium.

* * * * *